US012690371B2

(12) United States Patent
Sung et al.

(10) Patent No.: US 12,690,371 B2
(45) Date of Patent: Jul. 21, 2026

(54) DISPLAY DEVICE AND METHOD FOR MANUFACTURING THE SAME

(71) Applicant: Samsung Display Co., LTD., Yongin-si (KR)

(72) Inventors: Woo Yong Sung, Yongin-si (KR); Tae Wook Kang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 369 days.

(21) Appl. No.: 18/225,241

(22) Filed: Jul. 24, 2023

(65) Prior Publication Data

US 2024/0122039 A1     Apr. 11, 2024

(30) Foreign Application Priority Data

| Oct. 11, 2022 | (KR) | ......................... | 10-2022-0130049 |
| Mar. 28, 2023 | (KR) | ......................... | 10-2023-0040634 |

(51) Int. Cl.
| *H10K 59/80* | (2023.01) |
| *H10K 59/12* | (2023.01) |
| *H10K 59/122* | (2023.01) |

(52) U.S. Cl.
CPC ....... *H10K 59/873* (2023.02); *H10K 59/1201* (2023.02); *H10K 59/122* (2023.02)

(58) Field of Classification Search
CPC .... G06F 1/1684; G06F 1/1637; G06F 1/1626; H10K 71/80; H10K 71/10; H10K 59/122;
(Continued)

(56) References Cited

U.S. PATENT DOCUMENTS

| 9,905,629 B2 * | 2/2018 | Kim | ........................ | H10K 77/10 |
| 2016/0190389 A1 * | 6/2016 | Lee | ......................... | H10D 86/60 |
| | | | | 438/28 |

(Continued)

FOREIGN PATENT DOCUMENTS

| CN | 110010666 | 7/2019 |
| CN | 110021644 | 7/2019 |

(Continued)

OTHER PUBLICATIONS

Partial European Search Report—European Application No. 23197364.5 dated Feb. 28, 2024.

*Primary Examiner* — Vongsavanh Sengdara

(74) *Attorney, Agent, or Firm* — CANTOR COLBURN LLP

(57) ABSTRACT

A display device includes a substrate including a sub-display area including a transmission area and a main display area adjacent to the sub-display area, a thin film transistor layer disposed on the main display area and the sub-display area, a light emitting element layer disposed on the thin film transistor layer, a thin film encapsulation layer disposed on the light emitting element layer, where first and second through holes are defined through the transmission area to overlap each other, a first planarization layer disposed under the substrate in the main display area and the transmission area to fill the second through hole, and a second planarization layer disposed on the thin film encapsulation layer in the main display area and the transmission area to fill the first through hole. In the transmission area, the first planarization layer and the second planarization layer are in contact with each other.

23 Claims, 27 Drawing Sheets

(58) Field of Classification Search
CPC ............. H10K 59/1201; H10K 59/121; H10K
59/873; H10K 59/124; H10K 59/65
See application file for complete search history.

(56) References Cited

U.S. PATENT DOCUMENTS

| | | | |
|---|---|---|---|
| 2017/0047544 A1* | 2/2017 | Kang ................. | H10K 59/8731 |
| 2017/0110532 A1* | 4/2017 | Kim ..................... | H10K 59/124 |
| 2017/0162111 A1* | 6/2017 | Kang ................... | H10K 59/121 |
| 2017/0162637 A1* | 6/2017 | Choi ........................ | G09G 3/20 |
| 2017/0237038 A1* | 8/2017 | Kim ..................... | H10K 77/10 |
| | | | 257/40 |
| 2018/0183015 A1* | 6/2018 | Yun ........................ | H10K 71/00 |
| 2020/0176520 A1* | 6/2020 | Kim ..................... | H10K 59/873 |
| 2020/0235194 A1* | 7/2020 | Ito ...................... | H10K 59/8731 |
| 2020/0403047 A1* | 12/2020 | Oh ........................ | H10K 59/122 |
| 2021/0111230 A1 | 4/2021 | Shin et al. | |
| 2021/0359047 A1* | 11/2021 | Yoon ................... | H10K 59/353 |
| 2022/0165982 A1* | 5/2022 | Sung ................... | H10K 59/122 |

FOREIGN PATENT DOCUMENTS

| | | |
|---|---|---|
| KR | 20160037366 A | 4/2016 |
| KR | 20190098703 A | 8/2019 |
| KR | 20210040230 A | 4/2021 |
| KR | 20210082316 A | 7/2021 |
| KR | 20220021945 A | 2/2022 |
| KR | 102388722 B1 | 4/2022 |
| WO | 2022155857 A1 | 7/2022 |

* cited by examiner

TFE2: TFE21, TFE22, TFE23
EML: ED1, ED2, ED3

TFE2: TFE21, TFE22, TFE23
EML: ED1, ED2, ED3

FIG. 18

TFE2: TFE21, TFE22, TFE23
EML: ED1, ED2, ED3

TFE2: TFE21, TFE22, TFE23
EML: ED1, ED2, ED3

FIG. 20

TFE2: TFE21, TFE22, TFE23
EML: ED1, ED2, ED3

FIG. 21

TFE2: TFE21, TFE22, TFE23
EML: ED1, ED2, ED3

FIG. 22

TFE2: TFE21, TFE22, TFE23
EML: ED1, ED2, ED3

TFE2: TFE21, TFE22, TFE23
EML: ED1, ED2, ED3

FIG. 25

TFE2: TFE21, TFE22, TFE23
EML: ED1, ED2, ED3

FIG. 26

TFE2: TFE21, TFE22, TFE23
EML: ED1, ED2, ED3

FIG. 27

TFE2: TFE21, TFE22, TFE23
EML: ED1, ED2, ED3

DISPLAY DEVICE AND METHOD FOR MANUFACTURING THE SAME

This application claims priority to Korean Patent Application No. 10-2022-0130049, filed on Oct. 11, 2022, and Korean Patent Application No. 10-2023-0040634, filed on Mar. 28, 2023, and all the benefits accruing therefrom under 35 U.S.C. § 119, the contents of which in their entireties are herein incorporated by reference.

BACKGROUND

1. Field

The present disclosure relates to a display device and a method for manufacturing the display device.

2. Description of the Related Art

With the advance of information-oriented society, demands on display devices for displaying images increase in various fields. For example, display devices are employed in various electronic devices such as smartphones, digital cameras, laptop computers, navigation devices, and smart televisions. The display device may include a display panel including a plurality of pixels connected to scan lines, data lines, and power lines to display an image. In addition, the display device may include various optical devices such as an image sensor for capturing an image of the front surface, a proximity sensor for detecting whether a user is positioned close to the front surface of the display device, an illumi-nance sensor for detecting illumination of the front surface of the display device, or an iris sensor for recognizing an iris of a user. The optical device may be disposed in a hole defined on the front surface of the display device that does not overlap the display panel.

With diversification of electronic devices employing dis-play devices, it is desired for the display devices to be provided in various designs. For example, in the case of a smartphone, a display device capable of widening a display area by removing a hole disposed on the front surface of the display device is desired. In this case, optical devices of the display device may be disposed to overlap the display panel.

SUMMARY

In a display device where an optical device disposed is disposed to overlap a display panel, light incident on the optical device may be reduced because the optical device is covered by pixels, scan lines, data lines, and power lines of the display panel. Accordingly, the function of the optical device may deteriorate.

Embodiments of the present disclosure provide a display device capable of preventing light incident on an optical device from being decreased and improving encapsulation characteristics of the display device although the optical device is disposed to overlap the display panel, and a method for manufacturing the display device.

However, embodiments of the present disclosure are not restricted to one set forth herein. The above and other features of the present disclosure will become more apparent to one of ordinary skill in the art to which the present disclosure pertains by referencing the detailed description of the present disclosure given below.

According to an embodiment of the present disclosure, a display device includes a substrate including a sub-display area including a transmission area and a main display area other than the sub-display area, a thin film transistor layer disposed on the main display area and the sub-display area of the substrate, a light emitting element layer disposed on the thin film transistor layer, a thin film encapsulation layer disposed on the light emitting element layer, where a first through hole and a second through hole are defined through the transmission area to overlap each other, a first planar-ization layer disposed under the substrate, and disposed in the main display area and the transmission area to fill the second through hole, and a second planarization layer dis-posed on the thin film encapsulation layer, and disposed in the main display area and the transmission area to fill the first through hole, where in the transmission area, the first planarization layer and the second planarization layer are in contact with each other.

In an embodiment, the first through hole may be defined through a portion of the substrate and the thin film transistor layer disposed in the sub-display area, and the second through hole may be defined through a remaining portion of the substrate corresponding to the first through hole.

In an embodiment, the substrate may include a first substrate disposed on the first planarization layer, a first barrier layer disposed on the first substrate, a second sub-strate disposed on the first barrier layer, and a second barrier layer disposed on the second substrate, the first through hole may be defined through the first barrier layer, the second substrate, and the second barrier layer, and the second through hole may be defined through the first substrate.

In an embodiment, the first planarization layer may include a protrusion protruding toward the second planar-ization layer through the second through hole, and a width of the protrusion gradually decreases toward the second planarization layer.

In an embodiment, a width of the second through hole may gradually increase from an upper surface of the first substrate to a lower surface of the first substrate.

In an embodiment, the display device may further include an optical device overlapping the transmission area, where the optical device overlaps the first through hole and the second through hole.

In an embodiment, the thin film transistor layer, the light emitting element layer, and the thin film encapsulation layer may not overlap the transmission area.

In an embodiment, the light emitting element layer may include a pixel electrode disposed on the thin film transistor layer, a light emitting layer disposed on the pixel electrode, and a common electrode disposed on the light emitting layer, and the thin film encapsulation layer may be disposed on the common electrode to encapsulate the light emitting element layer.

In an embodiment, the display device may further include an inorganic insulating layer disposed on the thin film transistor layer and covering an edge of the pixel electrode, and a bank structure disposed on the inorganic insulating layer, where an opening exposing the pixel electrode may be defined through the bank structure.

In an embodiment, the bank structure may include a first bank layer disposed on the inorganic insulating layer, and a second bank layer disposed on the first bank layer and including a tip protruding further than the first bank layer to a center of the opening.

In an embodiment, the light emitting layer and the com-mon electrode may be in contact with a sidewall of the first bank layer under the tip of the second bank layer.

In an embodiment, the bank structure may further include a third bank layer disposed on the second bank layer.

In an embodiment, the display device may further includes an organic pattern disposed on the third bank layer to surround the opening, and including the same material as the light emitting layer, and an electrode pattern disposed on the organic pattern, and containing the same material as the common electrode.

In an embodiment, the thin film encapsulation layer may include a first encapsulation layer, a second encapsulation layer disposed on the first encapsulation layer, and a third encapsulation layer disposed on the second encapsulation layer, where the first encapsulation layer and the third encapsulation layer may be in contact with each other in a region surrounding the opening.

In an embodiment, the first encapsulation layer and the third encapsulation layer may be in contact with each other in a region surrounding the transmission area.

According to an embodiment of the present disclosure, a display device includes a substrate, a thin film transistor layer disposed on the substrate, a light emitting element layer disposed on the thin film transistor layer, a thin film encapsulation layer disposed on the light emitting element layer, where a first through hole and a second through hole are defined through the substrate and the thin film transistor layer to overlapping each other, a first planarization layer disposed under the substrate to fill the second through hole, and a second planarization layer disposed on the thin film encapsulation layer, filling the first through hole, and in contact with the first planarization layer, where the thin film transistor layer, the light emitting element layer, and the thin film encapsulation layer do not overlap the first through hole and the second through hole.

In an embodiment, the light emitting element layer may include a pixel electrode disposed on the thin film transistor layer, a light emitting layer disposed on the pixel electrode, and a common electrode disposed on the light emitting layer, and the thin film encapsulation layer may be disposed on the common electrode to encapsulate the light emitting element layer.

In an embodiment, the display device may further include an inorganic insulating layer disposed on the thin film transistor layer, and covering an edge of the pixel electrode, and a bank structure disposed on the inorganic insulating layer, where an opening exposing the pixel electrode may be defined through the bank structure.

In an embodiment, the thin film encapsulation layer may include a first encapsulation layer, a second encapsulation layer disposed on the first encapsulation layer, and filling the opening, and a third encapsulation layer disposed on the second encapsulation layer.

In an embodiment, an uppermost surface of the second encapsulation layer may protrude in a direction toward the first planarization layer than an uppermost surface of the first encapsulation layer.

In an embodiment, an uppermost surface of the second encapsulation layer may be aligned with an uppermost surface of the first encapsulation layer.

In an embodiment, an uppermost surface of the first encapsulation layer may protrude in a direction toward the first planarization layer than an uppermost surface of the second encapsulation layer.

In an embodiment, an upper surface of the second planarization layer may be aligned with an uppermost surface of the third encapsulation layer.

According to an embodiment of the present disclosure, a method for manufacturing a display device, includes forming a substrate on a mother substrate, and forming a thin film transistor layer on the substrate, forming a pixel electrode on the thin film transistor layer and a sacrificial layer on the pixel electrode, sequentially forming an inorganic insulating material layer, a first bank material layer, and a second bank material layer on the pixel electrode, forming an opening through the inorganic insulating material layer, the first bank material layer, and the second bank material layer to the pixel electrode and a first through hole through a portion of the substrate by forming a third bank layer on the second bank material layer, and performing a first etching process using the third bank layer as an etching mask, forming a first bank layer and a second bank layer including a tip protruding further than the first bank layer toward a center of the opening by performing a second etching process using the third bank layer as an etching mask, forming a light emitting layer and a common electrode on the pixel electrode, sequentially forming a first encapsulation layer, a second encapsulation layer, and a third encapsulation layer on the common electrode, etching a portion of the substrate exposed through the first through hole by forming a hard mask layer on the third encapsulation layer and performing a third etching process, forming a first planarization layer on the substrate and the third encapsulation layer, forming a second through hole overlapping the first through hole by removing the mother substrate and performing a fourth etching process to etch a remaining portion of the substrate corresponding to the first through hole, and forming a second planarization layer on a lower surface of the substrate to fill the second through hole.

In an embodiment, the method may further include removing the sacrificial layer after the first etching process, where the first etching process is a dry etching process.

In an embodiment, the second etching process may be a wet etching process, and an etching rate of the first bank material layer is higher than that of the second bank material layer.

In an embodiment, the light emitting layer and the common electrode in the opening may be disconnected by the tip of the second bank layer.

In an embodiment, the hard mask layer may be formed in a region other than a region where the first through hole is formed and is removed after the third etching process is performed.

In an embodiment, the substrate may be formed by sequentially forming a first substrate, a first barrier layer, a second substrate, and a second barrier layer on the mother substrate, the first through hole may be formed by etching the second barrier layer in the first etching process and etching the second substrate and the first barrier layer in the third etching process, and the second through hole may be formed by etching the first substrate in the fourth etching process.

In an embodiment, the first planarization layer may be formed on the third encapsulation layer to fill the first through hole, and the second planarization layer may be formed on a lower surface of the first substrate to fill the second through hole.

The display device according to embodiments may improve the transmittance of light incident to the optical devices by forming a transmission area including through holes in a sub-display area overlapping the optical devices.

In such embodiments, since a thin film encapsulation layer independently encapsulates each emission area, the encapsulation characteristics of the light emitting elements may be improved.

However, effects according to the embodiments of the present disclosure are not limited to those exemplified above and various other effects are incorporated herein.

BRIEF DESCRIPTION OF THE DRAWINGS

The above and other features of the present disclosure will become more apparent by describing in detail embodiments thereof with reference to the attached drawings, in which:

FIG. 6 is a cross-sectional view taken along line I-I' of FIG. 5;

FIGS. 8 to 22 are cross-sectional views sequentially illustrating a manufacturing process of a display device according to an embodiment;

FIG. 23 is a cross-sectional view of a display device according to an alternative embodiment;

FIG. 24 is a cross-sectional view showing a display device according to another alternative embodiment;

FIG. 25 is a cross-sectional view showing a display device according to still another alternative embodiment;

FIG. 26 is a cross-sectional view showing a display device according to still another alternative embodiment; and FIG. 27 is a cross-sectional view showing a display device according to still another alternative embodiment.

DETAILED DESCRIPTION

Figure 1:
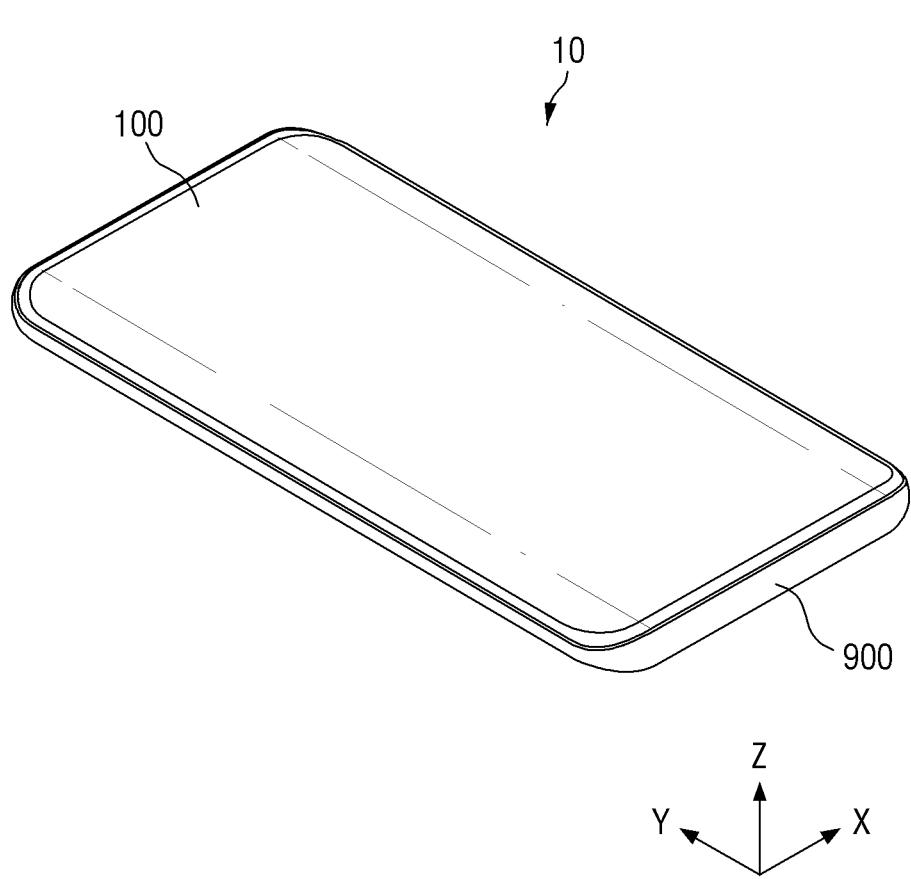
FIG. 1 is a perspective view illustrating a display device according to an embodiment.

The invention will now be described more fully hereinafter with reference to the accompanying drawings, in which various embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/ or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Each of the features of the various embodiments of the present disclosure may be combined or combined with each other, in part or in whole, and technically various interlocking and driving are possible. Each embodiment may be implemented independently of each other or may be implemented together in an association.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described with reference to the accompanying drawings.

Figure 2:
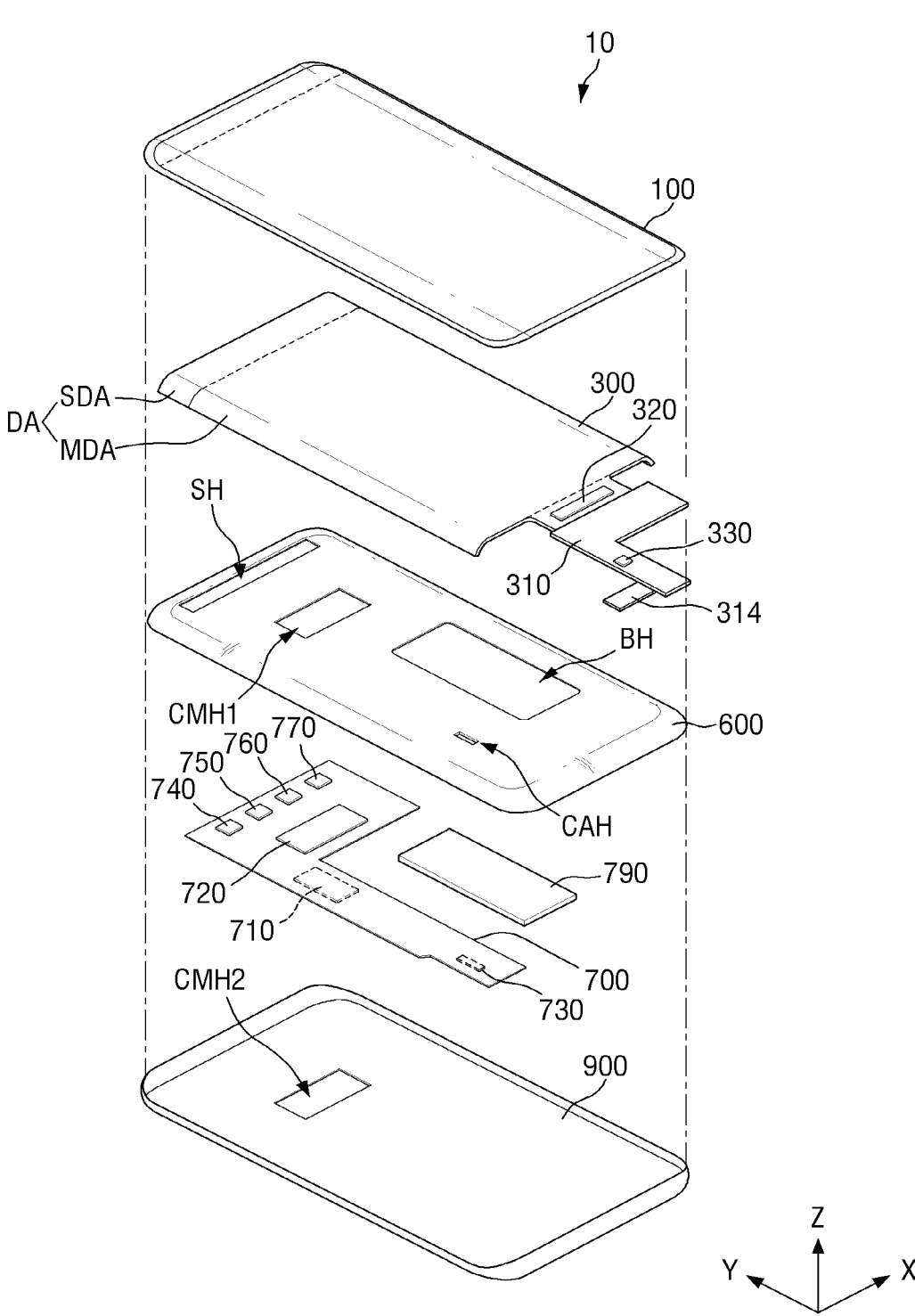
FIG. 2 is an exploded perspective view showing a display device according to an embodiment.

FIG. 1 is a perspective view illustrating a display device according to an embodiment. FIG. 2 is an exploded perspective view showing a display device according to an embodiment.

Referring to FIGS. 1 and 2, a display device 10 according to an embodiment may be applied to portable electronic devices such as a mobile phone, a smartphone, a tablet personal computer (PC), a mobile communication terminal, an electronic organizer, an electronic book, a portable multimedia player (PMP), a navigation system, an ultra mobile PC (UMPC) or the like. Alternatively, the display device 10 according to an embodiment may be applied as a display unit of a television, a laptop, a monitor, a billboard, or an Internet-of-Things (IoT) terminal. Alternatively, the display device 10 according to an embodiment may be applied to wearable devices such as a smart watch, a watch phone, a glasses type display, or a head mounted display (HMD). Alternatively, the display device 10 according to an embodiment may be applied to a dashboard of a vehicle, a center fascia of a vehicle, a center information display (CID) disposed on a dashboard of a vehicle, a room mirror display in place of side mirrors of a vehicle, or a display disposed on a rear surface of a front seat for rear seat entertainment of a vehicle.

In the present disclosure, a first direction (X-axis direction) may be a short side direction of the display device 10, for example, a horizontal direction of the display device 10. A second direction (Y-axis direction) may be a long side direction of the display device 10, for example, a vertical direction of the display device 10. A third direction (Z-axis direction) may be a direction perpendicular to the first and second directions or a thickness direction of the display device 10.

The display device 10 may have a planar shape similar to a quadrilateral shape. In an embodiment, for example, the display device 10 may have a planar shape similar to a rectangular shape having short sides in the first direction (X-axis direction) and long sides in the second direction (Y-axis direction), as shown in FIG. 1. The corner where the short side in the first direction (X-axis direction) and the long side in the second direction (Y-axis direction) meet may be rounded to have a predetermined curvature or may be right-angled. The planar shape of the display device 10 is not limited to a quadrilateral shape, and the display device 10 may be in a shape similar to another polygonal shape, a circular shape, or elliptical shape.

The display device 10 may be formed flat or have a substantially flat shape. Alternatively, the display device 10 may be formed in a way such that two sides portions facing each other are bendable or curved. In an embodiment, for example, the display device 10 may be formed in a way such that the left and right side portions are curved. Alternatively, the display device 10 may be formed in a way such that all of the upper, lower, left, and right side portions are curved.

The display device 10 according to an embodiment includes a cover window 100, a display panel 300, a display circuit board 310, a display driving circuit 320, a bracket 600, a main circuit board 700, optical devices 740, 750, 760, and 770, and a lower cover 900.

The cover window 100 may be disposed above the display panel 300 to cover the front surface of the display panel 300. Accordingly, the cover window 100 may function to protect the front surface of the display panel 300.

The display panel 300 may be disposed below the cover window 100. The display panel 300 may include a display area DA including a main display area MDA and a sub-display area SDA. The main display area MDA may occupy most of the display area DA. The sub-display area SDA may be disposed in one side portion of the main display area MDA, for example, on the upper side portion of the main display area MDA, as illustrated in FIG. 2, but the present disclosure is not limited thereto.

In an embodiment, the main display area MDA may not include a transmission area for transmitting light and may only include a pixel area having pixels for displaying an image. In such an embodiment, the sub-display area SDA may include both the transmission area for transmitting light and the pixel area having pixels for displaying an image. Therefore, the light transmittance of the sub-display area SDA may be higher than that of the main display area MDA.

The sub-display area SDA may overlap the optical devices 740, 750, 760, and 770 in the third direction (Z-axis direction). Accordingly, since light passing through the sub-display area SDA may be incident to the optical devices 740, 750, 760, and 770, each of the optical devices 740, 750, 760, and 770 may effectively sense light incident from the front surface of the display device 10 although the optical devices are disposed to overlap the display panel 300.

The display panel 300 may be a light emitting display panel including a light emitting element. In an embodiment, for example, the display panel 300 may be an organic light emitting display panel using an organic light emitting element including an organic light emitting layer, a micro light emitting diode (LED) display panel using a micro LED, a quantum dot light emitting display panel using a quantum dot LED including a quantum dot light emitting layer, or an inorganic light emitting display panel using an inorganic light emitting element including an inorganic semiconductor. Hereinafter, for convenience of description, embodiments where the display panel 300 is an organic light emitting display panel will be described.

The display circuit board 310 and the display driving circuit 320 may be attached to one side of the display panel 300. The display circuit board 310 may be a flexible printed circuit board which is bendable, a rigid printed circuit board which is solid to be hardly bent, or a composite printed circuit board including both of the rigid printed circuit board and the flexible printed circuit board.

The display driving circuit 320 may receive control signals and power voltages through the display circuit board 310 to generate and output signals and voltages for driving the display panel 300. The display driving circuit 320 may be formed as or defined by an integrated circuit (IC) to be attached on the display panel 300 by a chip-on-glass (COG) method, a chip-on-plastic (COP) method, or an ultrasonic bonding method, but the present disclosure is not limited thereto. In an alternative embodiment, for example, the display driving circuit 320 may be attached onto the display circuit board 310.

A touch driving circuit 330 may be disposed on the display circuit board 310. The touch driving circuit 330 may be formed as or defined by an integrated circuit and attached to the upper surface of the display circuit board 310. The touch driving circuit 330 may be electrically connected to the touch electrodes of the touch sensor layer of the display panel 300 through the display circuit board 310. The touch driving circuit 330 may output a touch driving signal to the touch electrodes and sense the voltage charged in the capacitances of the touch electrodes.

The touch driving circuit 330 may generate touch data based on the change in the electrical signal sensed at each of the touch electrodes to transmit the touch data to a main processor 710. Then, the main processor 710 may analyze the touch data to generate touch coordinates. The touch may include a contact touch and a proximity touch. The contact touch indicates that the object such as the human finger or pen makes a direct contact with the cover window disposed above the touch sensor layer. The proximity touch indicates that the object such as the human finger or pen is positioned above the cover window to be proximately apart therefrom, such as hovering.

In an embodiment, a power supply unit may be additionally disposed on the display circuit board 310 to supply display driving voltages for driving the display driving circuit 320.

The bracket 600 may be disposed under the display panel 300. The bracket 600 may include plastic, metal, or both plastic and metal. The bracket 600 may be provided with a first camera hole CMH1 into which a first camera sensor 720 is inserted, a battery hole BH in which a battery is disposed, a cable hole CAH through which a cable 314 connected to the display circuit board 310 passes, and a light transmission hole SH in which the optical devices 740, 750, 760, and 770 are disposed. Alternatively, the bracket 600 may be disposed not to overlap a sub-display area SDA of the display panel 300 without including the light transmission hole SH.

The main circuit board 700 and a battery 790 may be disposed under the bracket 600. The main circuit board 700 may be a printed circuit board or a flexible printed circuit board.

The main circuit board 700 may include a main processor 710, a first camera sensor 720, a main connector 730, and the optical devices 740, 750, 760 and 770. The optical devices 740, 750, 760, and 770 may include a proximity sensor 740, an illuminance sensor 750, an iris sensor 760, and a second camera sensor 770.

The first camera sensor 720 may be disposed on both the top and lower surfaces of the main circuit board 700, the main processor 710 may be disposed on the upper surface of the main circuit board 700, and the main connector 730 may be disposed on the lower surface of the main circuit board 700. The proximity sensor 740, the illuminance sensor 750, the iris sensor 760, and the second camera sensor 770 may be disposed on the upper surface of the main circuit board 700.

The main processor 710 may control overall functions of the display device 10. In an embodiment, for example, the main processor 710 may output digital video data to the display driving circuit 320 through the display circuit board 310 such that the display panel 300 displays an image. Further, the main processor 710 may receive touch data from the touch driving circuit 330 and determine the user's touch coordinates, and then execute an application indicated by an icon displayed on the user's touch coordinates. Further, the main processor 710 may convert first image data inputted from the first camera sensor 720 into digital video data and output it to the display driving circuit 320 through the display circuit board 310, thereby displaying an image captured by the first camera sensor 720 on the display panel 300. Furthermore, the main processor 710 may control the display device based on sensor signals inputted from the proximity sensor 740, the illuminance sensor 750, the iris sensor 760, and the second camera sensor 770.

The main processor 710 may determine whether an object is located close to the front surface of the display device 10 based on a proximity sensor signal inputted from the proximity sensor 740. When an object is positioned close to the front surface of the display device 10 in a call mode in which the user makes a call with the other party using the display device 10, the main processor 710 may not execute an application indicated by an icon displayed in touch coordinates although the user performs a touch.

The main processor 710 may determine the brightness of the front surface of the display device 10 based on an illuminance sensor signal inputted from an illuminance sensor 750. The main processor 710 may adjust the lumi-nance of an image displayed by the display panel 300 based on the brightness of the front surface of the display device 10.

The main processor 710 may determine whether the iris image of the user is the same as the iris image previously stored in the memory based on an iris sensor signal inputted from an iris sensor 760. The main processor 710 may unlock the display device 10 and display a home screen on the display panel 300 when the iris image of the user is the same as the iris image previously stored in the memory.

The main processor 710 may generate digital video data based on second image data inputted from the second camera sensor 770. The main processor 710 may display an image captured by the second camera sensor 770 on the display panel 300 by outputting digital video data to the display driving circuit 320 through the display circuit board 310.

The first camera sensor 720 may process an image frame of a still image or video obtained by the image sensor and output it to the main processor 710. The first camera sensor 720 may be a complementary metal-oxide-semiconductor (CMOS) image sensor or a charge-coupled device (CCD) sensor. The first camera sensor 720 may be exposed to the lower surface of the lower cover 900 by a second camera hole CMH2 to thereby capture an image of a background or an object disposed below the display device 10.

The cable 314 having passed through the cable hole CAH of the bracket 600 may be connected to the main connector 730. Thus, the main circuit board 700 may be electrically connected to the display circuit board 310.

The proximity sensor 740 is a sensor for detecting whether an object is positioned close to the front surface of the display device 10. The proximity sensor 740 may include a light source that outputs light and a light receiver that receives light reflected by an object. The proximity sensor 740 may determine whether there is an object located close to the front surface of the display device 10 based on the amount of light reflected by the object. Since the proximity sensor 740 is disposed to overlap the light transmission hole SH, the sub-display area SDA of the display panel 300, and the cover window 100 in the third direction (Z-axis direction), the proximity sensor 740 may generate a proximity sensor signal and output the proximity sensor signal to the main processor 710 according to whether there is an object positioned close to the front surface of the display device 10.

The illuminance sensor 750 is a sensor for detecting the brightness of the front surface of the display device 10. The illuminance sensor 750 may include a resistor whose resistance value changes based on the brightness of the incident light. The illuminance sensor 750 may determine the brightness of the front surface of the display device 10 based on the resistance value of the resistor. Since the illuminance sensor 750 is disposed to overlap the light transmission hole SH, the sub-display area SDA of the display panel 300, and the cover window 100 in the third direction (Z-axis direction), the illuminance sensor 750 may generate an illuminance sensor signal and output the illuminance sensor signal to the main processor 710 based on the brightness of the front surface of the display device 10.

The iris sensor 760 may a sensor for detecting whether the image of the user's iris is the same as the iris image previously stored in the memory. Since the iris sensor 760 is disposed to overlap the light transmission hole SH, the sub-display area SDA of the display panel 300, and the cover window 100 in the third direction (Z-axis direction), the iris sensor 760 may capture the iris of the user disposed above the display device 10. The iris sensor 760 may generate and output an iris sensor signal to the main processor 710 based on whether the user's iris image is the same as the iris image previously stored in the memory.

The second camera sensor 770 may process an image frame of a still image or video obtained by the image sensor and output it to the main processor 710. The second camera sensor 770 may be a complementary metal-oxide-semiconductor (CMOS) image sensor or a charge-coupled device (CCD) sensor. The number of pixels of the second camera sensor 770 may be smaller (or less) than the number of pixels of the first camera sensor 720, and the size of the second camera sensor 770 may be smaller than the size of the first camera sensor 720. Since the second camera sensor 770 is disposed to overlap the light transmission hole SH, the sub-display area SDA of the display panel 300, and the cover window 100 in the third direction (Z-axis direction), it is possible to capture an image of an object or a background disposed above the display device 10.

The battery 790 may be disposed not to overlap the main circuit board 700 in the third direction (Z-axis direction). The battery 790 may overlap the battery hole BH of the bracket 600.

In addition, the main circuit board 700 may be further equipped with a mobile communication module capable of transmitting and receiving radio signals with at least one of a base station, an external terminal, or a server in a mobile communication network. The radio signal may include various types of data according to transmission and reception of a voice signal, a video call signal, or a text/multimedia message.

The lower cover 900 may be disposed below the main circuit board 700 and the battery 790. The lower cover 900 may be fixed by being fastened to the bracket 600. The lower cover 900 may form an external appearance of the lower surface of the display device 10. The lower cover 900 may include plastic, metal, or both plastic and metal.

The second camera hole CMH2 exposing the lower surface of the first camera sensor 720 may be formed in the lower cover 900. The position of the first camera sensor 720 and the positions of the first and second camera holes CMH1 and CMH2 corresponding to the first camera sensor 720 are not limited to the embodiment illustrated in FIG. 2.

Figure 3:
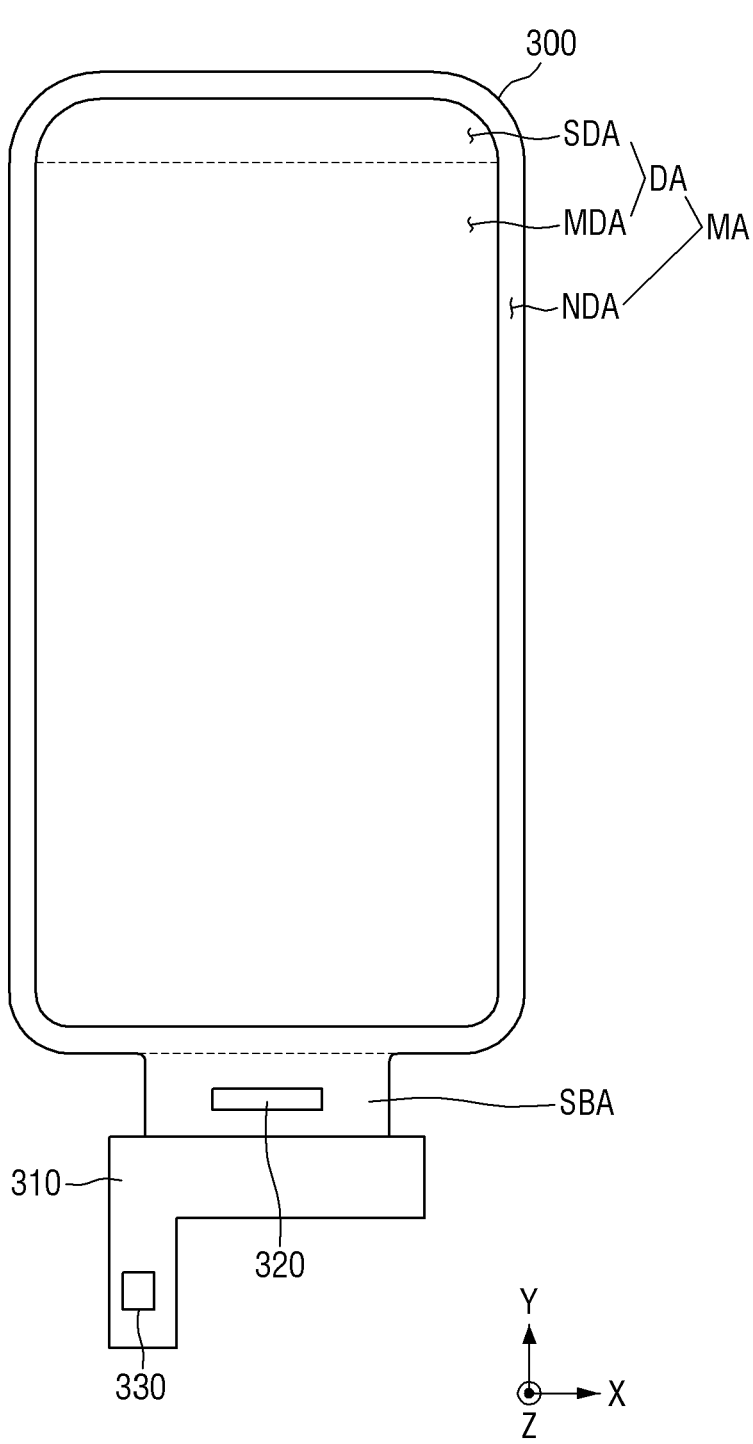
FIG. 3 is a plan view illustrating a display panel, a display circuit board, a display driving circuit, and a touch driving circuit according to an embodiment.
Figure 4:
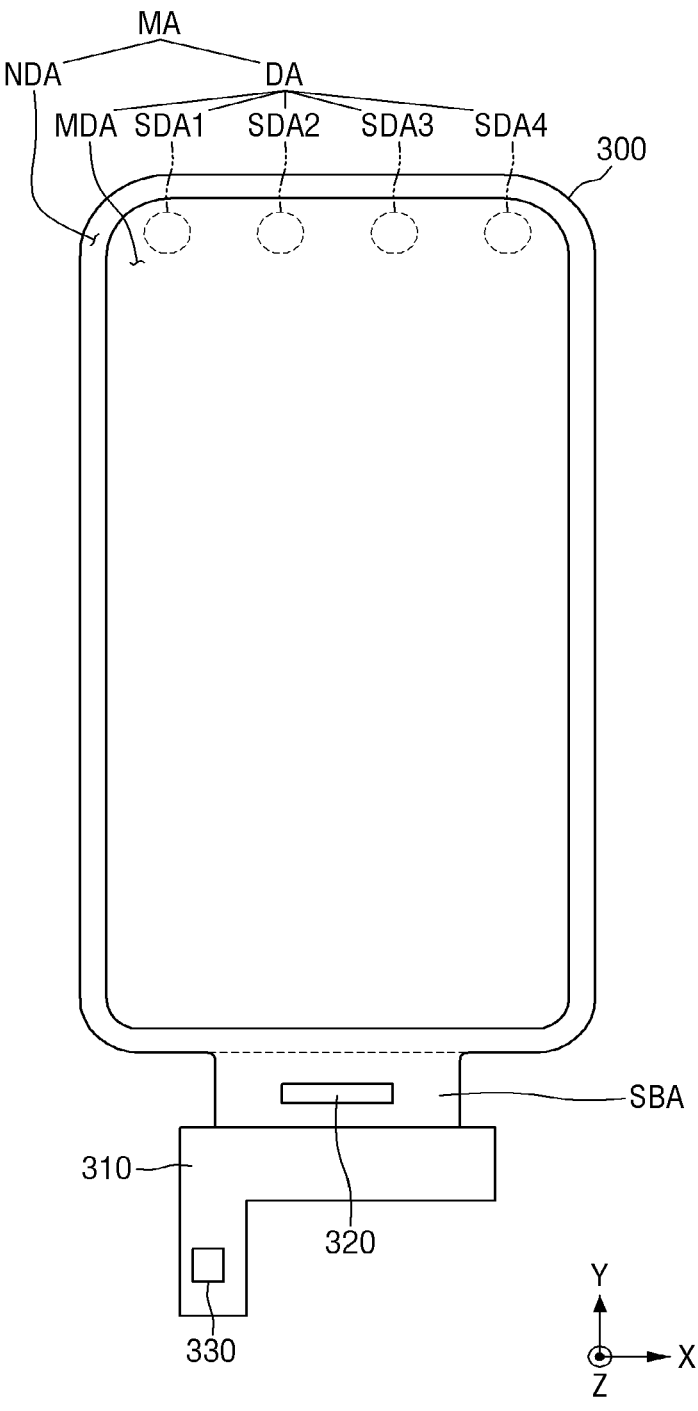
FIG. 4 is a plan view illustrating a display panel, a display circuit board, a display driving circuit, and a touch driving circuit according to an alternative embodiment.

FIG. 3 is a plan view illustrating a display panel, a display circuit board, a display driving circuit, and a touch driving circuit according to an embodiment. FIG. 4 is a plan view illustrating a display panel, a display circuit board, a display driving circuit, and a touch driving circuit according to an alternative embodiment.

Referring to FIG. 3, an embodiment of the display panel 300 may be a rigid display panel which is rigid not to be easily bent, or a flexible display panel which is flexible to be easily bent, folded, or rolled up. In an embodiment, for example, the display panel 300 may be a foldable display panel which can be folded and unfolded, a curved display panel having a curved display surface, a bended display panel having a bent area other than the display surface, a rollable display panel which can be rolled up and rolled out and a stretchable display panel which can be stretched.

Further, the display panel 300 may be a transparent display panel which is transparently implemented to allow an object or background disposed behind the rear surface of the display panel 300 to be viewed from the front surface of the display panel 300. Further, the display panel 300 may be a reflective display panel which is capable of reflecting an object or background in front of the front surface of the display panel 300.

The display panel 300 may include a main region MA and a sub-region SBA protruding from one side of the main region MA. The main region MA may include a display area DA for displaying an image and a non-display area NDA that is a peripheral area of the display area DA. The display area DA may occupy most of the main region MA. The display area DA may be disposed at the center of the main region MA. The non-display area NDA may be an area outside the display area DA. The non-display area NDA may be defined as an edge area of the display panel 300.

The display area DA may include the main display area MDA and the sub-display area SDA. The main display area MDA may occupy most of the display area DA.

The main display area MDA may not include a transmission area for transmitting light and may only include a pixel area having pixels for displaying an image. In contrast, the sub-display area SDA may include both the transmission area for transmitting light and the pixel area having pixels for displaying an image. Therefore, the light transmittance of the sub-display area SDA may be higher than that of the main display area MDA.

The sub-display area SDA may overlap the optical devices 740, 750, 760, and 770 in the third direction (Z-axis direction). Accordingly, since light passing through the sub-display area SDA may be incident to the optical devices 740, 750, 760, and 770, each of the optical devices 740, 750, 760, and 770 may sense light incident from the front surface of the display device 10 although the optical devices are disposed to overlap the display panel 300.

The sub-display area SDA may be disposed at one side of the main display area MDA, for example, at the upper side of the main display area MDA, as illustrated in FIG. 3, but the present disclosure is not limited thereto. In an embodiment, for example, the sub-display area SDA may be disposed at the left side, right side, or lower side of the main display area MDA. Alternatively, the sub-display area SDA may be disposed at a center of the main display area MDA and surrounded by the main display area MDA. Alternatively, the sub-display area SDA may be disposed adjacent to a corner of the display panel 300.

Alternatively, the display area DA may include a plurality of sub-display areas SDA1, SDA2, SDA3, and SDA4 as illustrated in FIG. 4. The plurality of sub-display areas SDA1, SDA2, SDA3, and SDA4 may be disposed to be spaced apart from each other. Each of the plurality of sub-display areas SDA1, SDA2, SDA3, and SDA4 may be surrounded by the main display area MDA.

The first sub-display area SDA1 may overlap the proximity sensor 740 in the third direction (Z-axis direction). Accordingly, although the proximity sensor 740 is disposed to overlap the display panel 300, the proximity sensor 740 may sense light incident from the front surface of the display device 10 through the first sub-display area SDA1.

The second sub-display area SDA2 may overlap the illuminance sensor 750 in the third direction (Z-axis direction). Accordingly, although the illuminance sensor 750 is disposed to overlap the display panel 300, the illuminance sensor 750 may sense light incident from the front surface of the display device 10 through the second sub-display area SDA2.

The third sub-display area SDA3 may overlap the iris sensor 760 in the third direction (Z-axis direction). Accordingly, although the iris sensor 760 is disposed to overlap the display panel 300, the iris sensor 760 may sense light incident from the front surface of the display device 10 through the third sub-display area SDA3.

The fourth sub-display area SDA4 may overlap the second camera sensor 770 in the third direction (Z-axis direction). Accordingly, although the second camera sensor 770 is disposed to overlap the display panel 300, the second camera sensor 770 may sense light incident from the front of the display device 10 through the fourth sub-display area SDA4.

In an embodiment, as illustrated in FIG. 4, the display area DA may include the four sub-display areas SDA1, SDA2, SDA3, and SDA4, but is not limited thereto. The number of the sub-display areas SDA1, SDA2, SDA3, and SDA4 may depend on the number of the optical devices 740, 750, 760, and 770. The sub-display areas SDA1, SDA2, SDA3, and SDA4 may be disposed to correspond to the optical devices 740, 750, 760, and 770 in a one-to-one correspondence.

Each of the plurality of sub-display areas SDA1, SDA2, SDA3, and SDA4 may be formed or defined in a circular shape as illustrated in FIG. 4, but is not limited thereto. In an alternative embodiment, for example, each of the plurality of sub-display areas SDA1, SDA2, SDA3, and SDA4 may be formed in a polygonal shape or an elliptical shape. In an embodiment, the plurality of sub-display areas SDA1, SDA2, SDA3, and SDA4 may have a same size as each other as illustrated in FIG. 4, but are not limited thereto. Alternatively, the plurality of sub-display areas SDA1, SDA2, SDA3, and SDA4 may have different sizes from each other.

The sub-region SBA may protrude in the second direction (Y-axis direction) from one side of the main region MA. As illustrated in FIG. 2, the length of the sub-region SBA in the first direction (X-axis direction) may be smaller than the length of the main region MA in the first direction (X-axis direction), and the length of the sub-region SBA in the second direction (Y-axis direction) may be smaller than the length of the main region MA in the second direction (Y-axis direction), but the present disclosure is not limited thereto. The sub-region SBA may be foldable to be disposed under the display panel 300. In this case, the sub-region SBA may overlap the main region MA in a third direction (Z-axis direction).

The sub-region SBA of the display panel 300 may be foldable to be placed under the display panel 300 as shown in FIG. 2. In a folded state, the sub-region SBA of the display panel 300 may overlap the main region MA of the display panel 300 in the third direction (Z-axis direction).

The display circuit board 310 and the display driving circuit 320 may be attached to the sub-region SBA of the display panel 300. The display circuit board 310 may be attached onto pads of the sub-region SBA of the display panel 300 using a low-resistance high-reliability material such as self assembly anisotropic conductive paste (SAP) or an anisotropic conductive film. The touch driving circuit 330 may be disposed on the display circuit board 310.

Figure 5:
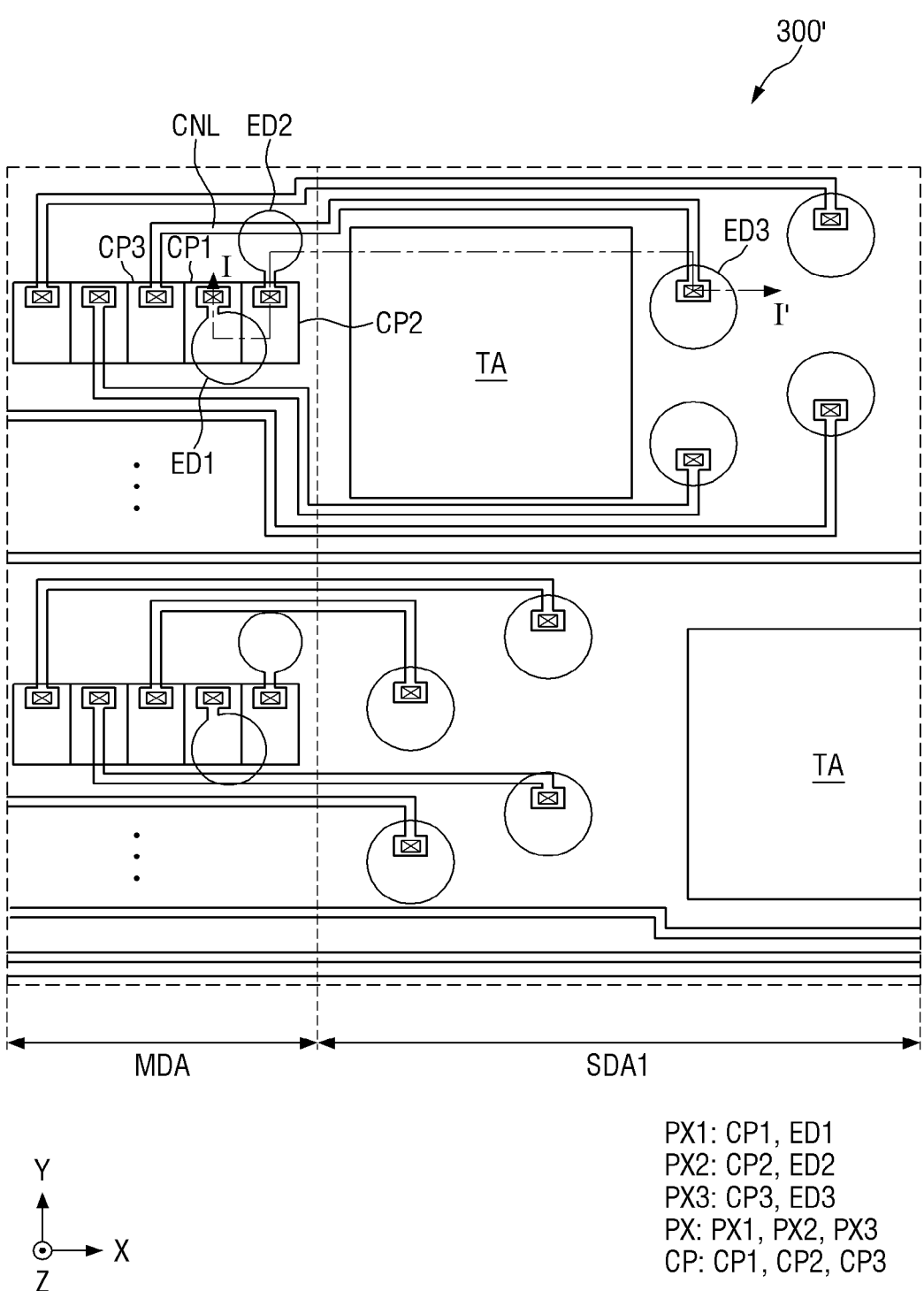
FIG. 5 is a plan view illustrating a partial area of a display panel according to an embodiment.

FIG. 5 is a plan view illustrating a partial area of a display panel according to an embodiment. FIG. 5 exemplarily illustrates a main display area and a first sub-display area of the display panel.

Referring to FIG. 5, in an embodiment, the display panel 300 may include the main display area MDA and the first sub-display area SDA1. The main display area MDA may be adjacent to the first sub-display area SDA1 and may be disposed to surround the first sub-display area SDA1.

The display panel 300 may include a plurality of pixels PX. The plurality of pixels PX may include a first pixel PX1 and a second pixel PX2 that emit light in the main display area MDA, and may include a third pixel PX3 that emits light in the first sub-display area SDA1. A plurality of first pixels PX1, second pixels PX2, and third pixels PX3 may be formed. The first pixel PX1 may be a red pixel that emits red light, the second pixel PX2 may be a green pixel that emits green light, and the third pixel PX3 may be a blue pixel that emits blue light. However, the present disclosure is not limited thereto, and may further include a white pixel that emits white light.

The plurality of pixels PX may include pixel circuits CP driving light emitting elements. In an embodiment, for example, the first pixel PX1 may include a first pixel circuit CP1 that drives a first light emitting element ED1, the second pixel PX2 may include a second pixel circuit CP2 that drives a second light emitting element ED2, and the third pixel PX3 may include a third pixel circuit CP3 that drives a third light emitting element ED3.

The first sub-display area SDA1 may overlap or correspond to the proximity sensor 740 illustrated in FIG. 1. That is, the first sub-display area SDA1 may be disposed in an area overlapping the proximity sensor 740 in the third direction (Z-axis direction). In an embodiment, for example, light incident from the outside may pass through the first sub-display area SDA1 and be provided to the proximity sensor 740.

Fewer pixels may be disposed in the first sub-display area SDA1 than the main display area MDA such that light incident from the outside may pass through the first sub-display area SDA1. An area in the first sub-display area SDA1 in which the third light emitting element ED3 is not disposed may be an area having high light transmittance. In an embodiment, for example, an area in the first sub-display area SDA1 in which the first electrode of the third light emitting element ED3 is not disposed may have high light transmittance.

In an embodiment, the number of the third pixels PX3 disposed in the first sub-display area SDA1 within a same area (or a unit area), that is, a pixel density, may be less than the number of the first pixels PX1 disposed in the main display area MDA within the same area. However, the present disclosure is not limited thereto, and the number of the third pixels PX3 disposed in the first sub-display area SDA1 within the same area may be the same as the number of the first pixels PX1 disposed in the main display area MDA within the same area.

The first pixel circuit CP1 of the first pixel PX1 and the second pixel circuit CP2 of the second pixel PX2 may be disposed in the main display area MDA, and the third pixel circuit CP3 of the third pixel PX3 may not be disposed in the main display area MDA. In this case, the light transmittance of the first sub-display area SDA1 may be greater than the light transmittance of the main display area MDA.

The third light emitting element ED3 and the third pixel circuit CP3 may be electrically connected to each other through a connection line CNL. The connection line CNL may extend from the main display area MDA to the first sub-display area SDA1. The connection line CNL may include a transparent conductive line. The transparent conductive line may include a transparent conductive material or a light transmissive material. In an embodiment, for example, the connection line CNL may include or be formed of a transparent conductive oxide (TCO) layer such as indium tin oxide (ITO), indium zinc oxide (IZO), indium gallium zinc oxide (IGZO), zinc oxide (ZnO), or indium oxide ($In_2O_3$).

The main display area MDA may be disposed adjacent to the first sub-display area SDA1, and may surround the first sub-display area SDA1. The main display area MDA may be an area having a transmittance lower than that of the first sub-display area SDA1. In the main display area MDA, the first pixel circuit CP1 and the first light emitting element ED1 of the first pixel PX1 and the second pixel circuit CP2 and the second light emitting element ED2 of the second pixel PX2 may be disposed. In addition, the third pixel circuit CP3 of the third pixel PX3 may be disposed in the main display area MDA. Accordingly, the light transmittance of the main display area MDA may be lower than the light transmittance of the first sub-display area SDA1.

The size of the light emitting elements disposed in the main display area MDA may be smaller than the size of the light emitting elements disposed in the first sub-display area SDA1. In an embodiment, for example, the size of the first light emitting element ED1 disposed in the main display area MDA1 may be smaller than the size of the third light emitting element ED3 disposed in the first sub-display area SDA1. In addition, the size of the first electrode of the first light emitting element ED1 disposed in the main display area MDA1 may be smaller than the size of the first electrode of the third light emitting element ED3 disposed in the first sub-display area SDA1.

In an embodiment, the first sub-display area SDA1 may include at least one transmission area TA. The transmission area TA may be an area having the highest light transmittance in the first sub-display area SDA1. In an embodiment, for example, the light transmittance of the transmission area TA may be higher than the light transmittance of an area of the first sub-display area SDA1 in which the connection line CNL and the first electrode of the third light emitting element ED3 are not disposed. As will be described later, the transmission area TA may be an area in which substrates and inorganic layers are not disposed, and may have the highest light transmittance.

A plurality of transmission areas TA may be disposed in the first sub-display area SDA1, and may be disposed to be spaced apart from each other. In an embodiment, for example, the transmission areas TA may be alternately disposed with areas in which the third light emitting elements ED3 are disposed in the first direction (X-axis direction) and the second direction (Y-axis direction). That is, areas in which the third light emitting elements ED3 are disposed may be disposed between the transmission areas TA.

The transmission area TA may not overlap the connection line CNL disposed to extend from the main display area MDA to the first sub-display area SDA1. The connection line CNL may extend around the transmission area TA. In an embodiment, for example, the connection line CNL may detour around the transmission area TA and extend to the first sub-display area SDA1.

As described above, the display device 10 according to an embodiment may improve the transmittance of light incident to the optical devices 740, 750, 760, and 770 (see FIG. 2) by including the transmission area TA in the sub-display area SDA overlapping the optical devices 740, 750, 760, and 770 (see FIG. 2).

Figure 6:
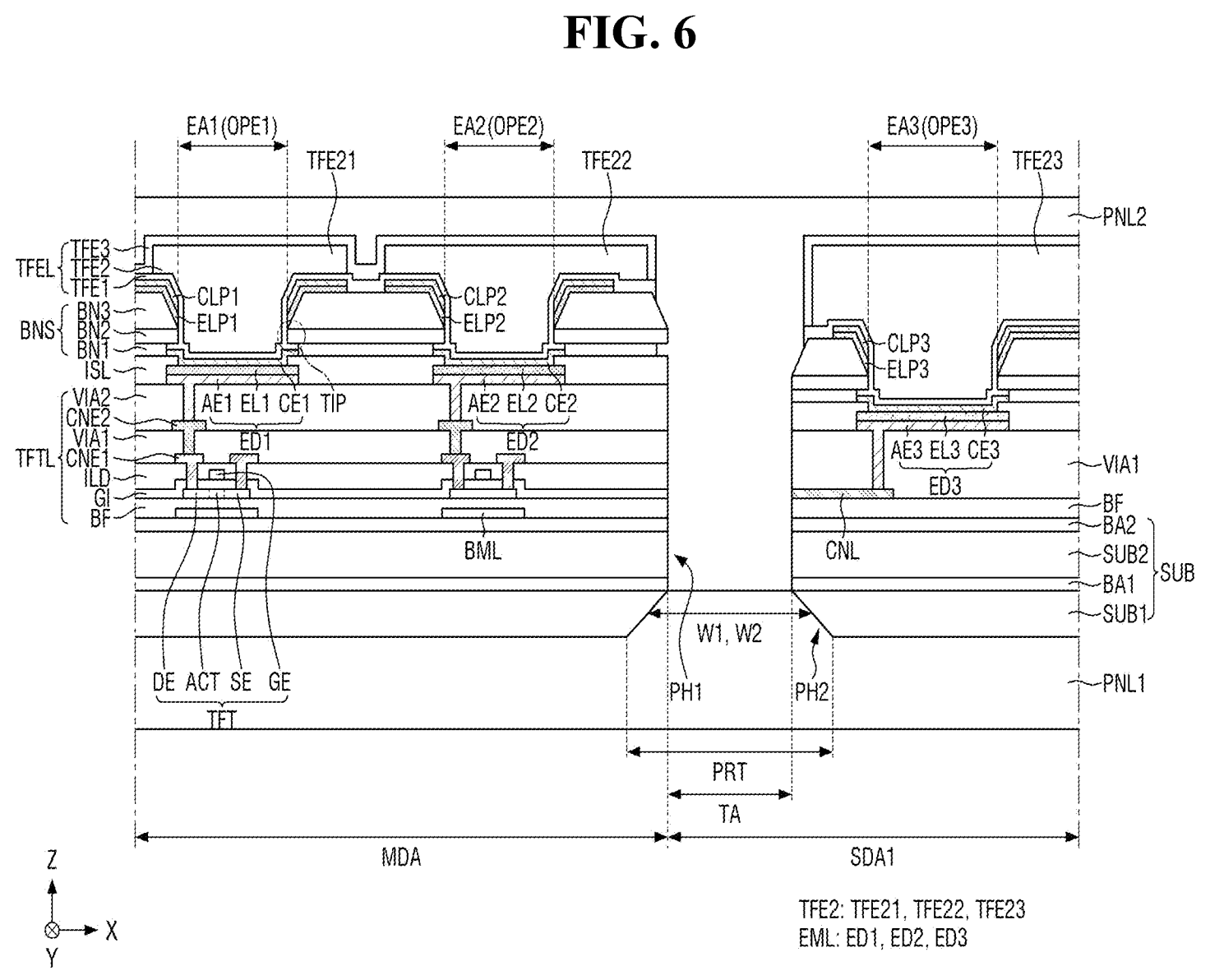
Figure 7:
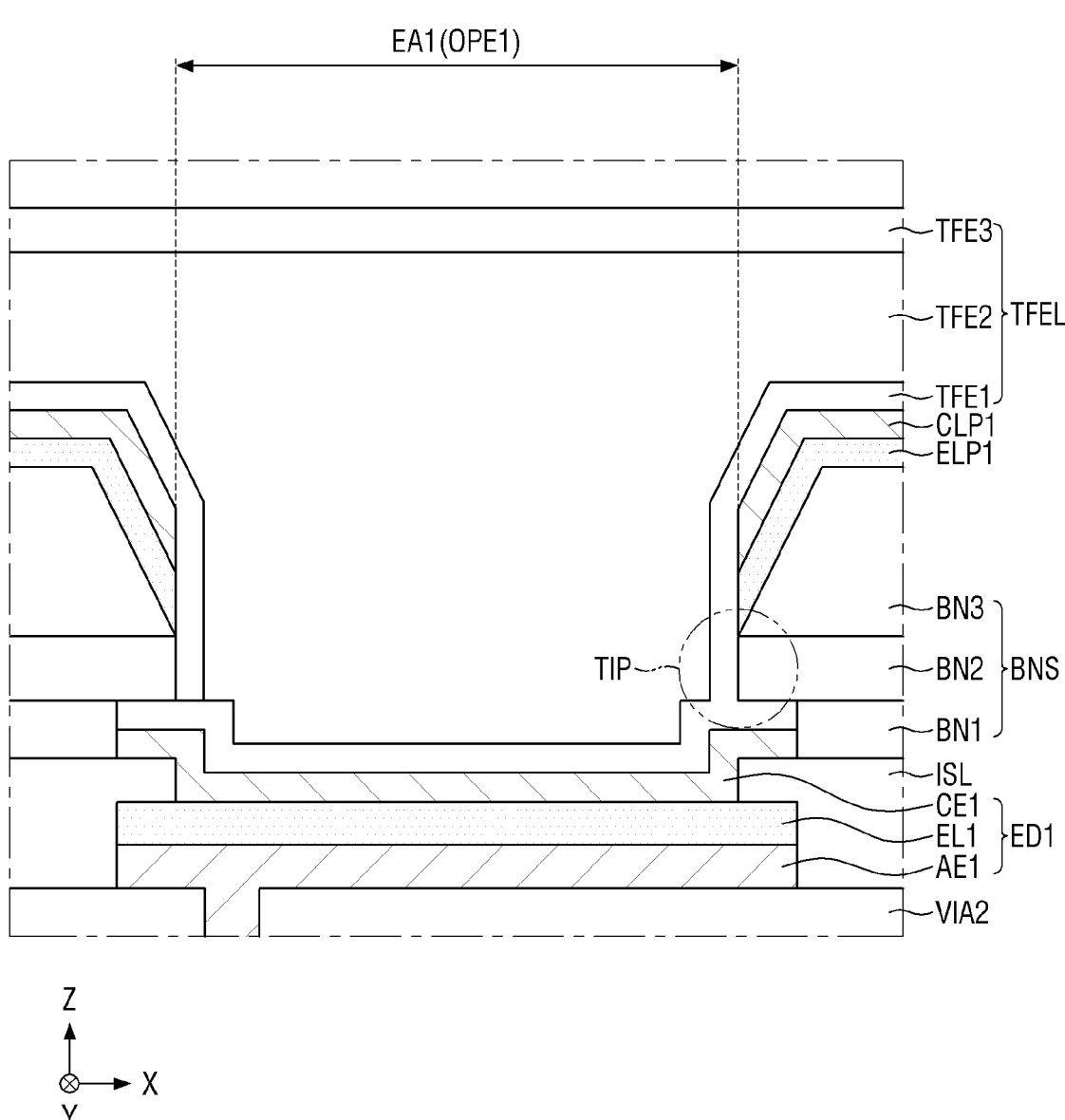
FIG. 7 is an enlarged view of a partial area of FIG. 6.

FIG. 6 is a cross-sectional view taken along line I-I' of FIG. 5. FIG. 7 is an enlarged view of a partial area of FIG. 6.

Referring to FIGS. 6 and 7, the display device 10 according to an embodiment may include a first planarization layer PNL1, a substrate SUB, a thin film transistor layer TFTL, a light emitting element layer EML, a thin film encapsulation layer TFEL, and a second planarization layer PNL2.

The first planarization layer PNL1 may serve to planarize the lower portion of the display device 10. The first planarization layer PNL1 may include or be formed of a resin having high transmittance and capable of being cured by ultraviolet (UV) light. In an embodiment, for example, the first planarization layer PNL1 may include a polymer resin such as polyimide (PI), but is not limited thereto.

The first planarization layer PNL1 may include a protrusion PRT. The protrusion PRT may be a portion protruding in a thickness direction, for example, in the third direction (Z-axis direction) toward the second planarization layer PNL2. The protrusion PRT may overlap the transmission area TA in a plan view. In addition, at least a portion of the protrusion PRT may overlap the main display area MDA, and at least the other portion of the protrusion PRT may overlap the first sub-display area SDA1. The transmission area TA may completely overlap the protrusion PRT in a plan view.

The protrusion PRT may have a shape in which a width W1 gradually decreases in the third direction (Z-axis direction). Here, the width W1 of the protrusion PRT may be measured in the first direction (X-axis direction), and may be measured in the second direction (Y-axis direction). In an embodiment, for example, the width W1 of the protrusion PRT may gradually decrease from the lower surface (e.g., a bottom surface) of the first planarization layer PNL1 toward the second planarization layer PNL2.

The substrate SUB may be a base substrate or a base member. The substrate SUB may include a first substrate SUB1, a first barrier layer BA1, a second substrate SUB2, and a second barrier layer BA2. In an embodiment, for example, the first barrier layer BA1 may be disposed on the first substrate SUB1, the second substrate SUB2 may be disposed on the first barrier layer BA1, and the second barrier layer BA2 may be disposed on the second substrate SUB2.

Each of the first substrate SUB1 and the second substrate SUB2 may be a flexible substrate which can be bent, folded and rolled, i.e., bendable, foldable or rollable. The first substrate SUB1 and the second substrate SUB2 may include a polymer resin such as polyimide (PI), but are not limited thereto.

Each of the first barrier layer BA1 and the second barrier layer BA2 may protect thin film transistors of the thin film transistor layer TFTL and the light emitting element layer EML from moisture permeating through the first substrate SUB1 and the second substrate SUB2 which are susceptible to moisture permeation. Each of the first barrier layer BA1 and the second barrier layer BA2 may include or be formed of a plurality of inorganic layers that are alternately stacked. In an embodiment, for example, each of the first barrier layer BA1 and the second barrier layer BA2 may be a single layer selected from a silicon oxide layer, a silicon nitride layer, and a silicon nitric oxide layer, or a multilayer in which one or more inorganic layers thereof are alternately stacked.

A first through hole PH1 and a second through hole PH2 may be defined in the substrate SUB. The first through hole PH1 may be a hole defined or formed through the upper thin film encapsulation layer TFEL, the thin film transistor layer TFTL, and a portion of the substrate SUB. The second through hole PH2 may be a hole defined or formed through the first substrate SUB1. The first through hole PH1 and the second through hole PH2 may be defined to overlap the transmission area TA, and may correspond to the transmission area TA. The first through hole PH1 and the second through hole PH2 may overlap at least one of the optical devices 740, 750, 760, and 770 (see FIG. 2) that are disposed thereunder.

In such an embodiment, the first through hole PH1 may be defined further through the first barrier layer BA1, the second substrate SUB2, and the second barrier layer BA2 of the substrate SUB. Accordingly, the first barrier layer BA1, the second substrate SUB2, and the second barrier layer BA2 may not be disposed in the transmission area TA. The first substrate SUB1 of the substrate SUB may be provided with the second through hole PH2. Accordingly, the first substrate SUB1 may not be disposed in the transmission area TA.

The first through hole PH1 may be filled with the second planarization layer PNL2 described later, and the second through hole PH2 may be filled with the first planarization layer PNL1 described above. The protrusion PRT of the first substrate SUB1 may be disposed in the second through hole PH2. A width W2 of the second through hole PH2 may gradually increase from the upper surface of the first substrate SUB1 to the lower surface of the first substrate SUB1. That is, the width W2 of the second through hole PH2 may gradually increase in a direction opposite to the third direction (Z-axis direction).

In an embodiment, the thin film transistor layer TFTL may be disposed on the substrate SUB, and may include a light blocking layer BML, a buffer layer BF, a thin film transistor TFT, a gate insulating layer GI, an interlayer insulating layer ILD, a first connection electrode CNE1, the connection line CNL, a first via layer VIA1, a second connection electrode CNE2, and a second via layer VIA2.

The light blocking layer BML may be disposed on the second barrier layer BA2. The light blocking layer BML may be disposed to overlap a semiconductor layer ACT of the thin film transistor TFT to prevent leakage current from occurring by blocking light from being incident on the semiconductor layer ACT of the thin film transistor TFT. Accordingly, the light blocking layer BML may be disposed in the main display area MDA in which the thin film transistor TFT is disposed, and may not be disposed in the first sub-display area SDA1 in which the thin film transistor TFT is not disposed.

The light blocking layer BML may be covered by the buffer layer BF. The light blocking layer BML may be formed as a single layer or multiple layers including or made of at least one selected from molybdenum (Mo), aluminum (Al), chromium (Cr), gold (Au), titanium (Ti), nickel (Ni), neodymium (Nd) and copper (Cu) and an alloy thereof.

The buffer layer BF may be disposed on the light blocking layer BML and the second barrier layer BA2. The buffer layer BF may include an inorganic layer capable of preventing permeation of air or moisture. In an embodiment, for example, the buffer layer BF may be a single layer selected from a silicon oxide layer, a silicon nitride layer, and a silicon nitric oxide layer, or a multilayer in which one or more inorganic layers thereof are alternately stacked.

The thin film transistor TFT may be disposed on the buffer layer BF, and may constitute a pixel circuit of each of the plurality of pixels. In an embodiment, for example, the thin film transistor TFT may be a switching transistor or a driving transistor of the pixel circuit. The thin film transistor TFT may include a semiconductor layer ACT, a source electrode SE, a drain electrode DE, and a gate electrode GE.

The semiconductor layer ACT may be disposed on the buffer layer BF. The semiconductor layer ACT may overlap the light blocking layer BML and the gate electrode GE in the thickness direction or the third direction (Z-axis direction), and may be insulated from the gate electrode GE by the gate insulating layer GI. The semiconductor layer ACT may include polycrystalline silicon, mono crystal line silicon, low-temperature polycrystalline silicon, amorphous silicon, or an oxide semiconductor. A portion of the semiconductor layer ACT may form or define the source electrode SE and the drain electrode DE in which a material of the semiconductor layer ACT is conductive.

The gate electrode GE may be disposed on the gate insulating layer GI. The gate electrode GE may overlap the semiconductor layer ACT with the gate insulating layer GI interposed therebetween. The gate electrode GE may be formed as a single layer or multiple layers including or made of at least one selected from molybdenum (Mo), aluminum (Al), chromium (Cr), gold (Au), titanium (Ti), nickel (Ni), neodymium (Nd) and copper (Cu) and an alloy thereof.

The gate insulating layer GI may be disposed on the semiconductor layer ACT. In an embodiment, for example, the gate insulating layer GI may cover the semiconductor layer ACT and the buffer layer BF to insulate the gate electrode GE from the semiconductor layer ACT. The gate insulating layer GI may be provided with a contact hole through which the first connection electrode CNE1 extends.

The interlayer insulating layer ILD may cover the gate electrode GE and the gate insulating layer GI. The interlayer insulating layer ILD may be provided with a contact hole through which the first connection electrode CNE1 extends. The contact hole of the interlayer insulating layer ILD may be connected to the contact hole of the gate insulating layer GI.

The first connection electrode CNE1 may be disposed on the interlayer insulating layer ILD. The first connection electrode CNE1 may electrically connect the drain electrode DE of the thin film transistor TFT to the second connection electrode CNE2. The first connection electrode CNE1 may be inserted into a contact hole, which is defined or formed in the interlayer insulating layer ILD and the gate insulating layer GI, to be in contact with the drain electrode DE of the thin film transistor TFT. The first connection electrode CNE1 may be formed as a single layer or multiple layers including or made of at least one selected from molybdenum (Mo), aluminum (Al), chromium (Cr), gold (Au), titanium (Ti), nickel (Ni), neodymium (Nd) and copper (Cu), and an alloy thereof.

The first via layer VIA1 may flatten stepped portions caused by lower electrodes. The first via layer VIA1 may be disposed on the first connection electrode CNE1 and the interlayer insulating layer ILD. The first via layer VIA1 may be provided with a contact hole through which the first connection electrode CNE1 extends. The first via layer VIA1 may be formed of (or defined by) an organic layer including an organic material such as an acryl resin, an epoxy resin, a phenolic resin, a polyamide resin, a polyimide resin, or the like.

The second connection electrode CNE2 may be disposed on the first via layer VIA'. The second connection electrode CNE2 may be electrically connected to the drain electrode DE of the thin film transistor TFT. The second connection electrode CNE2 may be inserted into a contact hole defined or formed in the first via layer VIA1 to be in contact with the first connection electrode CNE1. The second connection electrode CNE2 may be formed as a single layer or multiple layers including or made of at least one selected from molybdenum (Mo), aluminum (Al), chromium (Cr), gold (Au), titanium (Ti), nickel (Ni), neodymium (Nd) and copper (Cu), and an alloy thereof.

The second via layer VIA2 may flatten stepped portions caused by lower electrodes. The second via layer VIA2 may be disposed on the second connection electrode CNE2 and the first via layer VIA1. The second via layer VIA2 may be provided with a contact hole through which the pixel electrodes AE1 and AE2 extend. The second via layer VIA2 may be formed of an organic layer including an organic material such as an acryl resin, an epoxy resin, a phenolic resin, a polyamide resin, a polyimide resin, or the like.

In an embodiment, in the main display area MDA, the configurations described in the thin film transistor layer TFTL described above are disposed, but in the first sub-display area SDA1, the thin film transistor TFT may not be disposed, and only some layers of the thin film transistor layer TFTL may be disposed. That is, in the first sub-display area SDA1, not only the thin film transistor TFT, but also the gate insulating layer GI, the interlayer insulating layer ILD, the first connection electrode CNE1, the second connection electrode CNE2, and the second via layer VIA2 may not be disposed. Among the above-mentioned layers, the gate insulating layer GI, the interlayer insulating layer ILD, and the second via layer VIA2 may be omitted in the first sub-display area SDA1 to prevent light transmittance thereof from being lowered. In addition, the thin film transistor layer TFTL may be disposed in the main display area MDA and the first sub-display area SDA1, but may not be disposed in the transmission area TA. In an embodiment, for example, the thin film transistor layer TFTL may not overlap the transmission area TA in the thickness direction.

In the first sub-display area SDA1, the buffer layer BF and the first via layer VIA1 of the thin film transistor layer TFTL may be disposed, and the connection line CNL may be further disposed. The connection line CNL may be disposed on the buffer layer BF. The connection line CNL may be disposed on the interlayer insulating layer ILD in the main display area MDA, extend to the first sub-display area SDA1, and be disposed on the buffer layer BF in the first sub-display area SDA1.

The first via layer VIA1 may be disposed on the connection line CNL and the buffer layer BF, and may be provided with a contact hole through which the pixel electrode AE3 extends. The thickness of the first via layer VIA1 of the main display area MDA may be less than the thickness of the first via layer VIA1 of the first sub-display area SDA1. Since some of the above-described layers are not disposed in the first sub-display area SDA1, the first via layer VIA1 formed through the solution process may be formed to be relatively thicker in the main display area MDA.

In the transmission area TA, some layers of the thin film transistor layer TFTL may be penetrated by the first through hole PH1, and some other layers may be removed by the first through hole PH1.

In an embodiment, the first through hole PH1 may penetrate the buffer layer BF and the first via layer VIA1 in the transmission area TA. In an embodiment, for example, the first through hole PH1 may be formed in the buffer layer BF and the first via layer VIA1 to form the transmission area TA. In addition, the gate insulating layer GI, the interlayer insulating layer ILD, and the second via layer VIA2 partially extending from the main display area MDA to the first sub-display area SDA1 may be removed from the transmission area TA by the first through hole PH1. Accordingly, side edges of the buffer layer BF, the gate insulating layer GI, the interlayer insulating layer ILD, the first via layer VIA1, and the second via layer VIA2 may be disposed on a portion of the inner circumferential surface of the first through hole PH1, and side edges of the buffer layer BF and the first via layer VIA1 may be disposed on other parts thereof.

In an embodiment, the light emitting element layer EML may be disposed on the thin film transistor layer TFTL. In addition, the light emitting element layer EML may be disposed in the main display area MDA and the first sub-display area SDA1, but may not be disposed in the transmission area TA. In an embodiment, for example, the light emitting element layer EML may not overlap the transmission area TA in the thickness direction.

The light emitting element layer EML may include the light emitting elements ED1, ED2, and ED3 and a plurality of bank structures BNS. The light emitting element ED may include the pixel electrodes AE1, AE2, and AE3, light emitting layers EL1, EL2, and EL3, and common electrodes CE1, CE2, and CE3.

The display device 10 may include a plurality of emission areas EA1 and EA2 disposed in the main display area MDA and a plurality of emission areas EA3 disposed in the first sub-display area SDA1. The emission areas EA1, EA2, and EA3 may include a first emission area EA1, a second emission area EA2, and a third emission area EA3 emitting light of different colors. The first to third emission areas EA1, EA2, and EA3 may emit red, green, or blue light, respectively, and the color of the light emitted from each of the emission areas EA1, EA2 and EA3 may be different depending on the types of the light emitting elements ED1, ED2, and ED3 disposed on the light emitting element layer EML. In an embodiment, the first emission area EA1 may emit first light of a red color, the second emission area EA2 may emit second light of a green color, and the third emission area EA3 may emit third light of a blue color. However, the present disclosure is not limited thereto.

The first to third emission areas EA1, EA2, and EA3 may be defined by a plurality of openings OPE1, OPE2, and OPE3 defined or formed in a bank structure BNS of the light emitting element layer EML, respectively. In an embodiment, for example, the first emission area EA1 may be defined by the first opening OPE1 of the bank structure BNS, the second emission area EA2 may be defined by the second opening OPE2 of the bank structure BNS, and the third emission area EA3 may be defined by the third opening OPE3 of the bank structure BNS.

In an embodiment, the areas or sizes of the first to third emission areas EA1, EA2, and EA3 may be the same as each other. In an embodiment, for example, in the display device 10, the openings OPE1, OPE2, and OPE3 of the bank structures BNS may have the same diameter, and the first emission area EA1, the second emission area EA2, and the third emission area EA3 may have a same area as each other. However, the present disclosure is not limited thereto. In an alternative embodiment of the display device 10, the areas or sizes of the first to third emission areas EA1, EA2, and EA3 may be different from each other. In an embodiment, for example, the areas of the second emission area EA2 may be greater than the areas of the first emission area EA1 and the third emission area EA3, and the area of the third emission area EA3 may be greater than the area of the first emission area EA1. The intensity of light emitted from the corresponding emission areas EA1, EA2, and EA3 may vary according to the areas of the emission areas EA1, EA2, and EA3, and the areas of the emission areas EA1, EA2, and EA3 may be adjusted to control the color of the screen displayed on the display device 10. The areas of the emission areas EA1, EA2, and EA3 may be variously adjusted according to the color of the screen required by the display device 10. In addition, the areas of the emission areas EA1, EA2, and EA3 may be related to light efficiency and the lifespan of the light emitting element ED, and may have a trade-off relation with the reflection by external light. The areas of the emission areas EA1, EA2, and EA3 may be adjusted in consideration of the above factors.

The display device 10 may include the plurality of light emitting elements ED1, ED2, and ED3 disposed in the different emission areas EA1, EA2, and EA3, respectively. The light emitting elements ED1, ED2, and ED3 may include a first light emitting element ED1 disposed in the first emission area EA1, a second light emitting element ED2 disposed in the second emission area EA2, and a third light emitting element ED3 disposed in the third emission area EA3. The light emitting elements ED1, ED2, and ED3 may include the pixel electrodes AE1, AE2, and AE3, the light emitting layers ELL EL2, and EL3, and the common electrodes CE1, CE2, and CE3, respectively, and the light emitting layers ELL EL2, and EL3 disposed in the different emission areas EA1, EA2, and EA3 may emit lights of different colors depending on the materials of the light emitting layers ELL EL2, and EL3. In an embodiment, for example, the first light emitting element ED1 disposed in the first emission area EA1 may emit red light or light of a first color, the second light emitting element ED2 disposed in the second emission area EA2 may emit green light or light of a second color, and the third light emitting element ED3 disposed in the third emission area EA3 may emit blue light or light of a third color.

The pixel electrodes AE1, AE2, and AE3 may be disposed in the plurality of emission areas EA1, EA2, and EA3, respectively. The pixel electrodes AE1, AE2, and AE3 may include a first pixel electrode AE1 disposed in the first emission area EA1, a second pixel electrode AE2 disposed in the second emission area EA2, and a third pixel electrode AE3 disposed in the third emission area EA3. The first pixel electrode AE1 and the second pixel electrode AE2 may be disposed on the second via layer VIA2 of the main display area MDA, and the third pixel electrode AE3 may be disposed on the first via layer VIA1 of the first sub-display area SDA1. The pixel electrodes AE1, AE2, and AE3 may be disposed in the different emission areas EA1, EA2, and EA3 to constitute the light emitting elements ED1, ED2, and ED3 emitting lights of different colors, respectively.

Each of the pixel electrodes AE1, AE2, and AE3 may be disposed to overlap a corresponding one of the openings OPE1, OPE2, and OPE3 of the bank structure BNS. The first pixel electrode AE1 and the second pixel electrode AE2 may be electrically connected to the drain electrode DE of the thin film transistor TFT through the first and second connection electrodes CNE1 and CNE2. The third pixel electrode AE3 may be electrically connected to the drain electrode DE of the thin film transistor TFT through a connection line.

In an embodiment, the pixel electrodes AE1, AE2, and AE3 may have a stacked structure formed by stacking a material layer having a high work function, such as indium tin oxide (ITO), indium zinc oxide (IZO), zinc oxide (ZnO) and indium oxide ($In_2O_3$), and a reflective material layer such as silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca), or a mixture thereof. The layer having a high work function may be disposed above the reflective material layer and disposed closer to the light emitting layers ELL EL2, and EL3. In an embodiment, for example, the pixel electrodes AE1, AE2, and AE3 may have a multilayer structure of ITO/Mg, ITO/MgF, ITO/Ag, and ITO/Ag/ITO, but are not limited thereto.

In an embodiment, as shown in FIGS. 6 and 7, the inorganic insulating layer ISL may be disposed on the second via layer VIA2, the first pixel electrode AE1, and the second pixel electrode AE2 in the main display area MDA, and may be disposed on the first via layer VIA1 and the third pixel electrode AE3 in the first sub-display area SDA1. The inorganic insulating layer ISL may be entirely disposed on the first via layer VIA1 in the main display area MDA, but may expose portions of the upper surfaces of the first pixel electrode AE1 and the second pixel electrode AE2 while partially overlapping the first pixel electrode AE1 and the second pixel electrode AE2. In addition, the inorganic insulating layer ISL may be entirely disposed on the first via layer VIA1 in the first sub-display area SDA1, but may expose a portion of the upper surface the third pixel electrode AE3 while partially overlapping the third pixel electrode AE3.

In an embodiment, for example, the inorganic insulating layer ISL may expose the pixel electrodes AE1, AE2, and AE3 at the portions overlapping the openings OPE1, OPE2, and OPE3 of the bank structure BNS, and the light emitting layers EL1, EL2, and EL3 disposed on the pixel electrodes AE1, AE2, and AE3 may be directly disposed on the pixel electrodes AE1, AE2, and AE3, respectively. The inorganic insulating layer ISL may include an inorganic insulating material. In an embodiment, for example, the inorganic insulating layer ISL may include aluminum oxide, titanium oxide, tantalum oxide, hafnium oxide, zinc oxide, silicon oxide, silicon nitride, and/or silicon oxynitride.

In accordance with an embodiment, the inorganic insulating layer ISL may be disposed on the pixel electrodes AE1, AE2, and AE3, and may be spaced apart from the upper surfaces of the pixel electrodes AE1, AE2, and AE3. The inorganic insulating layer ISL may partially overlap the pixel electrodes AE1, AE2, and AE3 without direct contact, and the light emitting layers EL1, EL2, and EL3 of the light emitting elements ED1, ED2, and ED3 may be disposed between the inorganic insulating layer ISL and the pixel electrodes AE1, AE2, and AE3. In the manufacturing process of the display device 10, a sacrificial layer may be disposed on the pixel electrodes AE1, AE2, and AE3 before the inorganic insulating layer ISL is formed. The inorganic insulating layer ISL may be disposed to cover a portion of the sacrificial layer, and may be spaced apart from the upper surfaces of the pixel electrodes AE1, AE2, and AE3 by the removal of the sacrificial layer. Then, in the deposition process of the light emitting layers EL1, EL2, and EL3, the materials forming the light emitting layers EL1, EL2, and EL3 may fill the space between the inorganic insulating layer ISL and the pixel electrodes AE1, AE2, and AE3, and the inorganic insulating layer ISL may be partially disposed on the light emitting layers EL1, EL2, and EL3. In an embodiment, the inorganic insulating layer ISL may be in direct contact with the side surfaces of the pixel electrodes AE1, AE2, and AE3.

The display device 10 may include the plurality of bank structures BNS disposed on the thin film transistor layer TFTL or the substrate SUB and provided with the plurality of openings OPE1, OPE2, and OPE3. The bank structure BNS may have a structure in which bank layers BN1, BN2, and BN3 including different materials from each other are sequentially stacked, and may be provided with the plurality of openings OPE1, OPE2, and OPE3 respectively defining the emission areas EA1, EA2, and EA3. The light emitting elements ED1, ED2, and ED3 of the display device 10 may be disposed to overlap the openings OPE1, OPE2, and OPE3 of the bank structure BNS.

In an embodiment, as shown in FIGS. 6 and 7, the bank structure BNS may include the first bank layer BN1, the second bank layer BN2, and the third bank layer BN3 sequentially disposed on the inorganic insulating layer ISL.

The first bank layer BN1 may be the lowermost layer of the bank structure BNS, the third bank layer BN3 may be the uppermost layer of the bank structure BNS, and the second bank layer BN2 may be the intermediate layer of the bank structure BNS. In the bank structure BNS, the second bank layer BN2 may include a tip TIP protruding further than the first bank layer BN1 toward a center of the openings OPE1, OPE2, and OPE3.

In the bank structure BNS, the side edge of the first bank layer BN1 may have a shape recessed inward from the side edge of the second bank layer BN2. In the bank structure BNS, the first bank layer BN1 may have a same thickness as the thickness of the second bank layer BN2. However, the present disclosure is not limited thereto, and the first bank layer BN1 may have a thicker thickness than the second bank layer BN2. Since the second bank layer BN2 has a shape protruding toward the openings OPE1, OPE2, and OPE3 more than the first bank layer BN1, an undercut may be formed under the tip TIP of the second bank layer BN2 on the inner sidewalls of the openings OPE1, OPE2, and OPE3 of the bank structure BNS.

The sidewall shape of the bank structure BNS may be a structure formed by a difference in etching rates in an etching process due to different materials of the first bank layer BN1 and the second bank layer BN2. In accordance with an embodiment, the second bank layer BN2 may include a material having an etching rate lower than that of the first bank layer BN1, and the first bank layer BN1 may be further etched in the process of forming the openings OPE1, OPE2, and OPE3 of the bank structure BNS to form the undercut under the tip TIP of the second bank layer BN2. In an embodiment, the first bank layer BN1 may include a metal material having high electrical conductivity, and the second bank layer BN2 may include a metal material having low reflectivity. In an embodiment, for example, the first bank layer BN1 may include aluminum (Al), and the second bank layer BN2 may include titanium (Ti). The bank structure BNS may have a structure in which Al/Ti layers are stacked on the inorganic insulating layer ISL, and the tip TIP may be formed in the Ti layer of the second bank layer BN2.

The third bank layer BN3 may include an organic material. The third bank layer BN3 may serve as a mask pattern in a process of forming the openings OPE1, OPE2, and OPE3 of the bank structure BNS. In an embodiment, after the process of forming the openings OPE1, OPE2, and OPE3 of the bank structure BNS, the third bank layer BN3 is not removed, so that the third bank layer BN3 may be disposed on the second bank layer BN2. The third bank layer BN3 may have a same size as the second bank layer BN2. The width of the third bank layer BN3 in the first direction (X-axis direction) may be the same as the width of the second bank layer BN2.

In the bank structure BNS, the first bank layer BN1 may be electrically connected to the common electrodes CE1, CE2, and CE3 of the different light emitting elements ED1, ED2, and ED3. In the light emitting elements ED1, ED2, and ED3 disposed in the different emission areas EA1, EA2, and EA3, the common electrodes CE1, CE2, and CE3 are not directly connected, but may be electrically connected to each other through the first bank layer BN1.

In a manufacturing process of the display device 10, a mask process may be used to form the pixel defining layer forming the emission areas EA1, EA2, and EA3 using an organic material, or to form the light emitting layers ELL EL2, and EL3 of the light emitting elements ED1, ED2 and ED3 in the respective emission areas EA1, EA2, and EA3. In order to perform the mask process, the display device 10 may be desired to have a structure for mounting a mask, or an unnecessarily large area of the non-display area NDA may be used to control variation according to the mask process. If such a mask process is minimized, an unnecessary component, e.g., the structure for mounting a mask, may be omitted in the display device 10, and the area of the non-display area NDA for controlling variation may be minimized.

The display device 10 according to an embodiment includes the bank structure BNS defining the emission areas EA1, EA2, and EA3, and the bank structure BNS defining the emission areas EA1, EA2, and EA3 may be formed by a deposition and etching process instead of the mask process. In an embodiment, the bank structure BNS includes the first bank layer BN1 and the second bank layer BN2 including different metal materials from each other and have a structure including the tip TIP on the inner sidewalls of the openings OPE1, OPE2, and OPE3, so that it is possible to separately form different layers in the different emission areas EA1, EA2, and EA3 even by a deposition process. In an embodiment, for example, even when the light emitting layers ELL EL2, and EL3 of the light emitting elements ED1, ED2, and ED3 and the common electrodes CE1, CE2, and CE3 are formed by a deposition process using no mask, the deposited materials may be disconnected without being connected between the openings OPE1, OPE2, and OPE3 by the tip TIP of the second bank layer BN2 formed on the inner sidewalls of the openings OPE1, OPE2, and OPE3. By a process of forming a material for forming a specific layer on the entire surface of the display device 10 and then removing the layer formed in an undesired region by etching, it is possible to individually form different layers in the different emission areas EA1, EA2, and EA3. In an embodiment of the display device 10, the different light emitting elements ED1, ED2, and ED3 may be formed in the different emission areas EA1, EA2, and EA3 by the deposition and etching process without using a mask process, and components in the display device 10 to be provided for the mask process may be omitted to minimize the area of the non-display area NDA.

The light emitting layers ELL EL2, and EL3 may be disposed on the pixel electrodes AE1, AE2, and AE3, respectively. The light emitting layers ELL EL2, and EL3 may be organic light emitting layers including or made of an organic material, and may be formed on the pixel electrodes AE1, AE2, and AE3, respectively, by the deposition process. In the light emitting layers ELL EL2, and EL3, when the thin film transistor TFT applies a predetermined voltage to the pixel electrodes AE1, AE2, and AE3 of the light emitting elements ED1, ED2, and ED3, and the common electrodes CE1, CE2, and CE3 of the light emitting elements ED1, ED2, and ED3 receive a common voltage or a cathode voltage, holes and electrons may move to the light emitting layers ELL EL2, and EL3 through a hole transporting layer and an electron transporting layer, respectively, and the holes and the electrons may be combined with each other in the light emitting layers ELL EL2, and EL3 to emit light.

The light emitting layers ELL EL2, and EL3 may include the first light emitting layer ELL the second light emitting layer EL2, and the third light emitting layer EL3 disposed in the different emission areas EA1, EA2, and EA3. The first light emitting layer EL1 may be disposed on the first pixel electrode AE1 in the first emission area EA1, the second light emitting layer EL2 may be disposed on the second pixel electrode AE2 in the second emission area EA2, and the third light emitting layer EL3 may be disposed on the third pixel electrode AE3 in the third emission area EA3.

The first to third light emitting layers ELL EL2, and EL3 may be the light emitting layers of the first to third light emitting elements ED1, ED2 and ED3, respectively. The first light emitting layer EL1 may be the light emitting layer emitting red light or light of the first color, the second light emitting layer EL2 may be the light emitting layer emitting green light or light of the second color, and the third light emitting layer EL3 may be the light emitting layer emitting blue light or light of the third color.

In accordance with an embodiment, the light emitting layers ELL EL2, and EL3 of the light emitting elements ED1, ED2, and ED3 may be partially disposed between the pixel electrodes AE1, AE2, and AE3 and the inorganic insulating layer ISL. The inorganic insulating layer ISL may be disposed on the pixel electrodes AE1, AE2, and AE3, but may be spaced apart from the upper surfaces of the pixel electrodes AE1, AE2, and AE3. The deposition process of the light emitting layers ELL EL2, and EL3 may be performed in a way such that the material of the light emitting layer is deposited in an inclined direction rather than in a direction perpendicular to the upper surface of the substrate SUB. Accordingly, the light emitting layers ELL EL2, and EL3 may be respectively disposed on the upper surfaces of the pixel electrodes AE1, AE2, and AE3 exposed through the openings OPE1, OPE2, and OPE3 of the bank structure BNS to fill the space between the pixel electrodes AE1, AE2, and AE3 and the inorganic insulating layer ISL.

The common electrodes CE1, CE2, and CE3 may be disposed on the light emitting layers ELL EL2, and EL3, respectively. The common electrodes CE1, CE2, and CE3 may include a transparent conductive material, so that the light generated in the light emitting layers ELL EL2, and EL3 may be emitted. The common electrodes CE1, CE2, and CE3 may receive a common voltage or a low potential voltage. When the pixel electrodes AE1, AE2, and AE3 receive the voltage corresponding to a data voltage and the common electrodes CE1, CE2, and CE3 receive the low potential voltage, a potential difference is formed between the pixel electrodes AE1, AE2, and AE3 and the common electrodes CE1, CE2, and CE3, so that the light emitting layers ELL ED2, and ED3 may emit light.

In an embodiment, the common electrodes CE1, CE2, and CE3 may include a material layer having a low work function, such as Li, Ca, LiF/Ca, LiF/Al, Al, Mg, Ag, Pt, Pd, Ni, Au Nd, Ir, Cr, BaF, Ba or a compound or mixture thereof (e.g., a mixture of Ag and Mg). The common electrodes CE1, CE2, and CE3 may further include a transparent metal oxide layer disposed on the material layer having a low work function.

The common electrodes CE1, CE2, and CE3 may include the first common electrode CE1, the second common electrode CE2, and the third common electrode CE3 disposed in the different emission areas EA1, EA2, and EA3. The first common electrode CE1 may be disposed on the first light emitting layer EL1 in the first emission area EA1, the second common electrode CE2 may be disposed on the second light emitting layer EL2 in the second emission area EA2, and the third common electrode CE3 may be disposed on the third light emitting layer EL3 in the third emission area EA3.

In accordance with an embodiment, the common electrodes CE1, CE2, and CE3 of the light emitting elements ED1, ED2, and ED3 may be partially disposed on the side surface of the first bank layer BN1 of the bank structure BNS. Similarly to the light emitting layers ELL EL2, and EL3, the common electrodes CE1, CE2, and CE3 may also be formed by a deposition process. The deposition process of the common electrodes CE1, CE2, and CE3 may be performed in a way such that the electrode material is deposited in an inclined direction rather than a direction perpendicular to the upper surface of the substrate SUB. Accordingly, the common electrodes CE1, CE2, and CE3 may be disposed on the side surface of the first bank layer BN1 under the tip TIP of the second bank layer BN2 of the bank structure BNS. The common electrodes CE1, CE2, and CE3 may be in direct contact with the side surface of the first bank layer BN1. The common electrodes CE1, CE2, and CE3 of the different light emitting elements ED1, ED2, and ED3 may be in direct contact with the first bank layer BN1 of the bank structure BNS, and the common electrodes CE1, CE2, and CE3 may be electrically connected to each other via the first bank layer BN1. Unlike the pixel electrodes AE1, AE2, and AE3, the common electrodes CE1, CE2, and CE3 may be implemented in the form of an electrode that is electrically common to all pixels without being divided for a plurality of pixels.

In a manufacturing process of the display device 10, the light emitting layers ELL EL2, and EL3 of the light emitting elements ED1, ED2, and ED3 and the common electrodes CE1, CE2, and CE3 may be formed through a deposition process. As the bank structure BNS includes the tip TIP formed on the second bank layer BN2, although the deposition process is performed over the entire surface of the display area DA of the display device 10 without using a mask, it is possible to form a layer in which the material is disconnected between the different openings OPE1, OPE2, and OPE3 of the bank structure BNS. Patterns including a same material as the light emitting layers ELL EL2, and EL3 and the common electrodes CE1, CE2, and CE3 may remain on the bank structure BNS.

According to an embodiment, the display device 10 may include first to third organic patterns ELP1, ELP2, and ELP3 and first to third electrode patterns CEP1, CEP2, and CEP3 disposed on the bank structure BNS.

Each of a plurality of organic patterns ELP1, ELP2, and ELP3 may be disposed on the third bank layer BN3. The organic patterns ELP1, ELP2, and ELP3 may respectively include a first organic pattern ELP1, a second organic pattern ELP2, and a third organic pattern ELP3 including a same material as the light emitting layers ELL EL2, and EL3 of the light emitting elements ED1, ED2, and ED3.

The first organic pattern ELP1 may include a same material as that of the first light emitting layer EL1 of the first light emitting element ED1. The second organic pattern ELP2 may include a same material as that of the second light emitting layer EL2 of the second light emitting element ED2, and the third organic pattern ELP3 may include the same material as that of the third light emitting layer EL3 of the third light emitting element ED3. The organic patterns ELP1, ELP2, and ELP3 may be formed in a same process as the process of forming the light emitting layers ELL EL2, and EL3 including the same material as those of the organic patterns ELP1, ELP2, and ELP3. The organic patterns ELP1, ELP2, and ELP3 may be disposed adjacent to the emission areas EA1, EA2, and EA3, respectively in which the respective light emitting layers ELL EL2, and EL3 are disposed. In an embodiment, for example, the first organic pattern ELP1 may be disposed on the third bank layer BN3 while surrounding the first opening OPE1 near the first opening OPE1 or the first emission area EA1. The second organic pattern ELP2 may be disposed on the third bank layer BN3 while surrounding the second opening OPE2 near the second opening OPE2 or the second emission area EA2, and the third organic pattern ELP3 may be disposed on the third bank layer BN3 while surrounding the third opening OPE3 near the third opening OPE3 or the third emission area EA3.

The organic patterns ELP1, ELP2, and ELP3 may be traces formed by being disconnected from the light emitting layers ELL EL2, and EL3 due to the tip TIP of the bank structure BNS. The light emitting layers ELL EL2, and EL3 may be formed in the openings OPE1, OPE2, and OPE3, and the organic patterns ELP1, ELP2, and ELP3 and the light emitting layers ELL EL2, and EL3 may be disconnected from each other by the tip TIP of the bank structure BNS. Since the light emitting layers ELL EL2, and EL3 are formed by the deposition process using no mask, the materials of the light emitting layers ELL EL2, and EL3 may be formed on the entire bank structure BNS. The organic patterns ELP1, ELP2, and ELP3 may be formed by patterning the materials of the light emitting layers ELL EL2, and EL3 formed on the entire bank structure BNS near the emission areas EA1, EA2, and EA3 or the openings OPE1, OPE2, and OPE3.

The plurality of electrode patterns CEP1, CEP2, and CEP3 may be disposed on the plurality of organic patterns ELP1, ELP2, and ELP3, respectively. The electrode patterns CEP1, CPE2, and CEP3 may respectively include a first electrode pattern CEP1, a second electrode pattern CEP2, and a third electrode pattern CEP3 including the same material as the common electrodes CE1, CE2, and CE3 of the light emitting elements ED1, ED2, and ED3.

In an embodiment, for example, the first electrode pattern CEP1, the second electrode pattern CEP2, and the third electrode pattern CEP3 may be directly disposed on the first organic pattern ELP1, the second organic pattern ELP2, and the third organic pattern ELP3, respectively. The arrangement relationship of the electrode patterns CEP1, CPE2, and CEP3 and the organic patterns ELP1, ELP2, and ELP3 may be the same as the arrangement relationship of the light emitting layers EL1, EL2, and EL3 of the light emitting elements ED1, ED2, and ED3 and the common electrodes CE1, CE2, and CE3. The electrode patterns CEP1, CPE2, and CEP3 may be traces formed by being disconnected from the common electrodes CE1, CE2, and CE3 due to the tip TIP of the bank structure BNS. In the display device 10, the common electrodes CE1, CE2, and CE3 may be individually formed in different areas even in a deposition process using no mask due to the tip TIP of the bank structure BNS.

The plurality of organic patterns ELP1, ELP2, and ELP3, and the electrode patterns CEP1, CPE2, and CEP3 may be disposed on the bank structure BNS, and may be disposed to surround the peripheries of the emission areas EA1, EA2, and EA3 or the openings OPE1, OPE2, and OPE3, respectively. The stacked structure of the plurality of organic patterns ELP1, ELP2, and ELP3, and the electrode patterns CEP1, CPE2, and CEP3 disposed around the emission areas EA1, EA2, and EA3 may be partially etched in the manufacturing process of the display device 10, so that the pattern shape may be changed. Accordingly, a portion of the upper surface of the third bank layer BN3 of the bank structure BNS may not be covered by the plurality of organic patterns ELP1, ELP2, and ELP3, and the electrode patterns CEP1, CPE2, and CEP3.

The thin film encapsulation layer TFEL may be disposed on the light emitting elements ED1, ED2, and ED3 and the bank structure BNS, and may cover the plurality of light emitting elements ED1, ED2, and ED3 and the bank structure BNS. The thin film encapsulation layer TFEL may include at least one inorganic layer to prevent oxygen or moisture from permeating into the light emitting element layer EML. The thin film encapsulation layer TFEL may include at least one organic layer to protect the light emitting element layer EML from foreign substances such as dust.

In an embodiment, the thin film encapsulation layer TFEL may include a first encapsulation layer TFE1, a second encapsulation layer TFE2, and a third encapsulation layer TFE3 that are sequentially stacked. The first encapsulation layer TFE1 and the third encapsulation layer TFE3 may be inorganic encapsulation layers, and the second encapsulation layer TFE2 disposed between the first encapsulation layer TFE1 and the third encapsulation layer TFE3 may be an organic encapsulation layer.

Each of the first encapsulation layer TFE1 and the third encapsulation layer TFE3 may include an inorganic insulating material. The inorganic insulating material may include aluminum oxide, titanium oxide, tantalum oxide, hafnium oxide, zinc oxide, silicon oxide, silicon nitride, and/or silicon oxynitride.

The second encapsulation layer TFE2 may include a polymer-based material. Examples of the polymer-based material may include acrylic resin, epoxy resin, polyimide, polyethylene and the like. In an embodiment, for example, the second encapsulation layer TFE2 may include an acrylic resin, such as polymethyl methacrylate, polyacrylic acid, or the like. The second encapsulation layer TFE2 may be formed by coating a monomer or a polymer.

The first encapsulation layer TFE1 may be disposed on the light emitting elements ED1, ED2, and ED3, the plurality of patterns, and the bank structure BNS. The first encapsulation layer TFE1 may include an inorganic insulating material to cover the light emitting elements ED1, ED2, and ED3. The first encapsulation layer TFE1 may prevent the light emitting elements ED1, ED2, and ED3 from being damaged by external air and prevent the patterns disposed on the bank structure BNS from being peeled off during the manufacturing process of the display device 10.

The first encapsulation layer TFE1 may be disposed to cover the organic patterns ELP1, ELP2, and ELP3 and the electrode patterns CEP1, CPE2, and CEP3. In an embodiment, the first encapsulation layer TFE1 may be formed by a chemical vapor deposition (CVD) method, such that the first encapsulation layer TFE1 may be formed to have a uniform thickness along the stepped portions of the deposited layers. In an embodiment, for example, the first encapsulation layer TFE1 may form a thin film even under the undercut by the tip TIP of the bank structure BNS.

The first encapsulation layer TFE1 may be disposed on the first light emitting element ED1 and the first electrode pattern CEP1. The first encapsulation layer TFE1 may be disposed to cover the first light emitting element ED1 and the first opening OPE1 along the inner sidewalls thereof, and may also be disposed to cover the first organic pattern ELP1 and the first electrode pattern CEP1. Further, the first encapsulation layer TFE1 may be disposed on the second light emitting element ED2 and the second electrode pattern CEP2. The first encapsulation layer TFE1 may be disposed to cover the second light emitting element ED2 and the second opening OPE2 along the inner sidewalls thereof, and may also be disposed to cover the second organic pattern ELP2 and the second electrode pattern CEP2. Further, the first encapsulation layer TFE1 may be disposed on the third light emitting element ED3 and the third electrode pattern CEP3. The first encapsulation layer TFE1 may be disposed to cover the third light emitting element ED3 and the third opening OPE3 along the inner sidewalls thereof, and may also be disposed to cover the third organic pattern ELP3 and the third electrode pattern CEP3. The first encapsulation layer TFE1 may overlap the first to third openings OPE1, OPE2, and OPE3, and may not overlap the transmission area TA.

The second encapsulation layer TFE2 may be disposed on the first encapsulation layer TFE1. The second encapsulation layer TFE2 may be disposed to overlap each of the emission areas EA1, EA2, and EA3. In an embodiment, the second encapsulation layer TFE2 may include a first organic layer TFE21, a second organic layer TFE22, and a third organic layer TFE23.

In such an embodiment where the first organic layer TFE21, the second organic layer TFE22, and the third organic layer TFE23 may be formed by a solution process such as inkjet printing or spin coating, the layers may be formed to have a same height as each other. In an embodiment, for example, the first organic layer TFE21, the second organic layer TFE22, and the third organic layer TFE23 may be formed to fill the first to third openings OPE1, OPE2, and OPE3 in the bank structure BNS. In addition, the first organic layer TFE21, the second organic layer TFE22, and the third organic layer TFE23 may be disposed on the bank structure BNS and may be formed to protrude higher than the bank structure BNS.

The first organic layer TFE21 may be disposed on the first light emitting element ED1 and the first electrode pattern CEP1. The first organic layer TFE21 may be disposed to overlap the first emission area EA1 and fill the first opening OPE1. In an embodiment, the first organic layer TFE21 may not overlap the second opening OPE2 and the third opening OPE3, and may be disposed only on the first opening OPE1 and the bank structure BNS in the periphery thereof. The second organic layer TFE22 may be disposed on the second light emitting element ED2 and the second electrode pattern CEP2. The second organic layer TFE22 may be disposed to overlap the second emission area EA2 and fill the second opening OPE2. In an embodiment, the second organic layer TFE22 may not overlap the first opening OPE1 and the third opening OPE3, and may be disposed only on the second opening OPE2 and the bank structure BNS in the periphery thereof. The third organic layer TFE23 may be disposed on the third light emitting element ED3 and the third electrode pattern CEP3. The third organic layer TFE23 may be disposed to overlap the third emission area EA3 and fill the third opening OPE3. In an embodiment, the third organic layer TFE23 may not overlap the first opening OPE1 and the second opening OPE2, and may be disposed only on the third opening OPE3 and the bank structure BNS in the periphery thereof.

The third encapsulation layer TFE3 may be disposed on the second encapsulation layer TFE2 and the first encapsulation layer TFE1. The third encapsulation layer TFE3 may be entirely disposed on the display area DA. The third encapsulation layer TFE3 may be in direct contact with the upper surface of the first encapsulation layer TFE1 exposed by the second encapsulation layer TFE2.

According to an embodiment, in the thin film encapsulation layer TFEL, the second encapsulation layers TFE2 may be disposed to be separated from each other to correspond to each of the emission areas EA1, EA2, and EA3, and the first encapsulation layer TFE1 and the third encapsulation layer TFE3 may be in contact with each other around the emission areas EA1, EA2, and EA3. Accordingly, since the encapsulation layer TFEL may independently encapsulate each of the emission areas EA1, EA2, and EA3, the encapsulation characteristics of each of the light emitting elements ED1, ED2, and ED3 may be improved.

In such an embodiment, the encapsulation layer TFEL may be disposed on the main display area MDA and the first sub-display area SDA1, but may not be disposed on the transmission area TA. In an embodiment, for example, the encapsulation layer TFEL may be disposed to overlap the main display area MDA and the first sub-display area SDA1 without overlapping the transmission area TA. Each of the light emitting elements ED1, ED2, and ED3 may be completely encapsulated by the pixel electrodes AE1, AE2, and AE3, the inorganic insulating layer ISL, the first bank layer BN1 and the second bank layer BN2 of the bank structure BNS, and the encapsulation layer TFEL. Accordingly, although the encapsulation layer TFEL is not disposed in the transmission area TA, each of the light emitting elements ED1, ED2, and ED3 of the emission areas EA1, EA2, and EA3 is encapsulated by the inorganic layers, so that permeation of external moisture and oxygen may be effectively prevented.

The second planarization layer PNL2 may be disposed on the encapsulation layer TFEL. The second planarization layer PNL2 may flatten the upper surface of the display device 10 to facilitate adhesion or formation of a structure disposed thereon. The second planarization layer PNL2 may be entirely disposed on the display area DA. In an embodiment, for example, the second planarization layer PNL2 may be disposed on the main display area MDA and the first sub-display area SDA1.

The second planarization layer PNL2 may be disposed on the transmission area TA of the first sub-display area SDA1. In an embodiment, for example, the second planarization layer PNL2 may fill the first through hole PH1 of the transmission area TA. The second planarization layer PNL2 may be in direct contact with the layers exposed on the inner circumferential surface of the first through hole PH1 in the first through hole PH1. In an embodiment, for example, the second planarization layer PNL2 may be in direct contact with portions of the thin film transistor layer TFTL, the bank structure BNS, and the substrate SUB. A portion of the substrate SUB may be the first barrier layer BA1, the second substrate SUB2, and the second barrier layer BA2.

In such an embodiment, the second planarization layer PNL2 may be in direct contact with the first planarization layer PNL1 disposed thereunder. In an embodiment, for example, the lower surface of the second planarization layer PNL2 may be in direct contact with the upper surface of the first planarization layer PNL1 in the transmission area TA. An interface between the second planarization layer PNL2 and the first planarization layer PNL1 may be aligned with the upper surface of the first substrate SUB1.

As described above, the display device 10 according to an embodiment may improve the transmittance of light incident to the optical devices 740, 750, 760, and 770 (see FIG. 2) by forming the transmission area TA in the sub-display areas SDA1, SDA2, SDA3, and SDA4 overlapping the optical devices 740, 750, 760, and 770 (see FIG. 2).

In such an embodiment, each of the light emitting elements ED1, ED2, and ED3 of the emission areas EA1, EA2, and EA3 may be independently encapsulated through inorganic layers, so that the light emitting elements ED1, ED2, and ED3 may be prevented from being deteriorated due to permeation of moisture or oxygen.

Hereinafter, a manufacturing process of the display device 10 according to an embodiment will be described with reference to other drawings.

FIGS. 8 to 22 are cross-sectional views sequentially illustrating a manufacturing process of a display device according to an embodiment. FIGS. 8 to 22 illustrate a manufacturing process of the display device 10 shown in FIG. 6 as an example.

Figure 8:
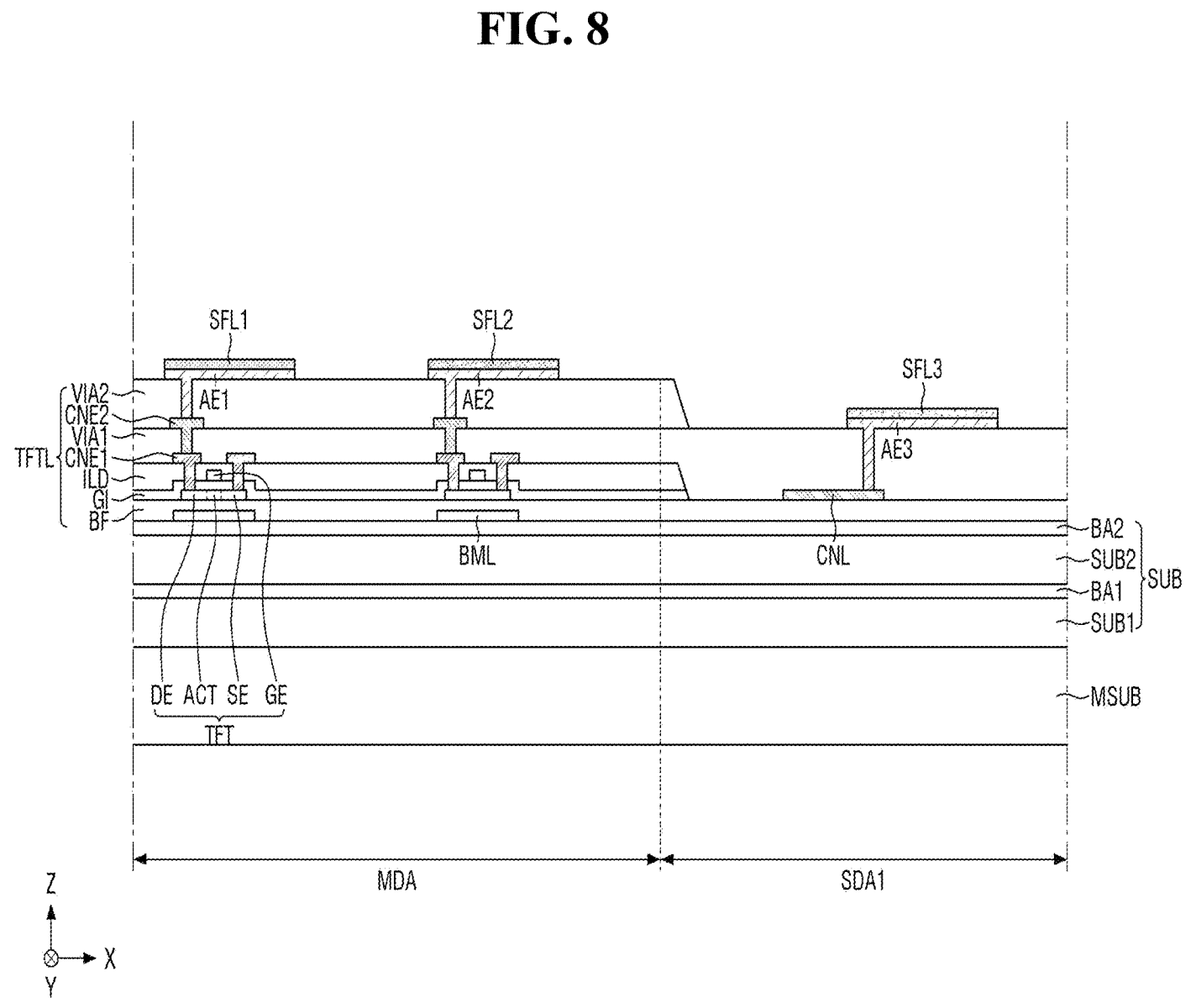

Referring to FIG. 8, the substrate SUB is provided, e.g., formed or disposed, on a mother substrate MSUB. The mother substrate MSUB may be a glass substrate, and may support layers stacked thereon in a process to be described later. The substrate SUB may be formed by sequentially applying and stacking the first substrate SUB1, the first barrier layer BA1, the second substrate SUB2, and the second barrier layer BA2 on the mother substrate MSUB. In an embodiment, for example, the first substrate SUB1 and the second substrate SUB2 may be formed by applying polyimide, and the first barrier layer BA1 and the second barrier layer BA2 may be formed by depositing an inorganic material.

Next, the thin film transistor layer TFTL is formed on the second barrier layer BA2. The thin film transistor layer TFTL may include the light blocking layer BML, the buffer layer BF, the thin film transistor TFT, the gate insulating layer GI, the interlayer insulating layer ILD, the first connection electrode CNE1, the connection line CNL, the first via layer VIA1, the second connection electrode CNE2, and the second via layer VIA2.

The light blocking layer BML may be formed by depositing a metal material on the second barrier layer BA2 and patterning the deposited metal material by a photolithography process. The buffer layer BF may be formed to cover the light blocking layer BML by depositing an inorganic material on the second barrier layer BA2.

The thin film transistor TFT, the gate insulating layer GI, and the interlayer insulating layer ILD are formed on the buffer layer BF. In an embodiment, the semiconductor layer ACT is formed on the buffer layer BF, and the gate insulating layer GI is formed on the semiconductor layer ACT. The gate electrode GE is formed on the gate insulating layer GI, and the source electrode SE and the drain electrode DE are formed by making a portion of the semiconductor layer ACT conductive using the gate electrode GE as a mask. Then, the thin film transistor TFT is formed by forming the interlayer insulating layer ILD on the gate electrode GE and then, contact holes are formed through the gate insulating layer GI and the interlayer insulating layer ILD. The thin film transistor TFT may be formed in the main display area MDA.

Next, the connection line CNL is formed on the buffer layer BF and the first connection electrode CNE1 is formed on the interlayer insulating layer ILD. The first connection electrode CNE1 may be connected to the source electrode SE and the drain electrode DE through the contact holes formed through the gate insulating layer GI and the interlayer insulating layer ILD. Further, the first connection electrode CNE1 may be connected to the connection line CNL. The connection line CNL may be formed to extend from the main display area MDA to the first sub-display area SDA1.

Next, the first via layer VIA1 is formed on the first connection electrode CNE1 by a solution process such as spin coating, and contact holes that expose the first connection electrode CNE1 and the connection line CNL are formed through the first via layer VIAL Then, the second connection electrode CNE2 is formed on the first via layer VIAL The second connection electrode CNE2 may be connected to the first connection electrode CNE1 through the contact hole formed through the first via layer VIA1. Next, the second via layer VIA2 is formed on the second connection electrode CNE2. The second via layer VIA2 is disposed in the main display area MDA, and partially extends to the first sub-display area SDA1, but is substantially not formed in the first sub-display area SDA1.

Next, a plurality of pixel electrodes AE1, AE2, and AE3 are formed on the second via layer VIA2 of the main display area MDA and the first via layer VIA1 of the first sub-display area SDA1. In an embodiment, for example, the first pixel electrode AE1 and the second pixel electrode AE2 are formed on the second via layer VIA2 of the main display area MDA, and the third pixel electrode AE3 is formed on the first via layer VIA1 of the first sub-display area SDA1. The first pixel electrode AE1 and the second pixel electrode AE2 are connected to the second connection electrode CNE2 through the contact holes formed through the second via layer VIA2, and the third pixel electrode AE3 is connected to the connection line CNL through the contact hole formed through the first via layer VIA1.

Next, sacrificial layers SFL1, SFL2, and SFL3 are formed on the pixel electrodes AE1, AE2, and AE3. In the sacrificial layers SFL1, SFL2, and SFL3, the first sacrificial layer SFL1 may be formed on the first pixel electrode AE1, the second sacrificial layer SFL2 may be formed on the second pixel electrode AE2, and the third sacrificial layer SFL3 may be formed on the third pixel electrode AE3. The sacrificial layers SFL1, SFL2, and SFL3 may be disposed on the pixel electrodes AE1, AE2, and AE3, and may be partially removed in a subsequent process to form spaces where the light emitting layers EL1, EL2, and EL3 are disposed. The sacrificial layers SFL1, SFL2, and SFL3 may prevent the contact between the upper surfaces of the pixel electrodes AE1, AE2, and AE3 and the inorganic insulating layer ISL to be described later, and spaces may be formed between the pixel electrodes AE1, AE2, and AE3 and the inorganic insulating layer ISL by the removal of the sacrificial layers SFL1, SFL2, and SFL3. In an embodiment, the sacrificial layers SFL1, SFL2, and SFL3 may include an oxide semiconductor. In an embodiment, for example, the sacrificial layers SFL1, SFL2, and SFL3 may include at least one selected from indium-gallium-zinc oxide (IGZO), zinc-tin oxide (ZTO), and indium-tin oxide (ITO).

Figure 9:
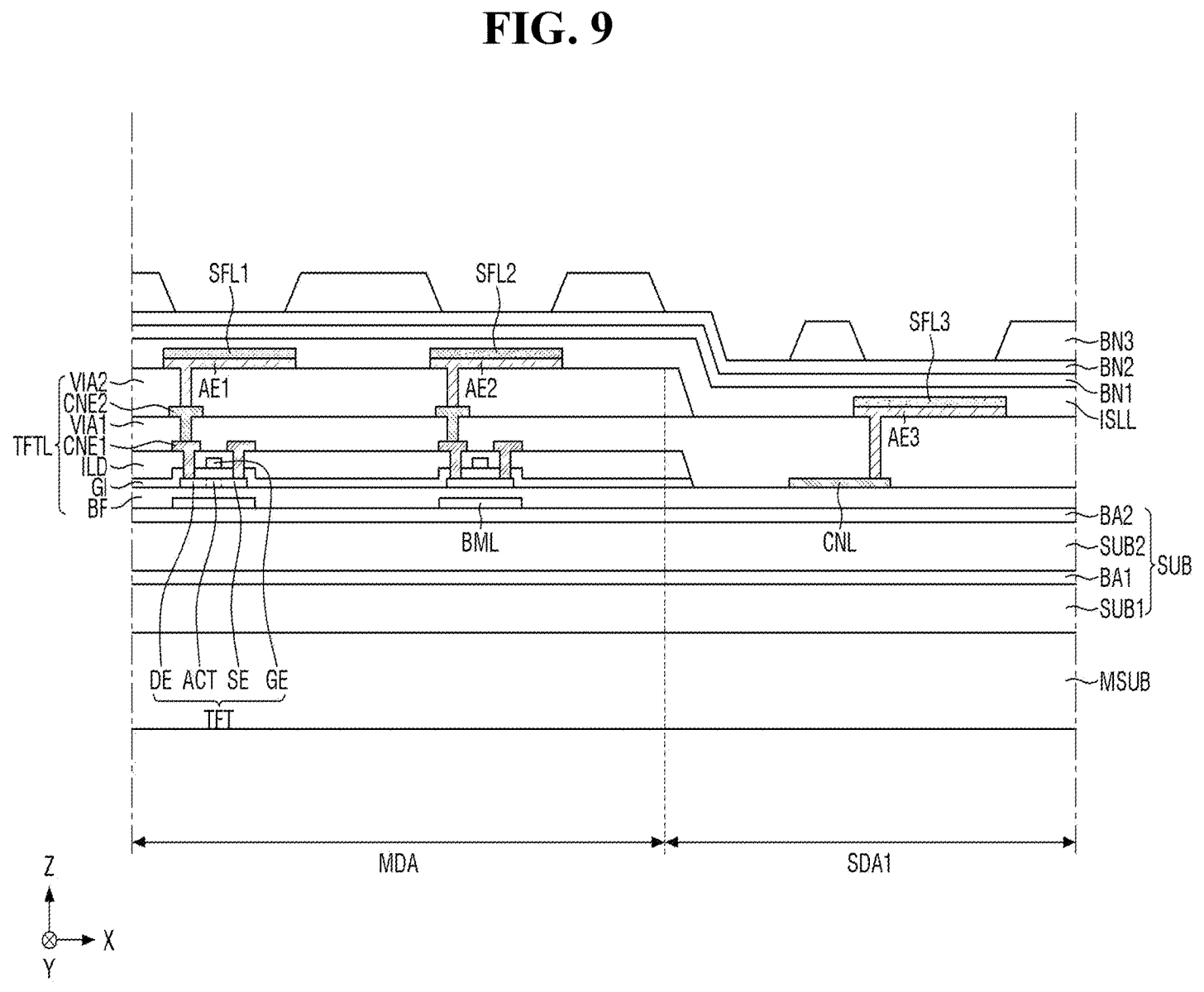

Next, referring to FIG. 9, an inorganic insulating material layer ISLL, a first bank material layer BNL1, and a second bank material layer BNL2 are sequentially formed or stacked on the sacrificial layers SFL1, SFL2, and SFL3.

The inorganic insulating material layer ISLL may be formed to entirely cover the sacrificial layers SFL1, SFL2, and SFL3 and the thin film transistor layer TFTL, and the first and second bank material layers BNL1 and BNL2 may be formed to entirely cover the inorganic insulating material layers ISLL. The first bank material layer BNL1 may be directly formed on the inorganic insulating material layer ISLL, and the second bank material layer BNL2 may be directly formed on the first bank material layer BNL1. The bank material layers BNL1 and BNL2 may be partially etched in a subsequent process to form the bank layers BN1 and BN2 of the bank structure BNS illustrated in FIG. 6, respectively. The first bank material layer BNL1 and the second bank material layer BNL2 may be formed to include different metal materials from each other.

Next, the third bank layer BN3 is formed on the second bank material layer BNL2. The third bank layer BN3 may be formed by applying an organic material and performing a mask process. The third bank layer BN3 may form the emission areas EA1, EA2, and EA3 to be described later. The third bank layers BN3 may be spaced apart from each other on the second bank material layer BNL2. The third bank layer BN3 may be formed to expose portions overlapping the pixel electrodes AE1, AE2, and AE3 on the second bank material layer BNL2, and may be formed to expose a portion where the transmission area TA to be described later will be formed.

Figure 10:
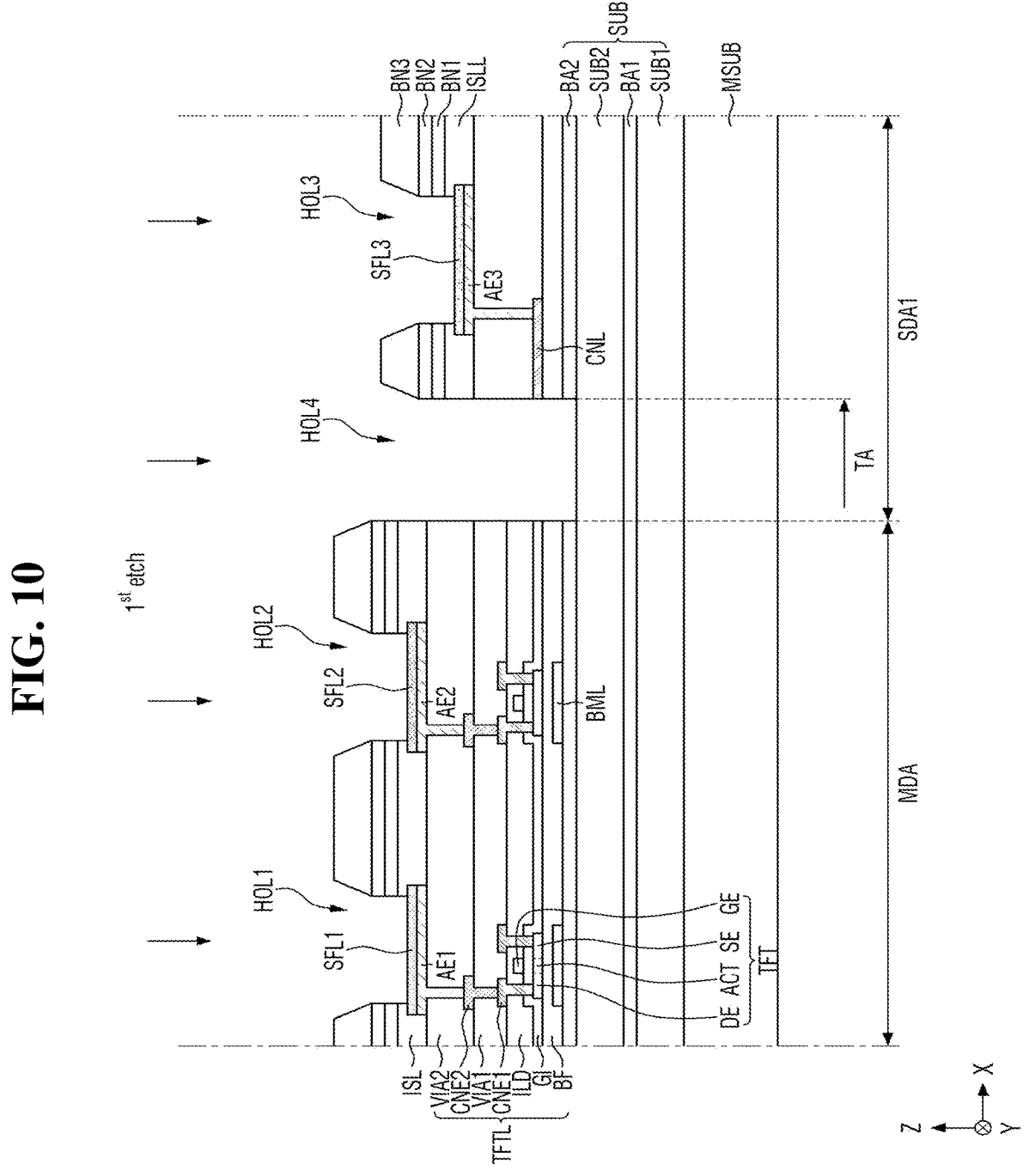

Next, referring to FIG. 10, a first etching process (1$^{st}$ etch) for etching the inorganic insulating material layer ISLL and a portion of the first and second bank material layers BNL1 and BNL2 using the third bank layer BN3 as a mask is performed to form first to fourth holes HOL1, HOL2, HOL3, and HOL4. The inorganic insulating material layer ISLL may be formed as the inorganic insulating layer ISL by the first etching process (1$^{st}$ etch).

The first etching process (1$^{st}$ etch) may be performed as dry etching. Since the first etching process (1$^{st}$ etch) is performed as a dry etching process, the inorganic insulating material layer ISLL and the first and second bank material layers BNL1 and BNL2 formed of different materials, respectively, may be anisotropically etched. In this process, the bank material layers BNL1 and BNL2 and a portion of the inorganic insulating material layer ISLL may be etched together to partially expose the sacrificial layers SFL1, SFL2, and SFL3 disposed thereunder. The first hole HOL1 may be formed at a portion overlapping the first pixel electrode AE1, the second hole HOL2 may be formed at a portion overlapping the second pixel electrode AE2, and the third hole HOL3 may be formed at a portion overlapping the third pixel electrode AE3. The fourth hole HOL4 may be formed at a portion where the first through hole PH1 to be described later will be formed.

Figure 11:
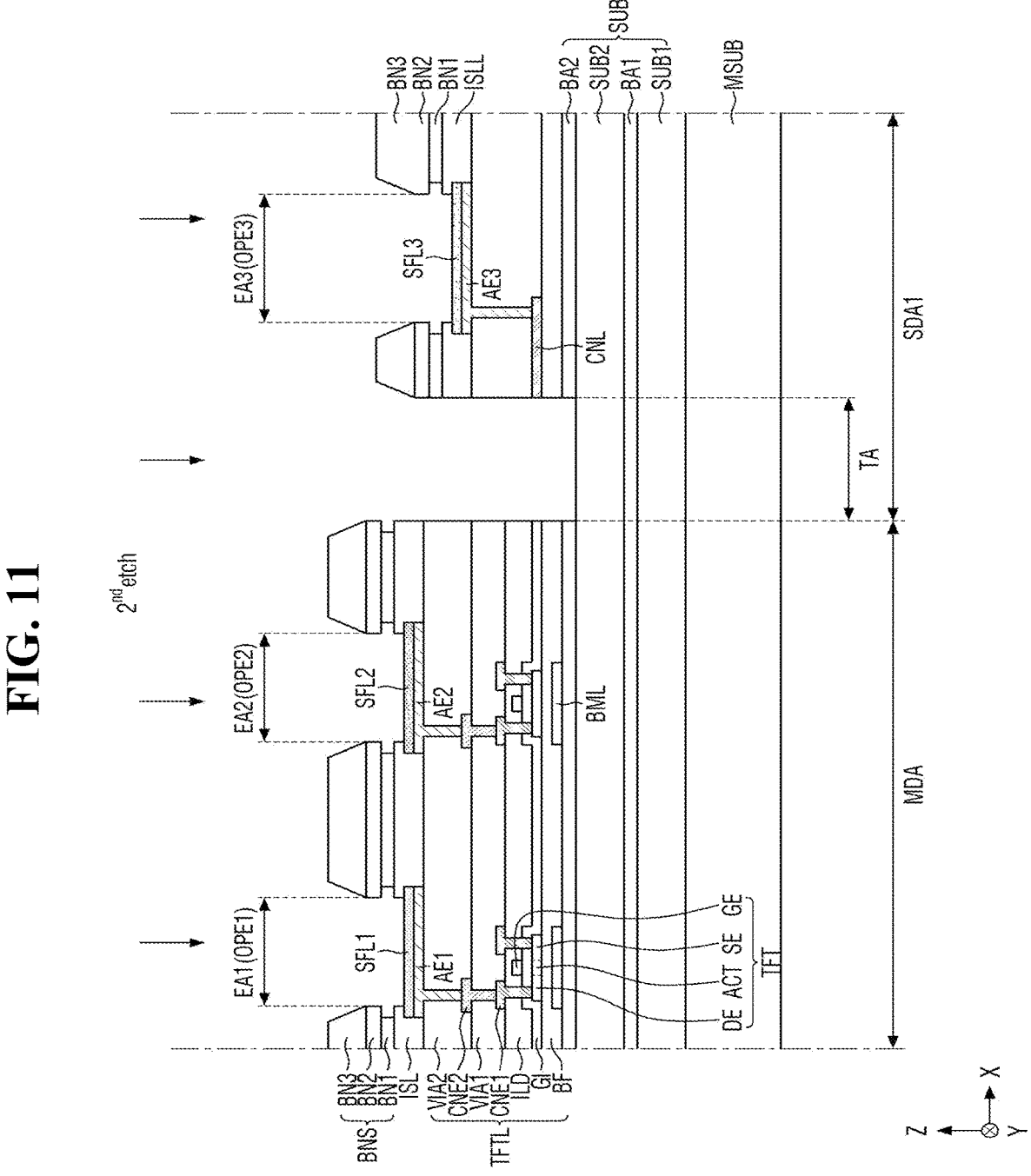

Next, referring to FIG. 11, a second etch process (2$^{nd}$ etch) for removing the sacrificial layers SFL1, SFL2, and SFL3 disposed on the pixel electrodes AE1, AE2, and AE3 is performed. In an embodiment, the sacrificial layers SFL1, SFL2, and SFL3 may include an oxide semiconductor layer, and the second etching process (2$^{nd}$ etch) may be performed as a wet etching process. In this process, the first and second bank material layers BNL1 and BNL2 may be isotropically etched in the first to third holes HOL1, HOL2, and HOL3 by the removal of the sacrificial layers SFL1, SFL2, and SFL3. In the first and second bank material layers BNL1 and BNL2, the first bank material layer BNL1 may have an etching rate higher than those of other bank material layers, and the second bank material layer BNL2 may have the tip TIP protruding further than the side edge of the first bank material layer BNL1. On the side edge of the first bank material layer BNL1, the undercut may be formed under the tip TIP of the second bank material layer BNL2. Due to the second etching process (2$^{nd}$ etch), the first hole HOL1 may be formed as the first opening OPE1, the second hole HOL2 may be formed as the second opening OPE2, and the third hole HOL3 may be formed as the third opening OPE3. Further, due to the second etching process (2$^{nd}$ etch), the first bank material layer BNL1 may be formed as the first bank layer BN1, and the second bank material layer BNL2 may be formed as the second bank layer BN2. Accordingly, the bank structure BNS in which the first bank layer BN1, the second bank layer BN2, and the third bank layer BN3 are sequentially stacked may be formed.

Further, in the sacrificial layers SFL1, SFL2, and SFL3, the portions exposed by the first to third holes HOL1, HOL2, and HOL3, and some of the portions between the inorganic insulating layer ISL and the pixel electrodes AE1, AE2, and AE3 may be removed. Spaces may be formed by portions remaining after the removal of the sacrificial layers SFL1, SFL2, and SFL3, between the pixel electrodes AE1, AE2, and AE3 and the inorganic insulating layer ISL disposed thereon.

Figure 12:
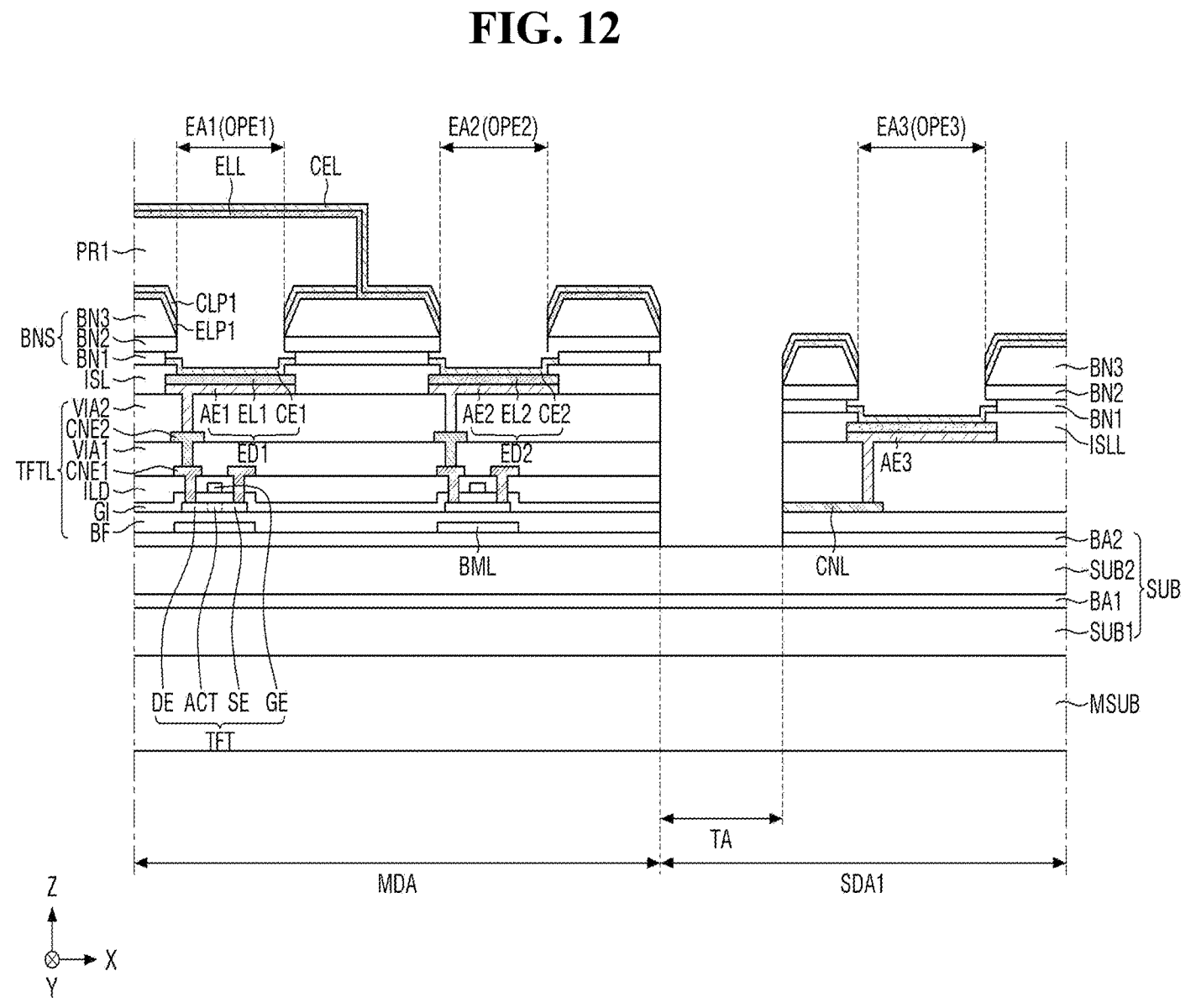
Figure 13:
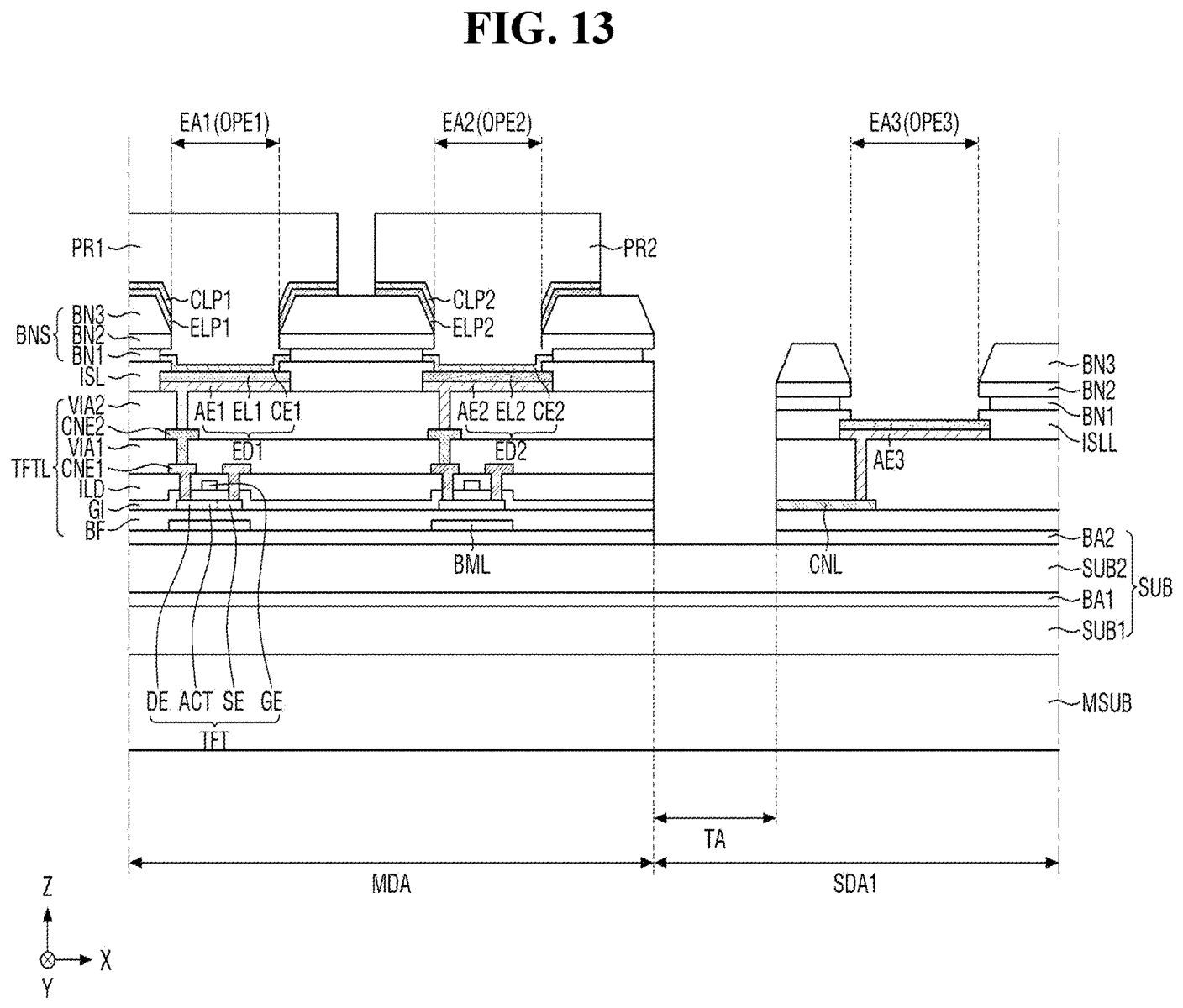
Figure 14:
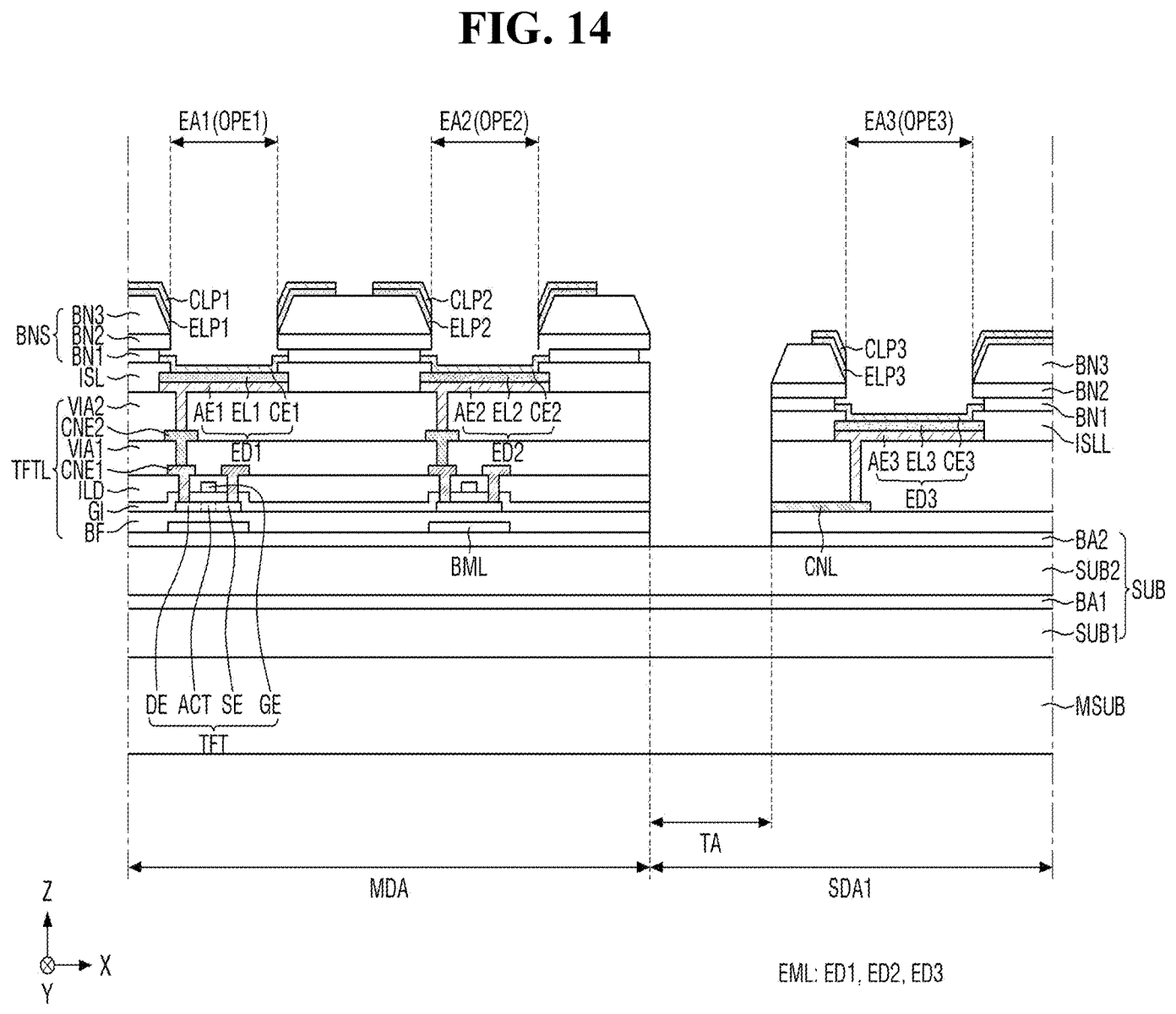

Next, referring to FIGS. 12 to 14, the light emitting layers EL1, EL2, and EL3 and the common electrodes CE1, CE2, and CE3 are formed on the pixel electrode AE1, AE2, and AE3, respectively.

In an embodiment, the first light emitting element ED1 is formed by depositing the first light emitting layer EL1 and the first common electrode CE1 on the entire first pixel electrode AE1 without using a mask. The first light emitting layer EL1 and the first common electrode CE1 may be formed in the first opening OPE1, and materials forming the first light emitting layer EL1 and the first common electrode CE1 may also be deposited on the third bank layers BN3 in the deposition process. Since the first light emitting layer EL1 and the first common electrode CE1 are disconnected by the tips TIP of the second bank layer BN2 and the third bank layers BN3, the first light emitting layer EL1 and the first common electrode CE1 may be patterned in the openings OPE1, OPE2, and OPE3 without a patterning process.

The first light emitting layer EL1 and the first common electrode CE1 may be formed by a deposition process. In the first opening OPE1, the material deposition may not be smooth due to the tips TIP of the second bank layer BN2 and the third bank layer BN3. Since, however, the materials of the first light emitting layer EL1 and the first common electrode CE1 are deposited in an inclined direction rather than in a direction perpendicular to the upper surface of the substrate, the materials of the first light emitting layer EL1 and the first common electrode CE1 may be deposited even in the region hidden or covered by the tips TIP of the second bank layer BN2 and the third bank layer BN3.

In an embodiment, for example, the deposition process of forming the first light emitting layer EL1 may be performed in a way such that the materials are deposited in a direction not perpendicular to the upper surface of the first pixel electrode AE1, for example, in a direction inclined at a first angle. In an embodiment, in the process of forming the light emitting layers EL1, EL2, and EL3, the deposition of the material may be performed at an angle in a range of 45° to 50° inclined from the upper surfaces of the pixel electrodes AE1, AE2, and AE3. The first light emitting layer EL1 may be formed to fill the space between the first pixel electrode AE1 and the inorganic insulating layer ISL.

The deposition process of forming the first common electrode CE1 may be performed such that the materials are deposited in a direction not perpendicular to the upper surface of the first pixel electrode AE1, for example, in a direction inclined at a second angle. In an embodiment, in the process of forming the first common electrode CE1, the deposition of the material may be performed at an angle of 30° or less inclined from the upper surfaces of the pixel electrodes AE1, AE2, and AE3. The first common electrode CE1 may be disposed on the first light emitting layer EL1 and may also be formed in the region hidden or covered by the tips TIP of the second bank layer BN2 and the third bank layer BN3. In an embodiment, for example, the first common electrode CE1 may be partially disposed on the side surface of the first bank layer BN1, which is the region hidden or covered by the tip TIP. The different common electrodes CE1, CE2, and CE3 to be described later may be electrically connected to each other while being in contact with the first bank layer BN1 having high conductivity.

Next, a first photo pattern PR1 is formed to cover the first opening OPE1. The first photo pattern PR1 may be formed by applying a photoresist, and then performing exposure and development. Then, the materials forming the first light emitting layer EL1 and the first common electrode CE1 deposited in the region other than the first photo pattern PR1 are removed using the first photo pattern PR1 as a mask. Accordingly, some of the materials forming the first light emitting layer EL1 and the first common electrode CE1 may be deposited on the third bank layer BN3 to form the first organic pattern ELP1 and the first electrode pattern CEP1.

Next, the second light emitting element ED2 including the second light emitting layer EL2 and the second common electrode CE2 is formed by depositing the light emitting material layer ELL and the electrode material layer CEL on the entire surface of the second pixel electrode AE2. The second light emitting layer EL2 and the second common electrode CE2 may be formed in the second opening OPE2. Since the second light emitting layer EL2 and the second common electrode CE2 are formed by a same process as the above-described deposition process of the first light emitting layer EL1 and the second common electrode CE2, the deposition may be performed even in the region hidden or covered by the tips TIP of the second bank layer BN2 and the third bank layer BN3.

Next, as shown in FIG. 13, a second photo pattern PR2 is formed to cover the second opening OPE2, and the light emitting material layer ELL and the electrode material layer CEL deposited in the region other than the second photo pattern PR2 are removed using the second photo pattern PR2 as a mask. The light emitting material layer ELL and a portion of the electrode material layer CEL may be deposited on the third bank layer BN3 to form the second organic pattern ELP2 and the second electrode pattern CEP2.

Next, as shown in FIG. 14, materials forming the third light emitting layer EL3 and the third common electrode CE3 are deposited on the entire surface of the third pixel electrode AE3 to form the third light emitting element ED3 including the third light emitting layer EL3 and the third common electrode CE3. The third light emitting layer EL3 and the third common electrode CE3 may be formed in the third opening OPE3. Although not shown, after a third photo pattern covering the third opening OPE3 is formed, the materials forming the third light emitting layer EL3 and the third common electrode CE3 are removed, and the first to third photo patterns are removed, thereby manufacturing the structure shown in FIG. 14. Some of the materials forming the third light emitting layer EL3 and the third common electrode CE3 may be deposited on the third bank layer BN3 to form the third organic pattern ELP3 and the third electrode pattern CEP3.

Figure 15:
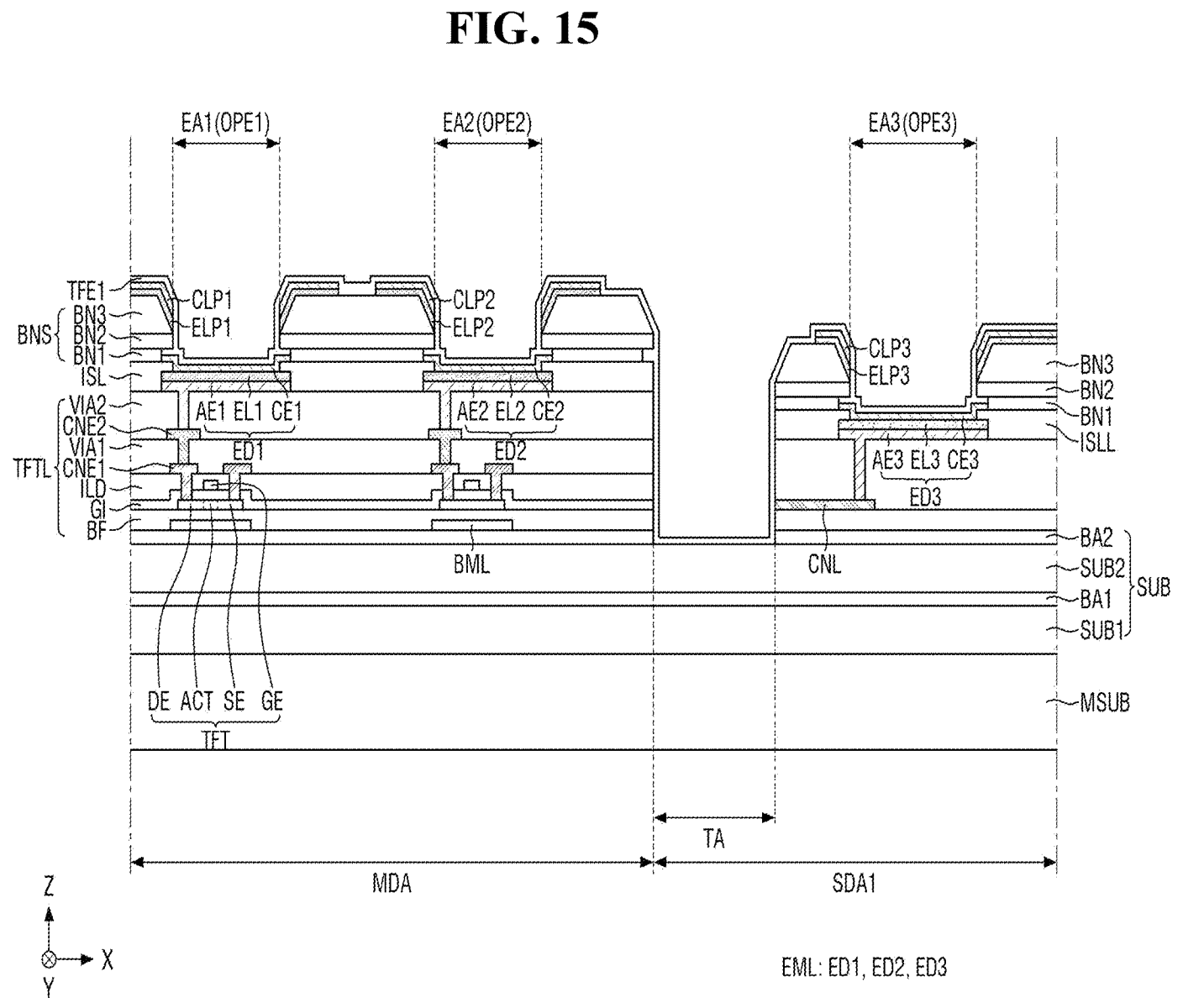

Next, referring to FIG. 15, the first encapsulation layer TFE1 is formed on each of the light emitting elements ED1, ED2, and ED3. The first encapsulation layer TFE1 may be formed by depositing an inorganic material. The first encapsulation layer TFE1 may be in direct contact with the electrode patterns CEP1, CEP2, and CEP3, the common electrodes CE1, CE2, and CE3, the bank structure BNS, and the second substrate SUB2.

Figure 16:
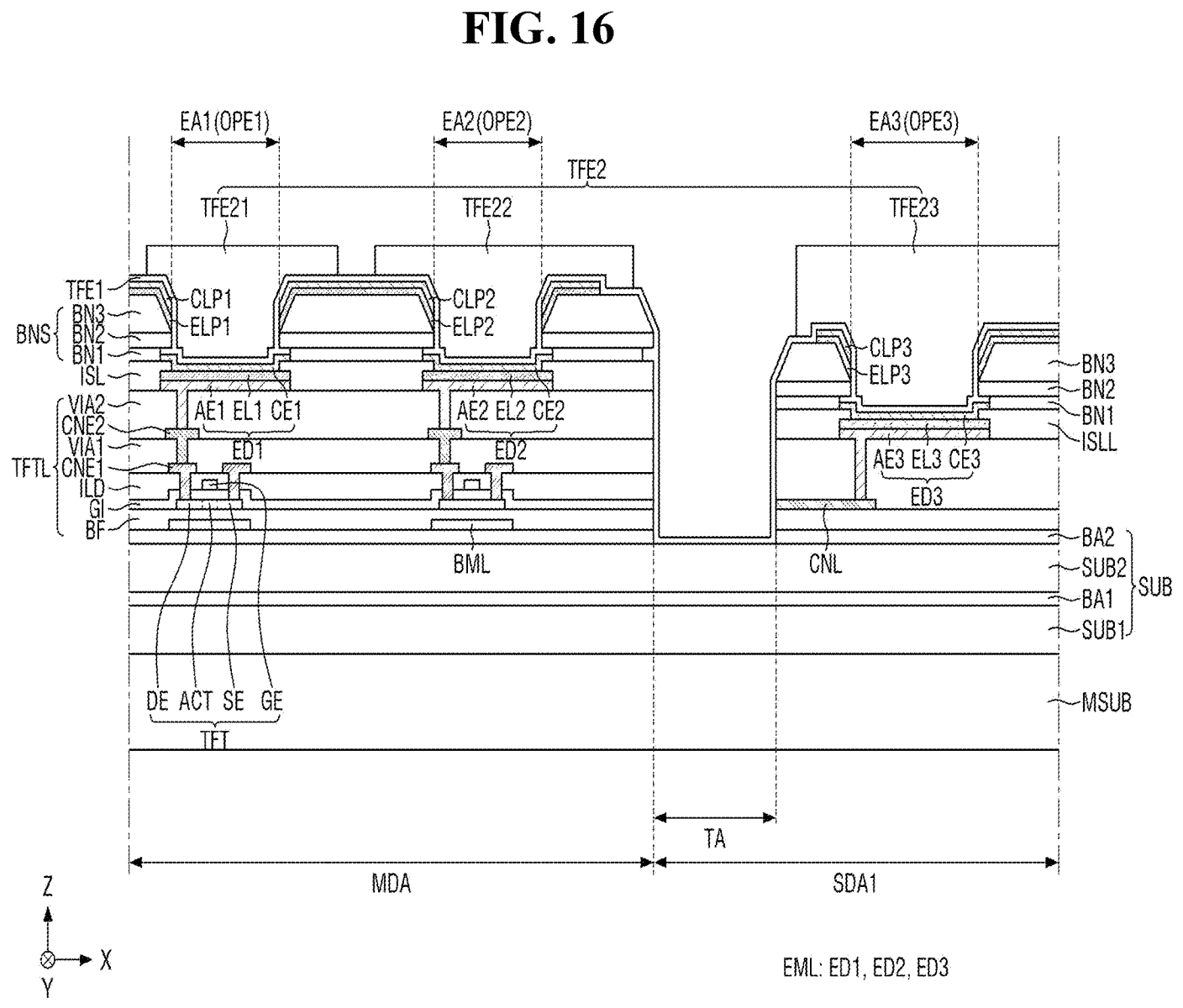

Next, referring to FIG. 16, the second encapsulation layer TFE2 is formed on the first encapsulation layer TFE1. In the second encapsulation layer TFE2, the first organic layer TFE21 overlapping the first light emitting element ED1, the second organic layer TFE22 overlapping the second light emitting element ED2, and the third organic layer TFE23 overlapping the third light emitting element ED3 may be formed by applying an organic material by a solution process and then performing an exposure process. The organic layers TFE21, TFE22, and TFE23 may be formed to fill the first to third openings OPE1, OPE2, and OPE3, respectively. Further, the second encapsulation layer TFE2 is not formed in the fourth hole HOL4.

Figure 17:
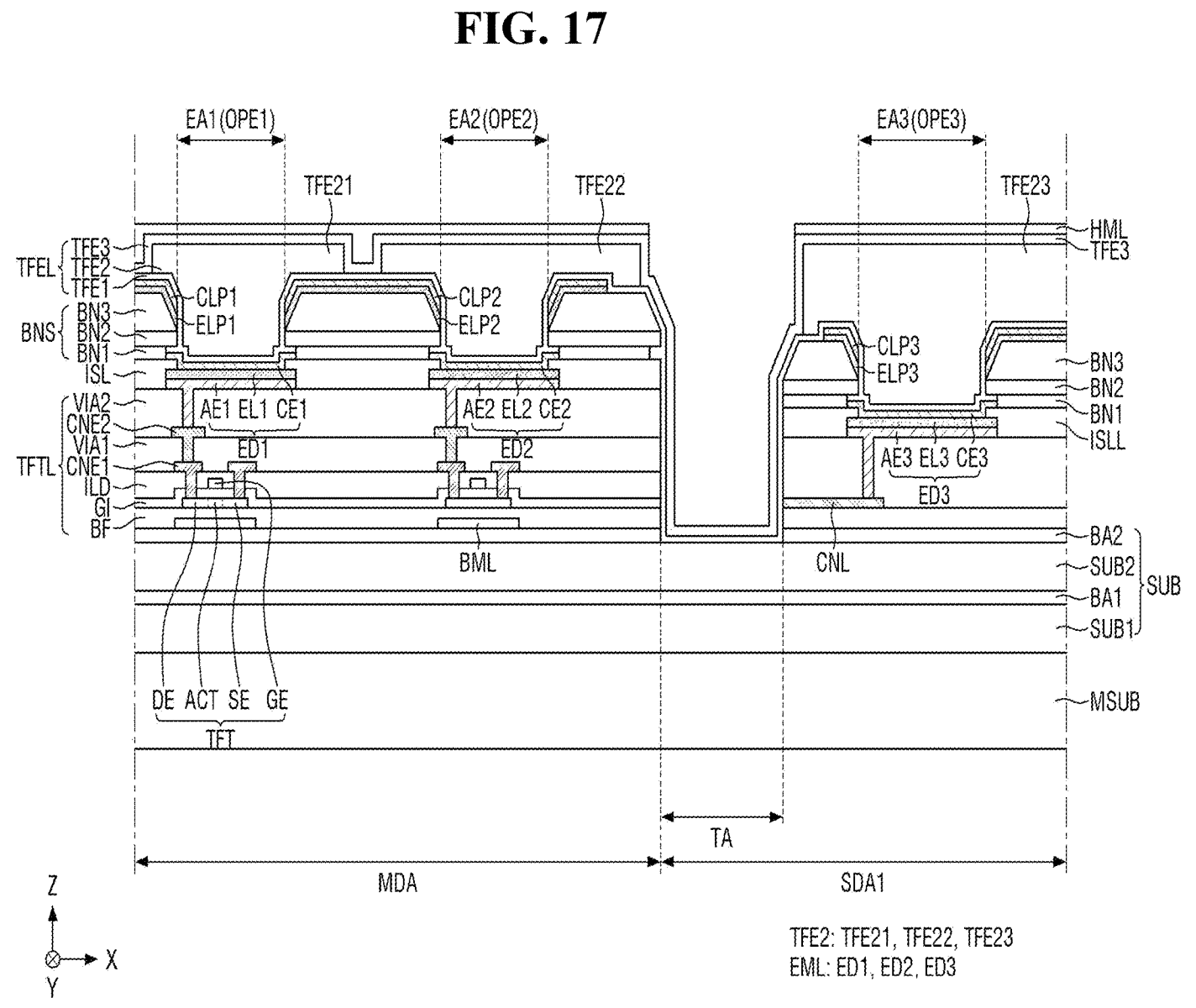

Next, referring to FIG. 17, the third encapsulation layer TFE3 and a hard mask layer HML are formed on the second encapsulation layer TFE2 and the first encapsulation layer TFE1. The third encapsulation layer TFE3 may be formed by depositing an inorganic material. The third encapsulation layer TFE3 may cover the second encapsulation layer TFE2 and the first encapsulation layer TFE1, and may be in direct contact with the second encapsulation layer TFE2 and the first encapsulation layer TFE1. The third encapsulation layer TFE3 may also be formed in the fourth hole HOL4.

The hard mask layer HML may be formed on the third encapsulation layer TFE3. The hard mask layer HML may be entirely formed on the third encapsulation layer TFE3 except the fourth hole HOL4. The hard mask layer HML may be formed of a metal oxide such as ITO or IZO.

Figure 18:
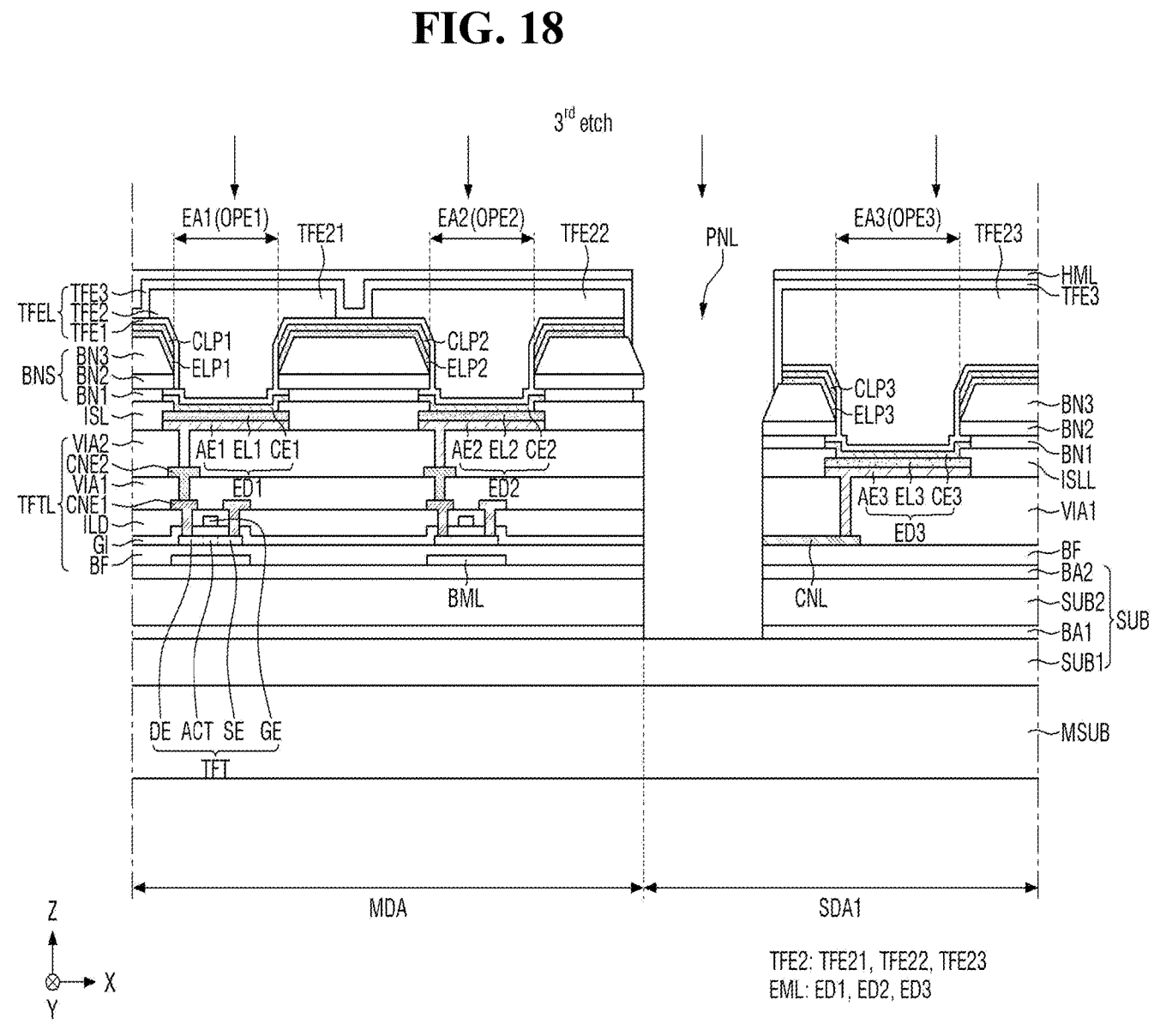

Next, referring to FIG. 18, a third etching process ($3^{rd}$ etch) for etching and removing the first encapsulation layer TFE1, the third encapsulation layer TFE3, the second barrier layer BA2, the second substrate SUB2, and the first barrier layer BA1, which are formed in the fourth hole HOL4, using the hard mask layer HML as a mask is performed. The third etching process ($3^{rd}$ etch) may be performed as dry etching. Since the third etching process ($3^{rd}$ etch) is performed as a dry etching process, the first encapsulation layer TFE1, the third encapsulation layer TFE3, the second barrier layer BA2, the second substrate SUB2, and the first barrier layer BA1 may be anisotropically etched and removed. The fourth hole HOL4 is further penetrated by the third etching process ($3^{rd}$ etch), so that the first through hole PH1 may be formed. In this process, the first encapsulation layer TFE1, the third encapsulation layer TFE3, the second barrier layer BA2, the second substrate SUB2, and the first barrier layer BA1 may be etched to expose the first substrate SUB1 disposed thereunder. After the third etching process ($3^{rd}$ etch) is completed, the hard mask layer HML is removed.

Figure 19:
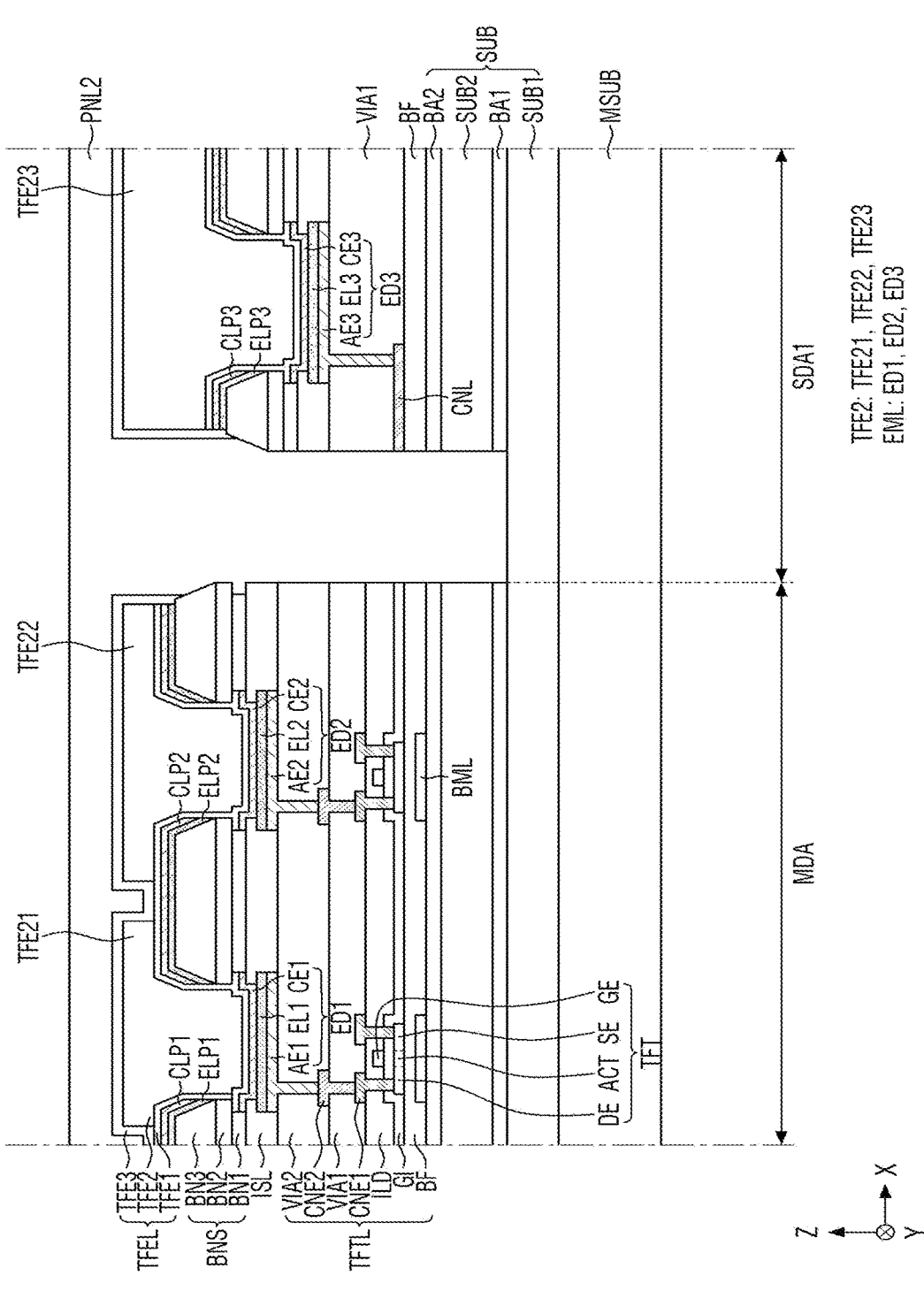

Next, referring to FIG. 19, the second planarization layer PNL2 is formed on the third encapsulation layer TFE3. The second planarization layer PNL2 may be entirely formed on the third encapsulation layer TFE3. Further, the second planarization layer PNL2 may be formed by applying a UV curable resin having high transmittance by a solution process. The second planarization layer PNL2 may be formed flat to cover the third encapsulation layer TFE3 and fill the first through hole PH1. The second planarization layer PNL2 may be in direct contact with the upper surface of the first substrate SUB1 through the first through hole PH1.

Figure 20:
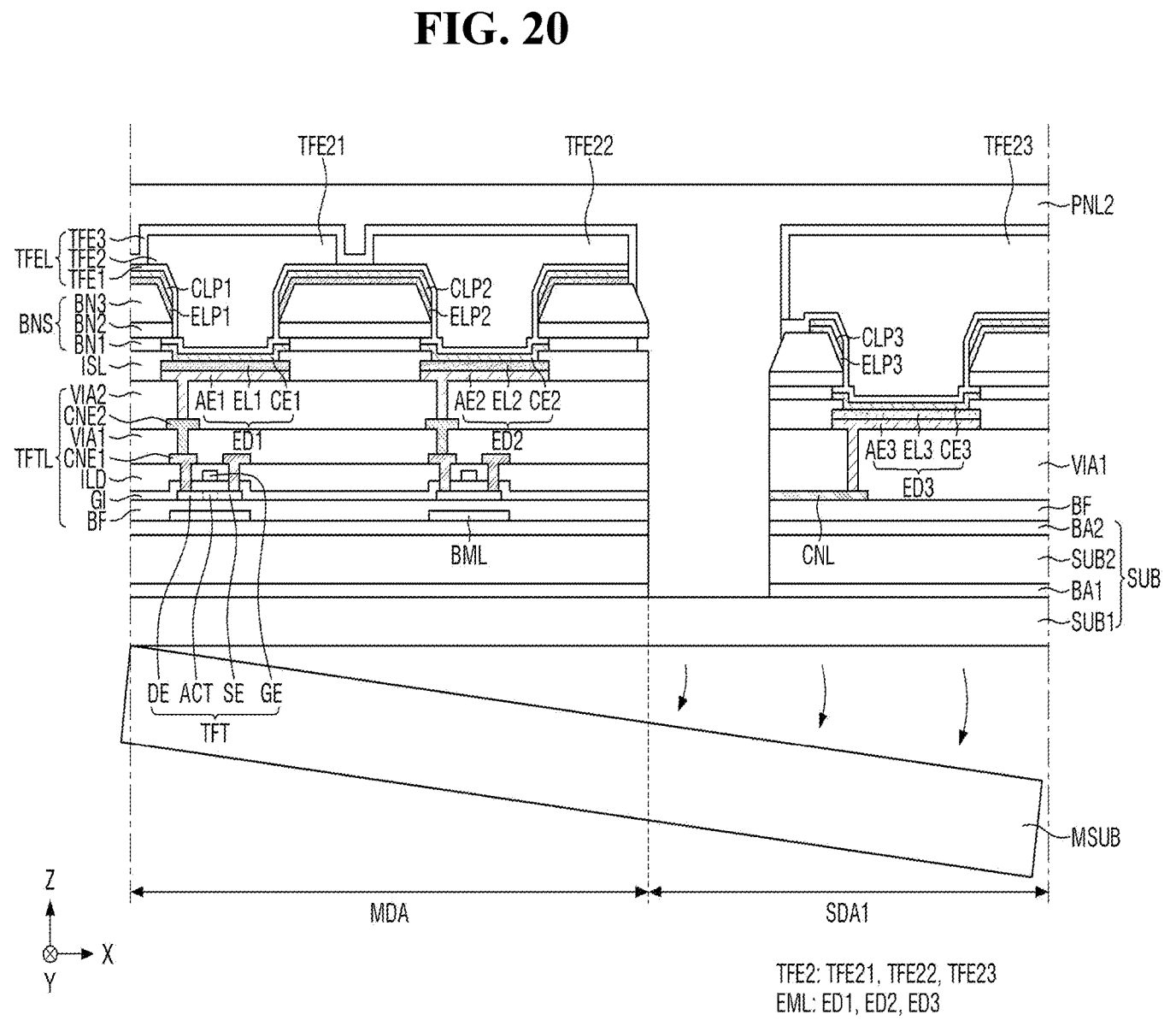

Next, referring to FIG. 20, the mother substrate MSUB is separated from the first substrate SUB1. The mother substrate MSUB may be separated by a laser lift off (LLO) process or the like. In the LLO process using laser, KrF excimer laser (248 nm wavelength) may be used as a source. By radiating laser to the mother substrate MSUB, the mother substrate MSUB may be separated from the first substrate SUB1.

Figure 21:
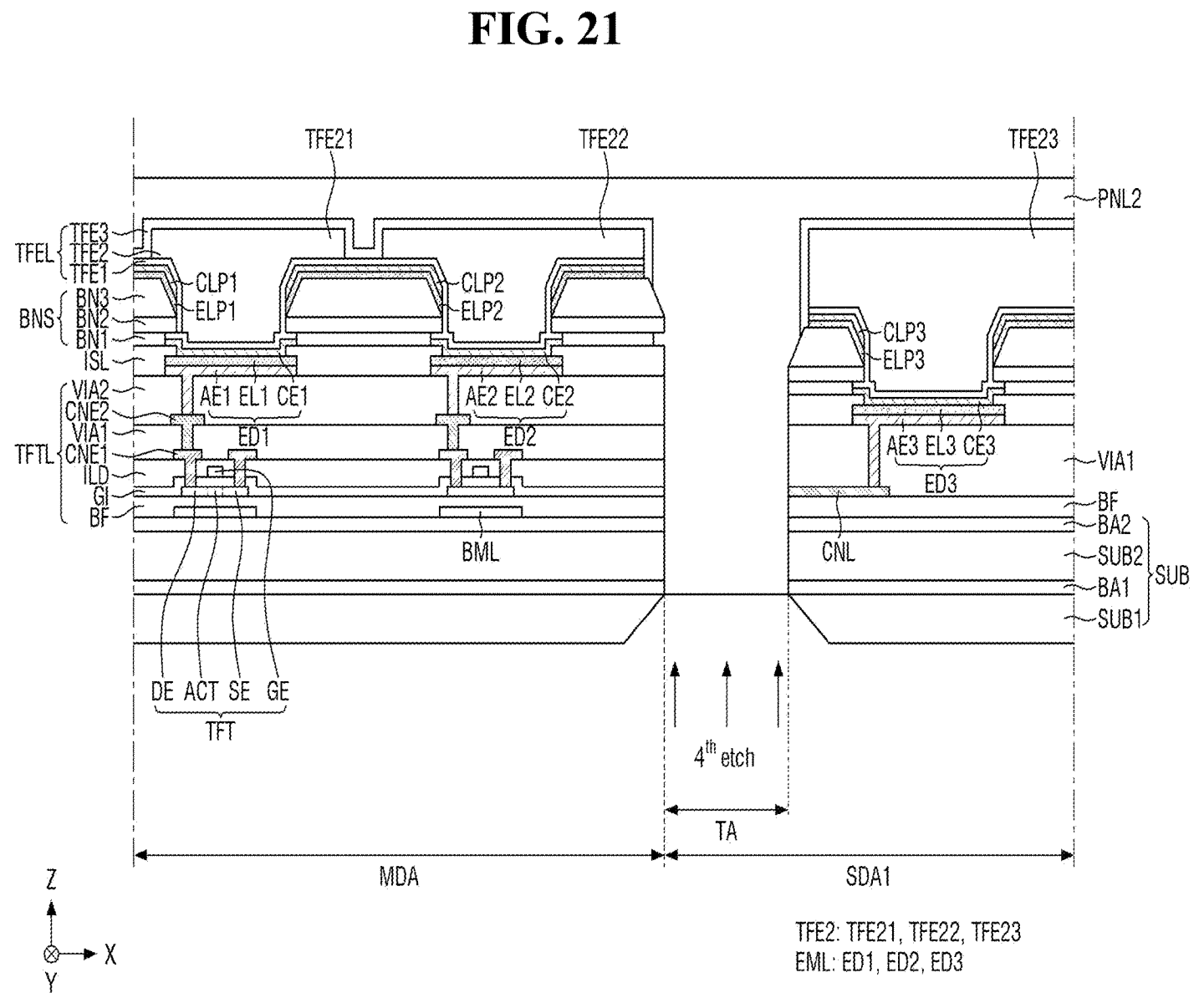

Next, referring to FIG. 21, a fourth etching process ($4^{th}$ etch) for forming the second through hole PH2 in the first substrate SUB1 is performed. In the fourth etching process ($4^{th}$ etch), dry etching or laser may be used. In an embodiment where the fourth etching process ($4^{th}$ etch) is performed using dry etching, an AP plasma etching process may be used. In an embodiment where the fourth etching process ($4^{th}$ etch) is performed using laser, a laser ablation process may be used.

In accordance with the fourth etching process ($4^{th}$ etch), the second through hole PH2 overlapping the first through hole PH1 may be formed. The lower surface of the second planarization layer PNL2 may be exposed through the second through hole PH2. The width of the second through hole PH2 may gradually decrease from the upper surface of the first substrate SUB1 toward the lower surface of the first substrate SUB1. The first through hole PH1 and the second through hole PH2 may form the transmission area TA in the first sub-display area SDA1.

Figure 22:
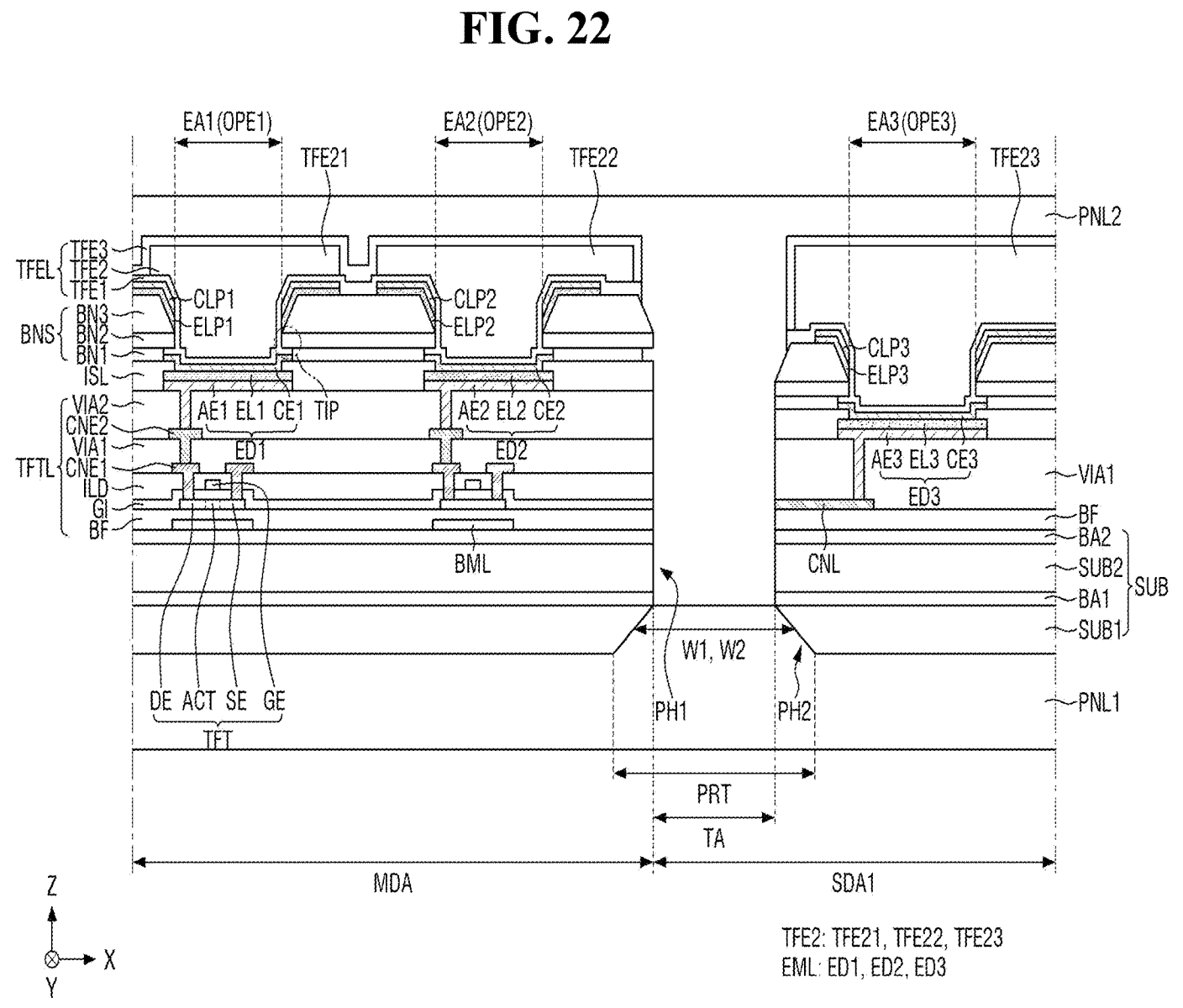

Next, referring to FIG. 22, the first planarization layer PNL1 is formed on the lower surface of the first substrate SUB1. The first planarization layer PNL1 may be entirely formed under the first substrate SUB1. Further, similarly to the second planarization layer PNL2, the first planarization layer PNL1 may be formed by applying a UV curable resin having high transmittance by a solution process. In an embodiment, for example, the first planarization layer PNL1 and the second planarization layer PNL2 may include the same material. The first planarization layer PNL1 may be formed to have a flat lower portion by filling the first through hole PH1. The first planarization layer PNL1 may be in direct contact with the lower surface of the second planarization layer PNL2 through the first through hole PH1.

As described above, the display device 10 according to an embodiment may be manufactured. In accordance with an embodiment, the transmittance of light incident on the optical devices 740, 750, 760, and 770 (see FIG. 2) may be improved by forming the first and second through holes PH1 and PH2 in the first sub-display area SDA1.

Hereinafter, alternative embodiments of the display device will be described with reference to other drawings.

Figure 23:
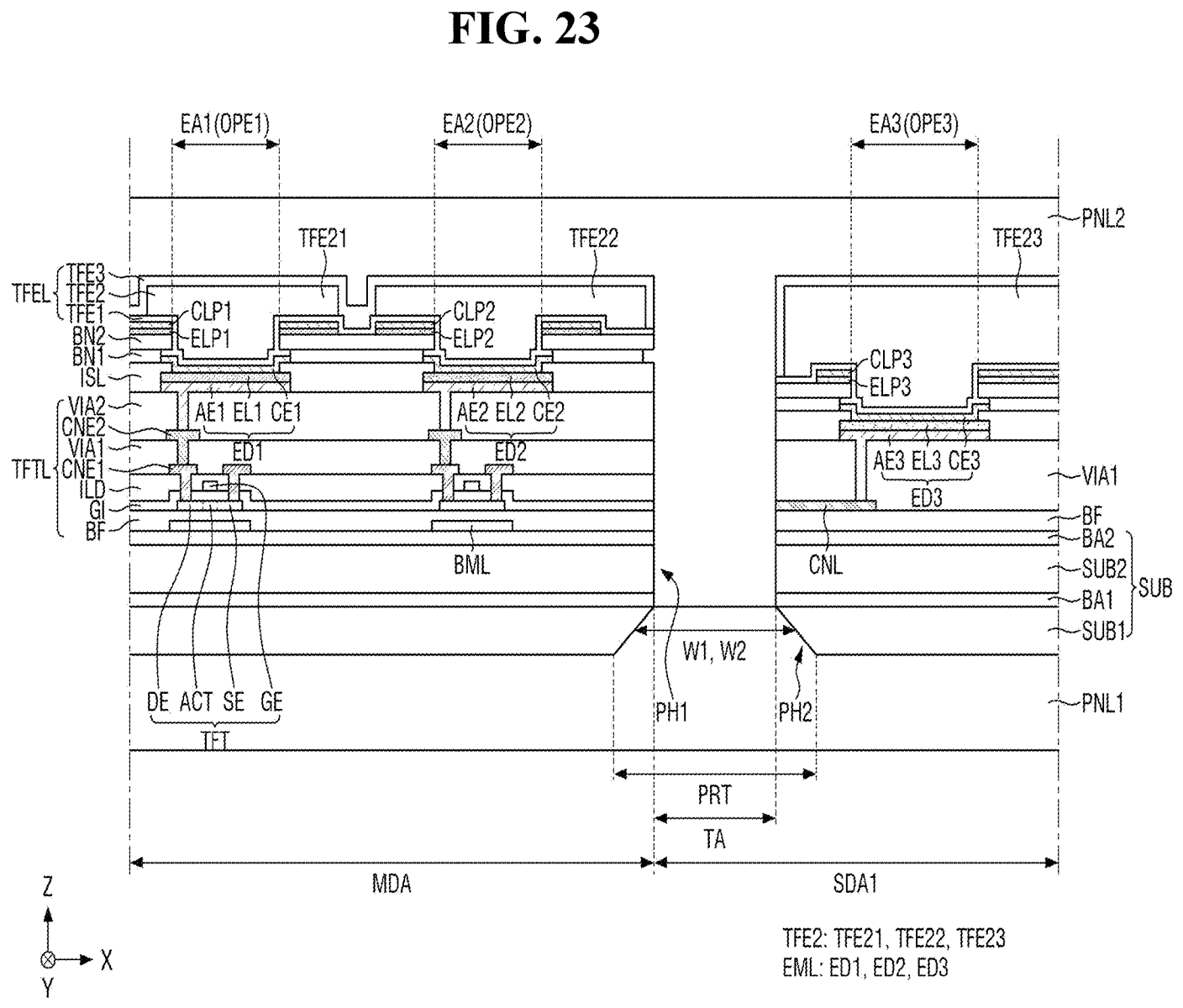

FIG. 23 is a cross-sectional view of a display device according to an alternative embodiment. FIG. 23 corresponds to FIG. 6 and illustrates a display device according to an alternative embodiment different from the embodiment of FIG. 6. Hereinafter, any repetitive detailed description of the same or like elements as those described in FIGS. 5 to 7 will be omitted and differences will be described.

Referring to FIG. 23, the display device 10 according to an embodiment is substantially the same as the embodiment of FIGS. 6 and 7 described above except that the third bank layer BN3 of the bank structure BNS is omitted.

In such an embodiment, the bank structure BNS may include the first bank layer BN1 and the second bank layer BN2 that are sequentially disposed on the inorganic insulating layer ISL. The first bank layer BN1 may be the lower layer of the bank structure BNS, and the second bank layer BN2 may be the upper layer of the bank structure BNS. In the bank structure BNS, the second bank layer BN2 may include a tip TIP protruding further than the first bank layer BN1 toward a center of the openings OPE1, OPE2, and OPE3.

The first to third organic patterns ELP1, ELP2, and ELP3 and the first to third electrode patterns CEP1, CEP2, and CEP3 may be disposed on the bank structure BNS. Each of the first to third organic patterns ELP1, ELP2, and ELP3 may be disposed on the second bank layer BN2, and may be in direct contact with the second bank layer BN2. The plurality of electrode patterns CEP1, CEP2, and CEP3 may be disposed on the first to third organic patterns ELP1, ELP2, and ELP3, respectively.

The thin film encapsulation layer TFEL may be disposed on the light emitting elements ED1, ED2, and ED3 and the bank structure BNS. The thin film encapsulation layer TFEL may include a first encapsulation layer TFE1, a second encapsulation layer TFE2, and a third encapsulation layer TFE3 that are sequentially stacked.

The first encapsulation layer TFE1 may be disposed to cover the light emitting elements ED1, ED2, and ED3, the bank structure BNS, the organic patterns ELP1, ELP2, and ELP3, and the electrode patterns CEP1, CPE2, and CEP3. The first encapsulation layer TFE1 may be in direct contact with the upper surface of the second bank layer BN2. In an embodiment, for example, the first encapsulation layer TFE1 may be in direct contact with the upper surface of the second bank layer BN2 between the first organic pattern ELP1 and the second organic pattern ELP2. The second encapsulation layer TFE2 may be disposed on the first encapsulation layer TFE1, and the third encapsulation layer TFE3 may be disposed on the first encapsulation layer TFE1 and the second encapsulation layer TFE2 to cover them.

In accordance with an embodiment, the bank structure BNS includes the first bank layer BN1 and the second bank layer BN2, so that the third bank layer BN3 may be omitted. In an embodiment, for example, the third bank layer BN3 may be omitted by performing a process of removing the third bank layer BN3 used as a mask after the process of FIG. 11 described above. Accordingly, the stepped portion formed at the upper portion of the display device 10 due to the third bank layer BN3 may be reduced, which makes it possible to easily planarize the second planarization layer PNL2 and reduce the thickness of the display device 10.

Figure 24:
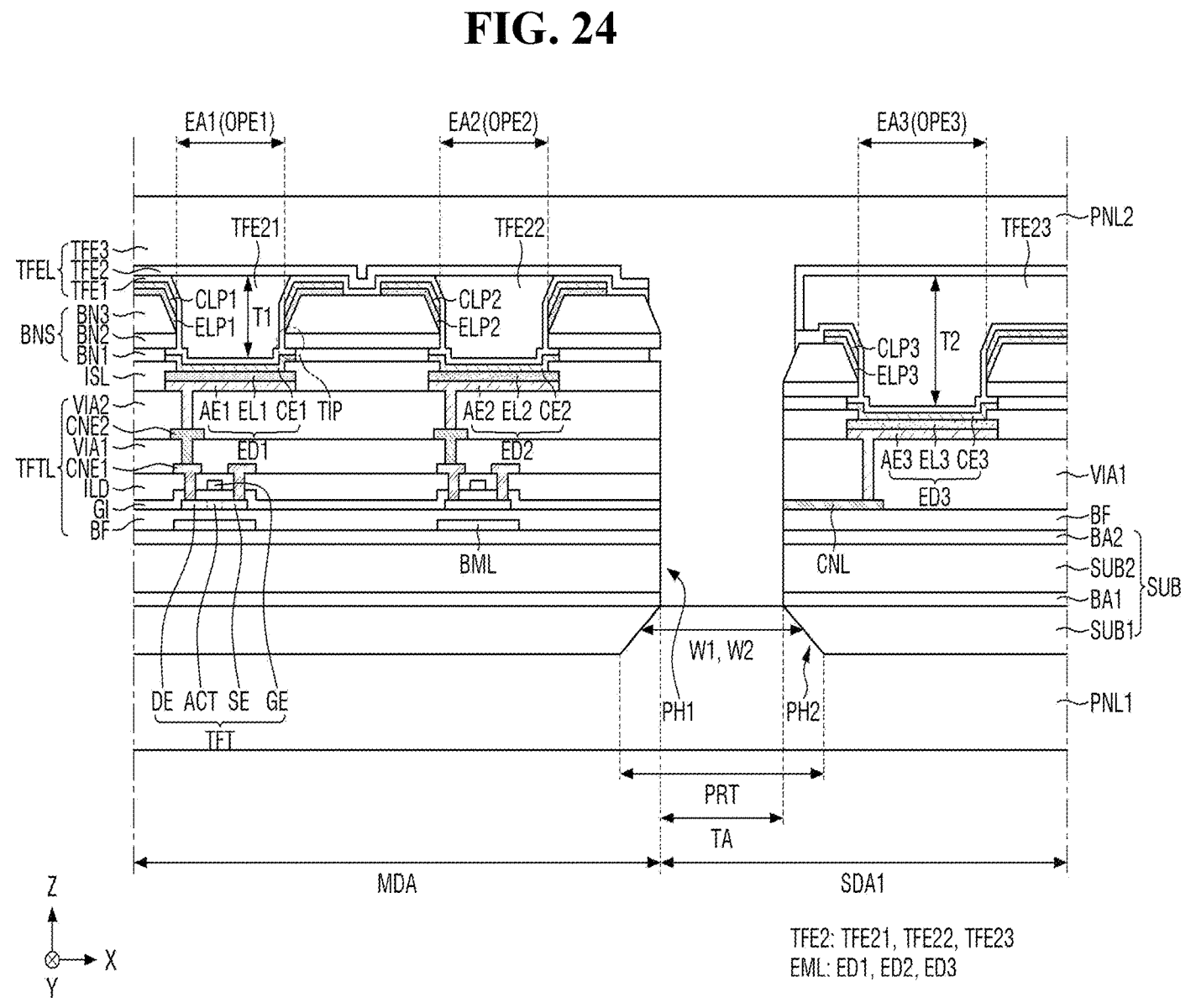

FIG. 24 is a cross-sectional view showing a display device according to another alternative embodiment.

Referring to FIG. 24, the display device 10 according to another alternative embodiment is substantially the same as the display device 10 according to the embodiment of FIGS. 6 and 7 described above except that the upper surface of the second encapsulation layer TFE2 and the upper surface of the first encapsulation layer TFE1 of the thin film encapsulation layer TFEL are aligned with each other.

In such an embodiment, the thin film encapsulation layer TFEL may be disposed on the light emitting elements ED1, ED2, and ED3 and the bank structure BNS. The thin film encapsulation layer TFEL may include a first encapsulation layer TFE1, a second encapsulation layer TFE2, and a third encapsulation layer TFE3 that are sequentially stacked.

In such an embodiment, the second encapsulation layer TFE2 may be disposed to fill the first to third openings OPE1, OPE2, and OPE3 formed by the bank structure BNS. In an embodiment, for example, the first organic layer TFE21 of the second encapsulation layer TFE2 may fill the first opening OPE1 disposed on the first light emitting element ED1, the second organic layer TFE22 may fill the second opening OPE2 disposed on the second light emitting element ED2, and the third organic layer TFE23 may fill the third opening OPE3 disposed on the third light emitting element ED3.

In such an embodiment, the upper surface of the second encapsulation layer TFE2 and the upper surface of the first encapsulation layer TFE1 in the main display area MDA may be aligned with other. The upper surface of the second encapsulation layer TFE2 may be the uppermost surface of the second encapsulation layer TFE2, and the upper surface of the first encapsulation layer TFE1 may be the uppermost surface of the first encapsulation layer TFE1. Here, the uppermost surface of the second encapsulation layer TFE2 may be the upper surface of the first organic layer TFE21 disposed in the first opening OPE1 and the upper surface of the second organic layer TFE22 disposed in the second opening OPE2. That is, the upper surface of the first organic layer TFE21 and the upper surface of the second organic layer TFE22 may be aligned with the uppermost surface of the first encapsulation layer TFE1 disposed between the first organic layer TFE21 and the second organic layer TFE22.

In an embodiment, in the first sub-display area SDA1, unlike the main display area MDA, the second via layer VIA2 is omitted, so that the third light emitting element ED3, the bank structure BNS, and the first encapsulation layer TFE1 may be disposed at heights lower than those in the main display area MDA. The second encapsulation layer TFE2 is formed by a solution process and has the same height in the main display area MDA and the first sub-display area SDA1. Here, the height of the second encapsulation layer TFE2 may be the height measured from the substrate SUB. Accordingly, the upper surface of the second encapsulation layer TFE2 disposed on the third opening OPE3 of the first sub-display area SDA1 may protrude more in the third direction (Z-axis direction) than the upper surface of the first encapsulation layer TFE1. That is, the upper surface of the second encapsulation layer TFE2 and the upper surface of the first encapsulation layer TFE1 are not aligned with each other.

In an embodiment, a thickness T1 of the second encapsulation layer TFE2 disposed in the main display area MDA may be less than a thickness T2 of the second encapsulation layer TFE2 disposed in the first sub-display area SDA1. Here, the thicknesses T1 and T2 of the second encapsulation layer TFE2 may be the lengths between the lowermost surface and the uppermost surface of the second encapsulation layer TFE2.

The third encapsulation layer TFE3 may be disposed on the first encapsulation layer TFE1 and the second encapsulation layer TFE2 to cover the first encapsulation layer TFE1 and the second encapsulation layer TFE2. The third encapsulation layer TFE3 may be in direct contact with the first encapsulation layer TFE1 on the bank structure BNS, and may be in direct contact with the second encapsulation layer TFE2 on the openings OPE1, OPE2, and OPE3. In such an embodiment where the upper surface of the second encapsulation layer TFE2 and the upper surface of the first encapsulation layer TFE1 are aligned with each other in the main display area MDA, the contact area between the third encapsulation layer TFE3 and the first encapsulation layer TFE1 on the bank structure BNS may be increased. Accordingly, the encapsulation characteristics of the thin film encapsulation layer TFEL in the main display area MDA are increased, so that the deterioration of the first and second light emitting elements ED1 and ED2 may be effectively prevented.

Figure 25:
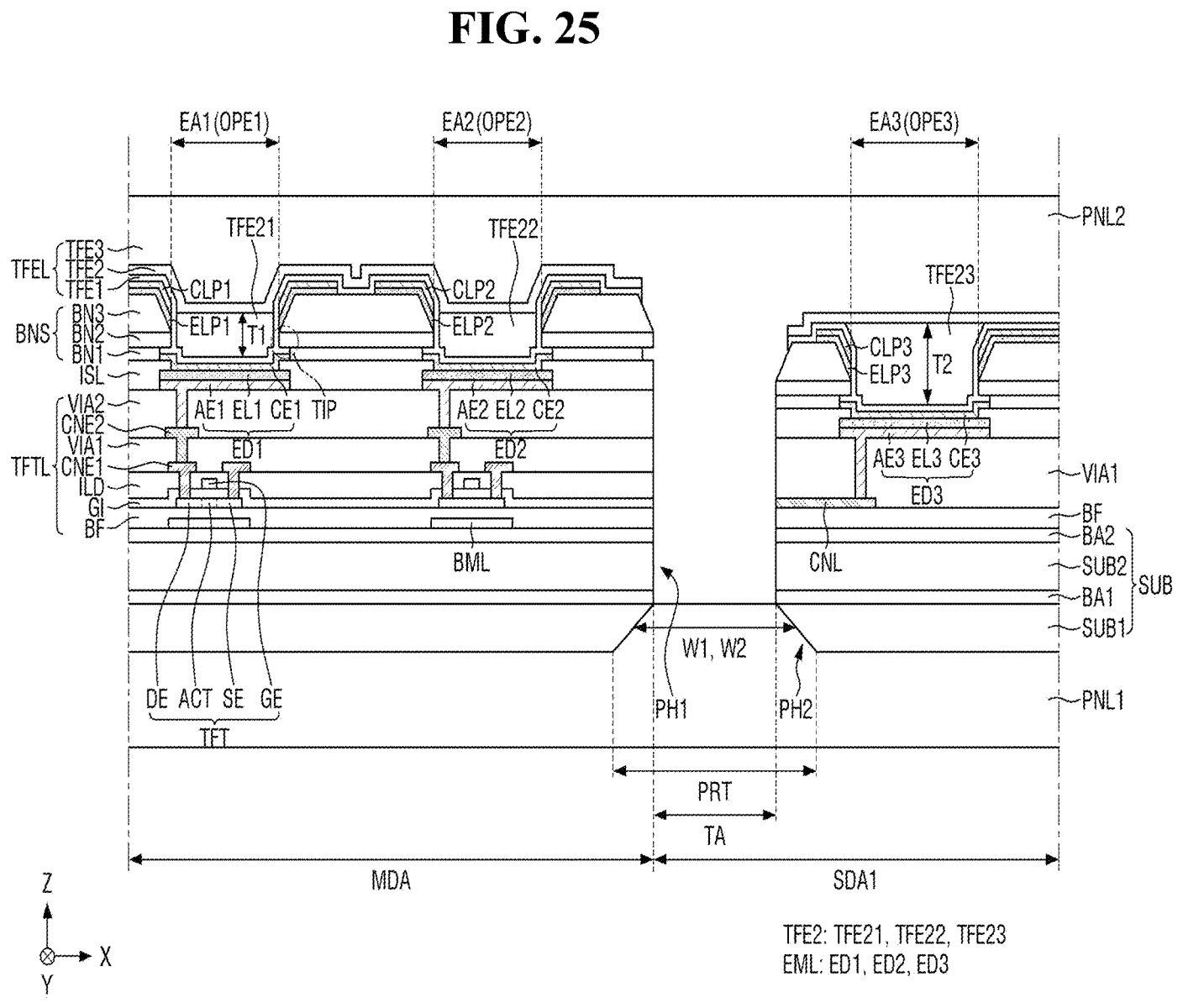

FIG. 25 is a cross-sectional view showing a display device according to still another alternative embodiment.

Referring to FIG. 25, the display device 10 according to an alternative embodiment is substantially the same as the display device 10 according to the embodiment of FIGS. 6 and 7 described above except that the upper surface of the first encapsulation layer TFE1 of the thin film encapsulation layer TFEL protrudes more upwardly than the upper surface of the second encapsulation layer TFE2 in the main display area MDA, and the upper surface of the first encapsulation layer TFE1 and the upper surface of the second encapsulation layer TFE2 are aligned with each other in the first sub-display area SDA1.

In the present embodiment, the second encapsulation layer TFE2 may be disposed to fill the first to third openings OPE1, OPE2, and OPE3 formed by the bank structure BNS. In an embodiment, for example, the first organic layer TFE21 of the second encapsulation layer TFE2 may fill the first opening OPE1 disposed on the first light emitting element ED1, the second organic layer TFE22 may fill the second opening OPE2 disposed on the second light emitting element ED2, and the third organic layer TFE23 may fill the third opening OPE3 disposed on the third light emitting element ED3.

In such an embodiment, in the main display area MDA, the upper surface of the first encapsulation layer TFE1 may protrude more in a direction toward the first planarization layer PNL1 than the upper surface of the second encapsulation layer TFE2. The upper surface of the second encapsulation layer TFE2 may be the uppermost surface of the second encapsulation layer TFE2, and the upper surface of the first encapsulation layer TFE1 may be the uppermost surface of the first encapsulation layer TFE1. Here, the uppermost surface of the second encapsulation layer TFE2 may be the upper surface of the first organic layer TFE21 disposed in the first opening OPE1 and the upper surface of the second organic layer TFE22 disposed in the second opening OPE2. Further, the upper surface of the first encapsulation layer TFE1 may be the uppermost surface of the first encapsulation layer TFE1 disposed on the bank structure BNS. That is, the uppermost surface of the first encapsulation layer TFE1 may protrude more in the third direction (Z-axis direction) than the upper surface of the first organic layer TFE21 and the upper surface of the second organic layer TFE22. In an alternative embodiment, for example, the uppermost surface of the first encapsulation layer TFE1 may be disposed closer to the second planarization layer PNL2 than the upper surface of the first organic layer TFE21 and the upper surface of the second organic layer TFE22.

In such an embodiment, in the first sub-display area SDA1, unlike the main display area MDA, the second via layer VIA2 is omitted, so that the third light emitting element ED3, the bank structure BNS, and the first encapsulation layer TFE1 may be disposed at heights lower than those in the main display area MDA. The second encapsulation layer TFE2 is formed by a solution process and has the same height in the main display area MDA and the first sub-display area SDA1. Here, the height of the second encapsulation layer TFE2 may be the height measured from the substrate SUB. Accordingly, the upper surface of the second encapsulation layer TFE2 disposed on the third opening OPE3 of the first sub-display area SDA1 may be aligned with the upper surface of the first encapsulation layer TFE1.

In an embodiment, a thickness T1 of the second encapsulation layer TFE2 disposed in the main display area MDA may be less than a thickness T2 of the second encapsulation layer TFE2 disposed in the first sub-display area SDA1. Here, the thicknesses T1 and T2 of the second encapsulation layer TFE2 may be the lengths between the lowermost surface and the uppermost surface of the second encapsulation layer TFE2. In an embodiment, for example, the thickness T1 of the first organic layer TFE21 and the second organic layer TFE22 may be smaller than the thickness of the third organic layer TFE23.

The third encapsulation layer TFE3 may be disposed on the first encapsulation layer TFE1 and the second encapsulation layer TFE2 to cover the first encapsulation layer TFE1 and the second encapsulation layer TFE2. The third encapsulation layer TFE3 may be in direct contact with the first encapsulation layer TFE1 on the bank structure BNS, and may be in direct contact with the second encapsulation layer TFE2 on the openings OPE1, OPE2, and OPE3. In such an embodiment where the upper surface of the first encapsulation layer TFE1 protrudes more than the upper surface of the second encapsulation layer TFE2 in the main display area MDA and the upper surface of the first encapsulation layer TFE1 and the upper surface of the second encapsulation layer TFE2 are aligned with each other in the first sub-display area SDA1, the contact area between the third encapsulation layer TFE3 and the first encapsulation layer TFE1 on the bank structure BNS may be increased. Accordingly, the encapsulation characteristics of the thin film encapsulation layer TFEL are increased in the main display area MDA and the first sub-display area SDA1, so that the deterioration of the first to third light emitting elements ED1, ED2, and ED3 may be effectively prevented.

Figure 26:
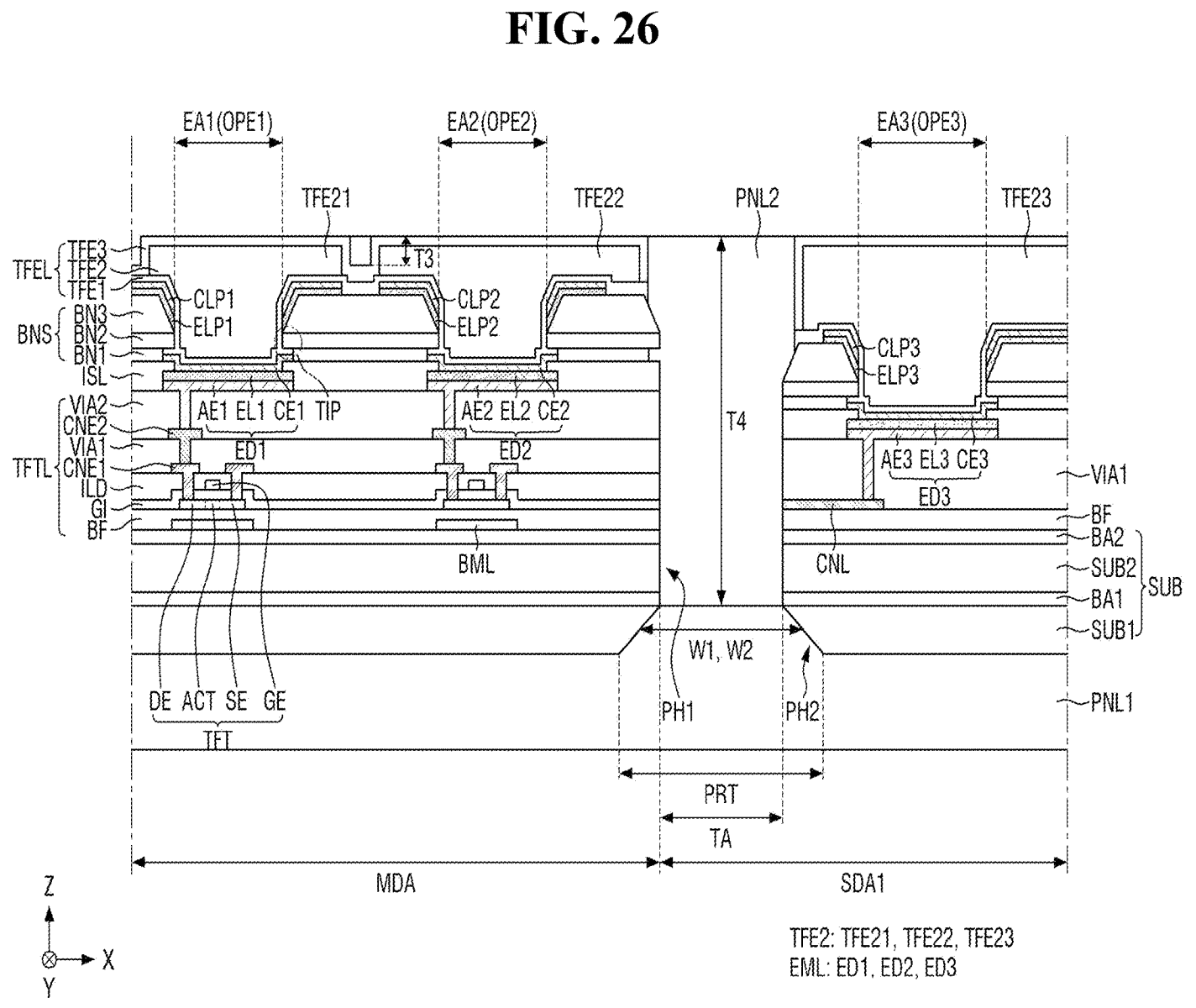

FIG. 26 is a cross-sectional view showing a display device according to still another alternative embodiment.

Referring to FIG. 26, the display device 10 according to an alternative embodiment is substantially the same as the display device 10 according to the embodiment of FIGS. 6 and 7 described above except that the upper surface of the second planarization layer PNL2 and the upper surface of the third encapsulation layer TFE3 are aligned with each other.

In such an embodiment, the second planarization layer PNL2 may be disposed on the thin film encapsulation layer TFEL. The second planarization layer PNL2 may be disposed on the main display area MDA on the third encapsulation layer TFE3. In an embodiment, for example, the second planarization layer PNL2 may be disposed between the first organic layer TFE21 and the second organic layer TFE22 of the second encapsulation layer TFE2. The second planarization layer PNL2 may be disposed to fill the space formed between the first organic layer TFE21 and the second organic layer TFE22 spaced apart from each other. Further, the second planarization layer PNL2 may be disposed on the transmission area TA of the first sub-display area SDA1. In an embodiment, for example, the second planarization layer PNL2 may be disposed on the first planarization layer PNL1 disposed in the transmission area TA, and may be disposed to fill the first through hole PH. Further, the second planarization layer PNL2 may not be disposed in the other area of the first sub-display area SDA1 except the transmission area TA.

In accordance with an embodiment, the upper surface of the second planarization layer PNL2 and the upper surface of the third encapsulation layer TFE3 may be aligned with each other. The upper surface of the third encapsulation layer TFE3 may be the uppermost surface of the third encapsulation layer TFE3. The heights of the second planarization layers PNL2 disposed in the main display area MDA and the transmission area TA may be the same. Here, the height of the second planarization layer PNL2 may be the height measured from the substrate SUB to the upper surface of the second planarization layer PNL2.

In such an embodiment, a thickness T3 of the second planarization layer PNL2 disposed in the main display area MDA may be less than a thickness T4 of the second planarization layer PNL2 disposed in the transmission area TA. Here, the thicknesses T3 and T4 of the second planarization layer PNL2 may be the lengths between the lowermost surface and the uppermost surface of the second planarization layer PNL2.

The second planarization layer PNL2 serves to planarize the upper portion of the display device 10. In accordance with an embodiment, since the upper surface of the second planarization layer PNL2 and the upper surface of the third encapsulation layer TFE3 are aligned with each other, the second planarization layer PNL2 has a minimum thickness and, thus, the thickness of the display device 10 may be reduced.

Figure 27:
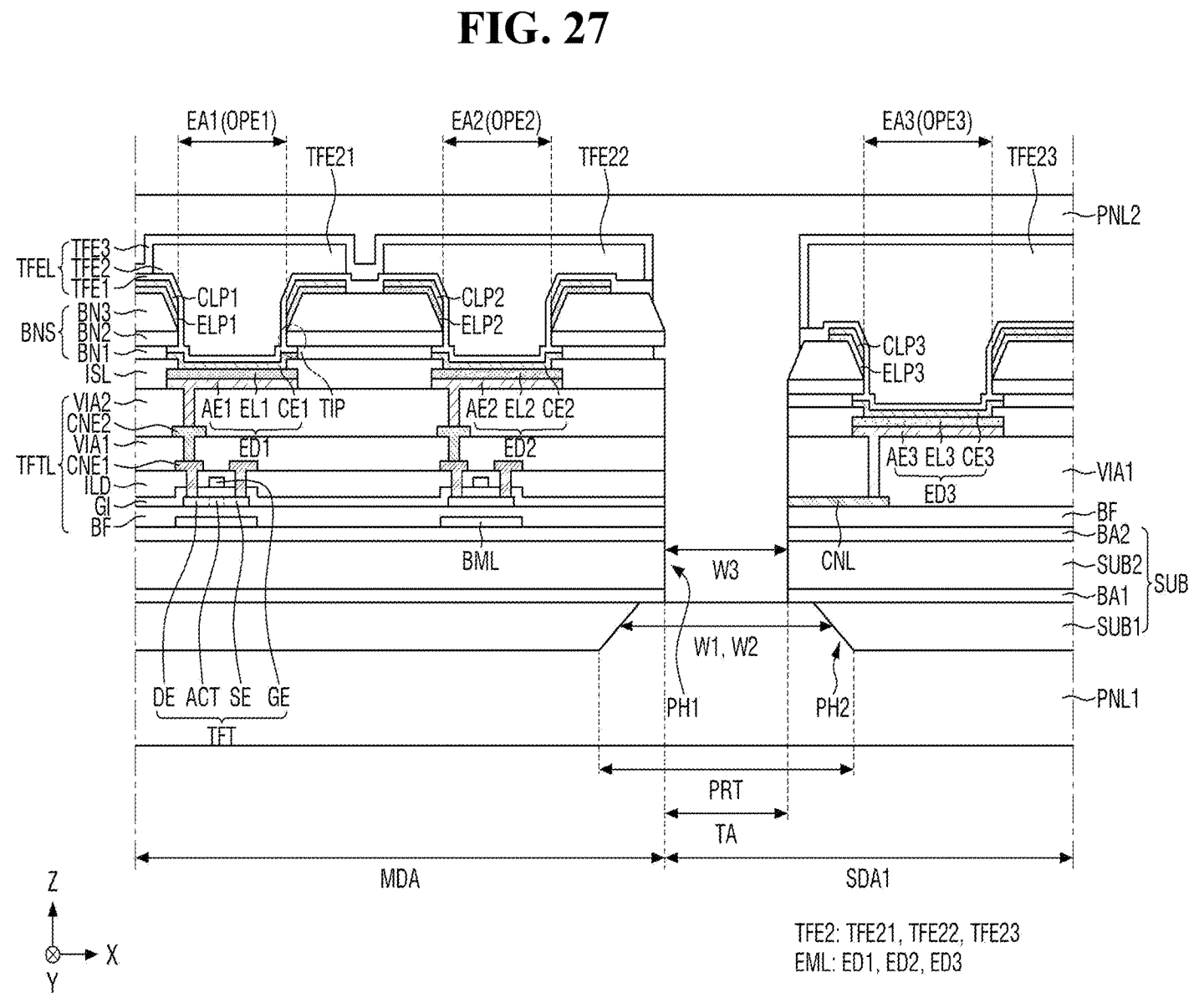

FIG. 27 is a cross-sectional view showing a display device according to still another alternative embodiment.

Referring to FIG. 27, the display device 10 according to an alternative embodiment is substantially the same as the display device 10 according to the embodiment of FIGS. 6 and 7 described above except that the width W2 of the second through hole PH2 of the first substrate SUB1 is greater than a width W3 of the first through hole PH1.

In such an embodiment, the first through hole PH1 and the second through hole PH2 may be disposed in the substrate SUB. The first through hole PH1 may be a hole defined through the upper thin film encapsulation layer TFEL, the thin film transistor layer TFTL, and a portion of the substrate SUB. The second through hole PH2 may be a hole penetrating the first substrate SUB1. The first through hole PH1 and the second through hole PH2 may be disposed to overlap the transmission area TA, and may correspond to the transmission area TA. The first through hole PH1 may be disposed to be filled with the second planarization layer PNL2, and the second through hole PH2 may be disposed to be filled with the first planarization layer PNL1.

In accordance with an embodiment, the width W2 of the second through hole PH2 may be greater than the width W3 of the first through hole PH1. The second through hole PH2 may expose the lower surface of the first barrier layer BA1, and the lower surface of the first barrier layer BA1 exposed by the second through hole PH2 may be in direct contact with the first planarization layer PNL1.

The second through hole PH2 may be formed after the first through hole PH1 is formed. The alignment of the first through hole PH1 and the second through hole PH2 is important in order to increase the light transmittance of the transmission area TA. In an embodiment, the width W2 of the second through hole PH2 is greater than the width W1 of the first through hole PH1, so that the first through hole PH1 and the second through hole PH2 may be easily aligned and the light transmittance of the transmission area TA may be increased.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a substrate comprising a sub-display area comprising a transmission area and a main display area adjacent to the sub-display area;
   a thin film transistor layer disposed on the main display area and the sub-display area of the substrate;
   a light emitting element layer disposed on the thin film transistor layer;
   a thin film encapsulation layer disposed on the light emitting element layer, wherein a first through hole and a second through hole are defined through the transmission area to overlap each other;
   a first planarization layer disposed under the substrate, and disposed in the main display area and the transmission area to fill the second through hole; and
   a second planarization layer disposed on the thin film encapsulation layer, and disposed in the main display area and the transmission area to fill the first through hole,
   wherein in the transmission area, the first planarization layer and the second planarization layer are in contact with each other.

2. The display device of claim 1, wherein the first through hole is defined through a portion of the substrate and the thin film transistor layer disposed in the sub-display area, and the second through hole is defined through a remaining portion of the substrate corresponding to the first through hole.

3. The display device of claim 2, wherein the substrate comprises a first substrate disposed on the first planarization layer, a first barrier layer disposed on the first substrate, a second substrate disposed on the first barrier layer, and a second barrier layer disposed on the second substrate, the first through hole is defined through the first barrier layer, the second substrate, and the second barrier layer, and the second through hole is defined through the first substrate.

4. The display device of claim 3, wherein the first planarization layer comprises a protrusion protruding toward the second planarization layer through the second through hole, and a width of the protrusion gradually decreases toward the second planarization layer.

5. The display device of claim 3, wherein a width of the second through hole gradually increases from an upper surface of the first substrate to a lower surface of the first substrate.

6. The display device of claim 1, further comprising:

an optical device overlapping the transmission area, wherein the optical device overlaps the first through hole and the second through hole.

7. The display device of claim 1, wherein the thin film transistor layer, the light emitting element layer, and the thin film encapsulation layer do not overlap the transmission area.

8. The display device of claim 1, wherein the light emitting element layer comprises a pixel electrode disposed on the thin film transistor layer, a light emitting layer disposed on the pixel electrode, and a common electrode disposed on the light emitting layer, and the thin film encapsulation layer is disposed on the common electrode to encapsulate the light emitting element layer.

9. The display device of claim 8, further comprising:

an inorganic insulating layer disposed on the thin film transistor layer and covering an edge of the pixel electrode; and a bank structure disposed on the inorganic insulating layer, wherein an opening exposing the pixel electrode is defined through the bank structure.

10. The display device of claim 9, wherein the bank structure comprises a first bank layer disposed on the inorganic insulating layer, and a second bank layer disposed on the first bank layer and including a tip protruding further than the first bank layer to a center of the opening.

11. The display device of claim 10, wherein the light emitting layer and the common electrode is in contact with a sidewall of the first bank layer under the tip of the second bank layer.

12. The display device of claim 10, wherein the bank structure further comprises a third bank layer disposed on the second bank layer.

13. The display device of claim 12, further comprising:

an organic pattern disposed on the third bank layer to surround the opening, and including a same material as the light emitting layer; and an electrode pattern disposed on the organic pattern, and including a same material as the common electrode.

14. The display device of claim 9, wherein the thin film encapsulation layer comprises:

a first encapsulation layer;

a second encapsulation layer disposed on the first encapsulation layer; and a third encapsulation layer disposed on the second encapsulation layer, wherein the first encapsulation layer and the third encapsulation layer are in contact with each other in a region surrounding the opening.

15. The display device of claim 14, wherein the first encapsulation layer and the third encapsulation layer are in contact with each other in a region surrounding the transmission area.

16. A display device comprising:

a substrate;

a thin film transistor layer disposed on the substrate;

a light emitting element layer disposed on the thin film transistor layer;

a thin film encapsulation layer disposed on the light emitting element layer, wherein a first through hole and a second through hole are defined through the substrate and the thin film transistor layer to overlap each other;

a first planarization layer disposed under the substrate to fill the second through hole; and a second planarization layer disposed on the thin film encapsulation layer, filling the first through hole, and in contact with the first planarization layer, wherein the thin film transistor layer, the light emitting element layer, and the thin film encapsulation layer do not overlap the first through hole and the second through hole.

17. The display device of claim 16, wherein the light emitting element layer comprises a pixel electrode disposed on the thin film transistor layer, a light emitting layer disposed on the pixel electrode, and a common electrode disposed on the light emitting layer, and the thin film encapsulation layer is disposed on the common electrode to encapsulate the light emitting element layer.

18. The display device of claim 17, further comprising:

an inorganic insulating layer disposed on the thin film transistor layer, and covering an edge of the pixel electrode; and a bank structure disposed on the inorganic insulating layer, wherein an opening exposing the pixel electrode is defined through the bank structure.

19. The display device of claim 18, wherein the thin film encapsulation layer comprises:

a first encapsulation layer;

a second encapsulation layer disposed on the first encapsulation layer, and filling the opening; and a third encapsulation layer disposed on the second encapsulation layer.

20. The display device of claim 19, wherein an uppermost surface of the second encapsulation layer protrudes in a direction toward the first planarization layer than an uppermost surface of the first encapsulation layer.

21. The display device of claim 19, wherein an uppermost surface of the second encapsulation layer is aligned with an uppermost surface of the first encapsulation layer.

22. The display device of claim 19, wherein an uppermost surface of the first encapsulation layer protrudes in a direction toward the first planarization layer than an uppermost surface of the second encapsulation layer.

23. The display device of claim 19, wherein an upper surface of the second planarization layer is aligned with an uppermost surface of the third encapsulation layer.

* * * * *